(12) United States Patent
Prakash et al.

(10) Patent No.: US 9,832,876 B2
(45) Date of Patent: Nov. 28, 2017

(54) CPU PACKAGE SUBSTRATES WITH REMOVABLE MEMORY MECHANICAL INTERFACES

(71) Applicant: INTEL CORPORATION, Santa Clara, CA (US)

(72) Inventors: Mani Prakash, University Place, WA (US); Thomas T. Holden, Olympia, WA (US); Jeffory L. Smalley, East Olympia, WA (US); Ram S. Viswanath, Phoenix, AZ (US); Bassam N. Coury, Dupont, WA (US); Dimitrios Ziakas, Hillsboro, OR (US); Chong J. Zhao, West Linn, OR (US); Jonathan W. Thibado, Beaverton, OR (US); Gregorio R. Murtagian, Phoenix, AZ (US); Kuang C. Liu, Queen Creek, AZ (US); Rajasekaran Swaminathan, Tempe, AZ (US); Zhichao Zhang, Chandler, AZ (US); John M. Lynch, Forest Grove, OR (US); David J. Llapitan, Tacoma, WA (US); Sanka Ganesan, Chandler, AZ (US); Xiang Li, Portland, OR (US); George Vergis, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/575,775

(22) Filed: Dec. 18, 2014

(65) Prior Publication Data
US 2016/0183374 A1    Jun. 23, 2016

(51) Int. Cl.
*H05K 1/18* (2006.01)
*H01L 23/00* (2006.01)
(Continued)

(52) U.S. Cl.
CPC ............. *H05K 1/181* (2013.01); *H01L 23/00* (2013.01); *H01L 2224/16225* (2013.01);
(Continued)

(58) Field of Classification Search
CPC .... H01R 12/721; H05K 1/0203; H05K 1/111; H05K 1/181; H05K 3/301; H05K 3/3436;
(Continued)

(56) References Cited

U.S. PATENT DOCUMENTS 5,926,367 A      7/1999  Gutierrez et al.
5,991,161 A *   11/1999  Samaras .......... H01L 23/49816
                                                        174/16.3
(Continued)

FOREIGN PATENT DOCUMENTS

JP      1996335486       12/1996
JP      2000208696       7/2000
(Continued)

OTHER PUBLICATIONS

Notice of Allowance for U.S. Appl. No. 104137705, dated Jul. 20, 2017, 3 pgs.

*Primary Examiner* — Anthony Haughton
*Assistant Examiner* — Yahya Ahmad
(74) *Attorney, Agent, or Firm* — Schwabe, Williamson & Wyatt P.C.

(57) ABSTRACT

Configurable central processing unit (CPU) package substrates are disclosed. A package substrate is described that includes a processing device interface. The package substrate also includes a memory device electrical interface disposed on the package substrate. The package substrate also includes a removable memory mechanical interface disposed proximately to the memory device electrical interface. The removable memory mechanical interface is to allow a memory device to be easily removed from the
(Continued)

package substrate after attachment of the memory device to the package substrate.

36 Claims, 34 Drawing Sheets

(51) Int. Cl.
  *H01R 12/71* (2011.01)
  *H01R 12/79* (2011.01)
(52) U.S. Cl.
  CPC .. *H01L 2924/15311* (2013.01); *H01R 12/712* (2013.01); *H01R 12/79* (2013.01); *H05K 2201/10159* (2013.01); *H05K 2201/10325* (2013.01)
(58) Field of Classification Search
  CPC ... H05K 2201/066; H05K 2201/10159; H05K 2201/10234; H05K 2201/10318; H05K 2201/10325; H05K 2201/10356; H05K 2201/10386; H05K 2201/10704; H05K 2201/10719; H05K 2203/041
  USPC ............. 361/719, 767; 29/832; 439/78, 660
  See application file for complete search history.

(56) References Cited

U.S. PATENT DOCUMENTS

| | | | |
|---|---|---|---|
| 6,031,729 A | 2/2000 | Berkely et al. | |
| 6,114,626 A | 9/2000 | Barnes et al. | |
| 6,159,031 A | 12/2000 | Llapitan et al. | |
| 6,327,147 B1 | 12/2001 | Llapitan et al. | |
| 6,492,718 B2* | 12/2002 | Ohmori | H01L 24/97 |
| | | | 257/685 |
| 6,575,766 B1 | 6/2003 | Xie et al. | |
| 6,585,534 B2 | 7/2003 | Llapitan et al. | |
| 6,597,582 B2* | 7/2003 | Baba | H01L 23/3675 |
| | | | 174/138 G |
| 6,671,172 B2 | 12/2003 | Carter et al. | |
| 6,672,880 B2 | 1/2004 | Xie et al. | |
| 6,702,620 B2 | 3/2004 | Lynch et al. | |
| 6,722,908 B2 | 4/2004 | Llapitan et al. | |
| 6,830,470 B1 | 12/2004 | Lynch et al. | |
| 6,854,979 B2 | 2/2005 | Xie et al. | |
| 6,861,743 B2* | 3/2005 | Kim | H05K 7/1084 |
| | | | 257/688 |
| 6,888,722 B2 | 5/2005 | Viswanath | |
| 6,979,208 B2 | 12/2005 | Xie et al. | |
| 7,050,302 B2 | 5/2006 | Llapitan et al. | |
| 7,200,934 B2 | 4/2007 | Carter et al. | |
| 7,278,859 B1* | 10/2007 | Irvine | H01R 12/7076 |
| | | | 439/71 |
| 7,602,616 B2 | 10/2009 | Zhao | |
| 7,729,121 B1* | 6/2010 | Deshpande | H01L 23/3677 |
| | | | 165/80.3 |
| 7,888,784 B2 | 2/2011 | Gurumurthy et al. | |
| 7,911,790 B2 | 3/2011 | Carter et al. | |
| 8,025,531 B1 | 9/2011 | Zhang et al. | |
| 8,188,594 B2 | 5/2012 | Ganesan et al. | |
| 8,353,101 B2 | 1/2013 | Gurumurthy et al. | |
| 8,508,947 B2 | 8/2013 | Ganesan et al. | |
| 8,513,792 B2 | 8/2013 | Ganesan et al. | |
| 9,307,686 B2* | 4/2016 | Takada | H05K 1/0212 |
| 9,516,755 B2* | 12/2016 | Lam | G06F 21/86 |
| 2002/0167081 A1* | 11/2002 | Kondo | H01L 23/5382 |
| | | | 257/686 |
| 2003/0222332 A1* | 12/2003 | Tran | H01L 23/49805 |
| | | | 257/678 |
| 2009/0065931 A1 | 3/2009 | Rangaraj et al. | |
| 2010/0326716 A1 | 12/2010 | Zhang et al. | |
| 2012/0180312 A1 | 7/2012 | Zhang et al. | |
| 2012/0188737 A1* | 7/2012 | Pai | H01R 12/721 |
| | | | 361/783 |
| 2012/0200993 A1* | 8/2012 | Aoki | H05K 7/1007 |
| | | | 361/679.02 |
| 2012/0262863 A1* | 10/2012 | Johnson | G06F 1/32 |
| | | | 361/679.02 |
| 2014/0092573 A1* | 4/2014 | Llapitan | H05K 3/301 |
| | | | 361/772 |
| 2014/0106582 A1 | 4/2014 | Wig et al. | |
| 2014/0113464 A1 | 4/2014 | Tran et al. | |
| 2014/0162475 A1 | 6/2014 | Chawla et al. | |
| 2014/0174808 A1 | 6/2014 | Zhang et al. | |
| 2014/0175644 A1 | 6/2014 | Srinivasan et al. | |
| 2014/0195876 A1 | 7/2014 | Nachimuthu et al. | |
| 2014/0217571 A1 | 8/2014 | Ganesan et al. | |
| 2014/0217579 A1 | 8/2014 | Ganesan et al. | |
| 2014/0273552 A1 | 9/2014 | Ganesan et al. | |

FOREIGN PATENT DOCUMENTS

| | | |
|---|---|---|
| JP | 2001043920 | 2/2001 |
| JP | 2001127217 | 5/2001 |
| JP | 2001177051 | 6/2001 |
| JP | 2001189412 | 7/2001 |
| JP | 2001305260 | 11/2001 |
| JP | 2003123922 | 4/2003 |
| JP | 2004123234 | 4/2004 |
| JP | 2009081022 | 4/2009 |
| JP | 2009193677 | 8/2009 |
| JP | 2012195452 | 10/2012 |
| TW | 201232931 A1 | 8/2012 |

* cited by examiner

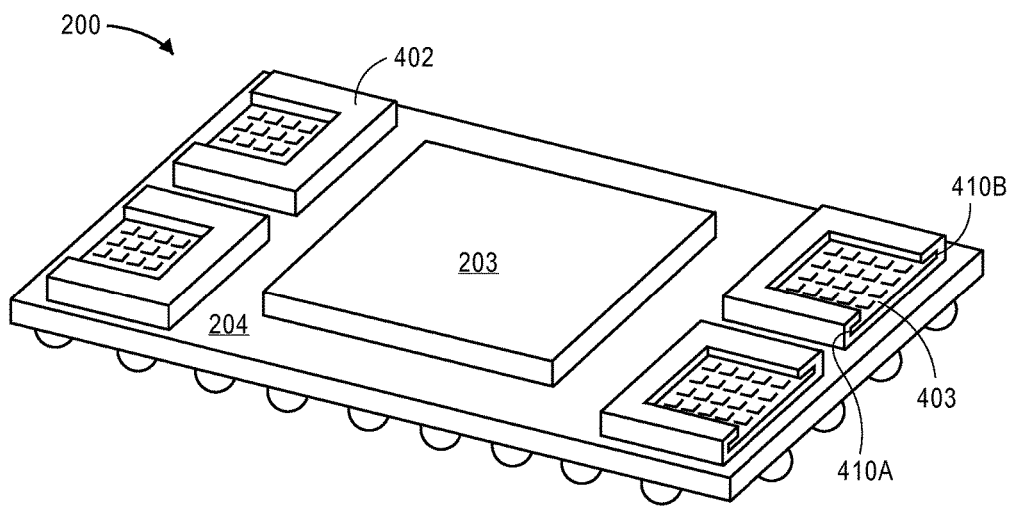
FIG. 4A
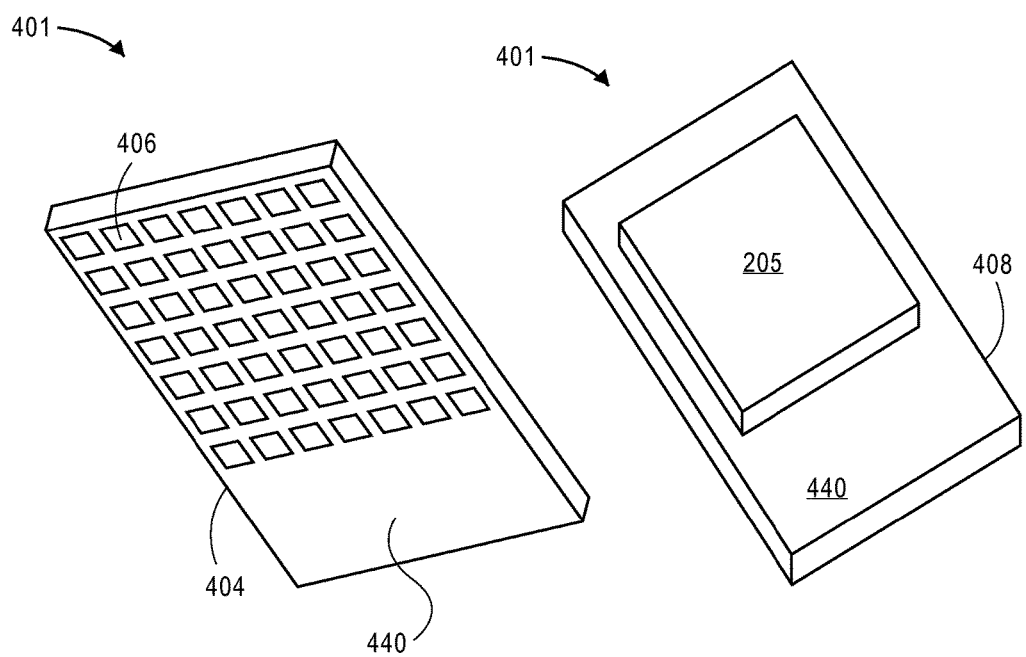
FIG. 4B  FIG. 4C

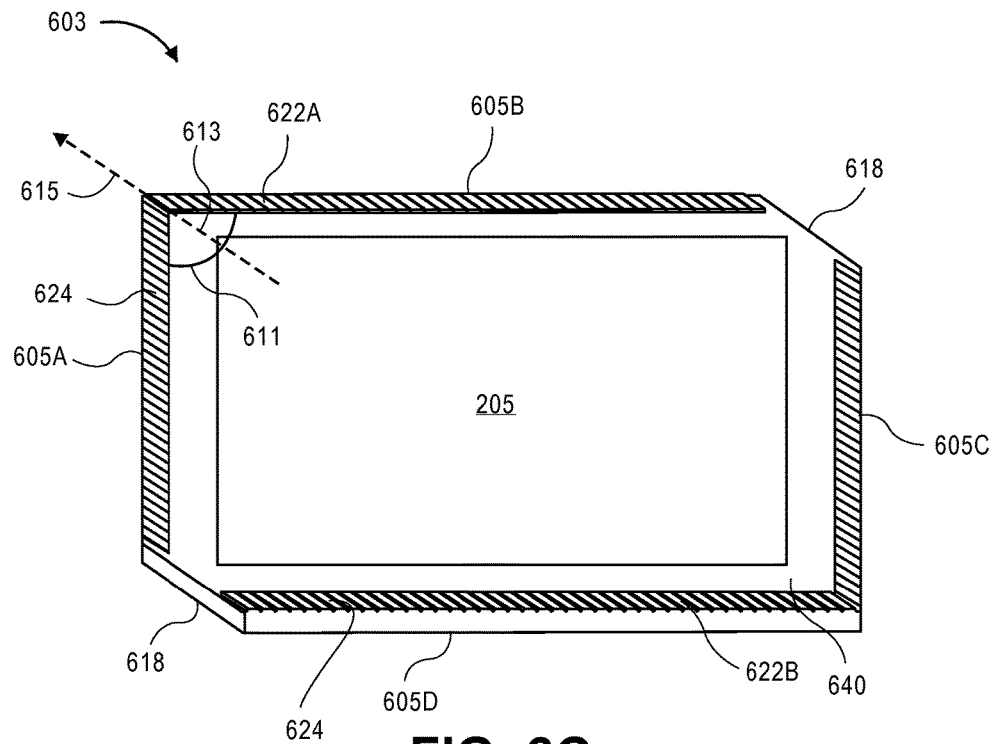
FIG. 6C
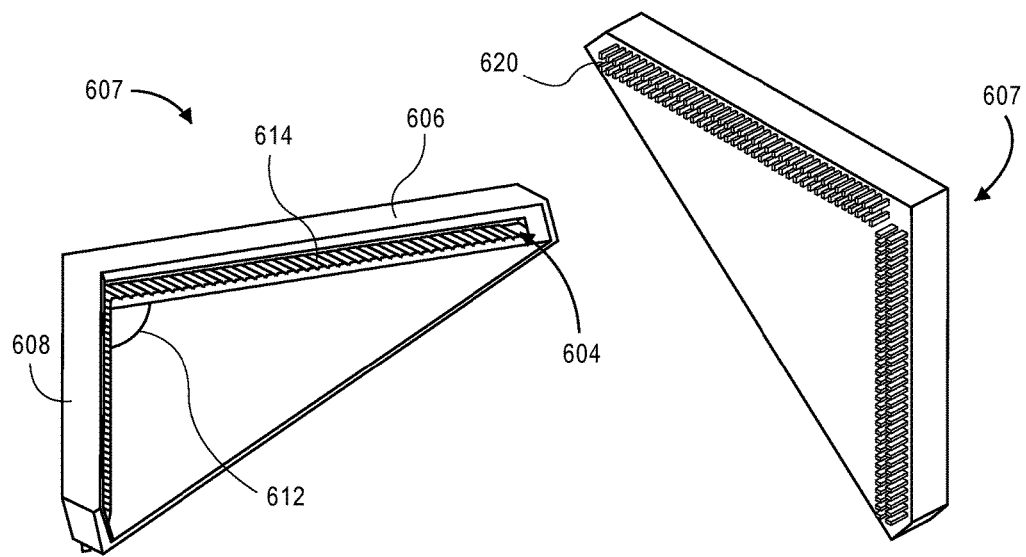
FIG. 6D   FIG. 6E

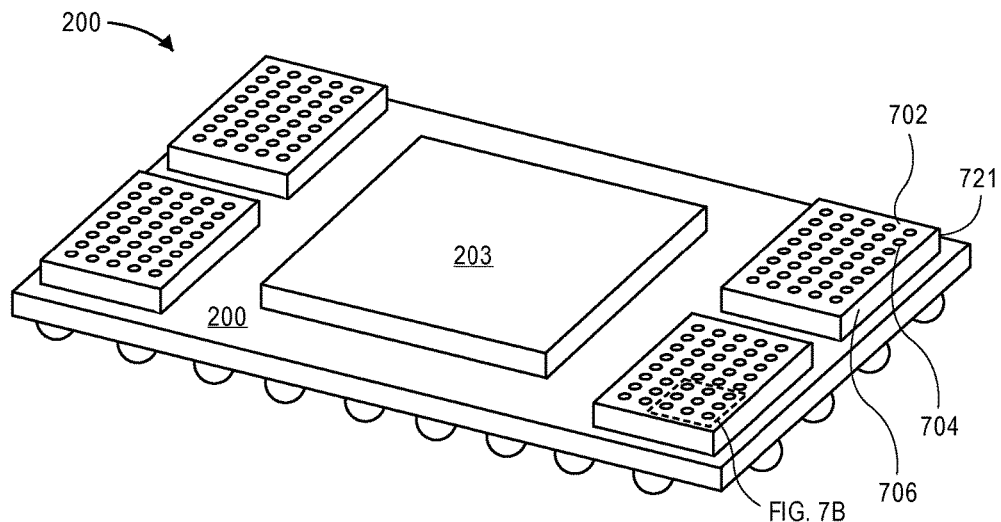
FIG. 7A
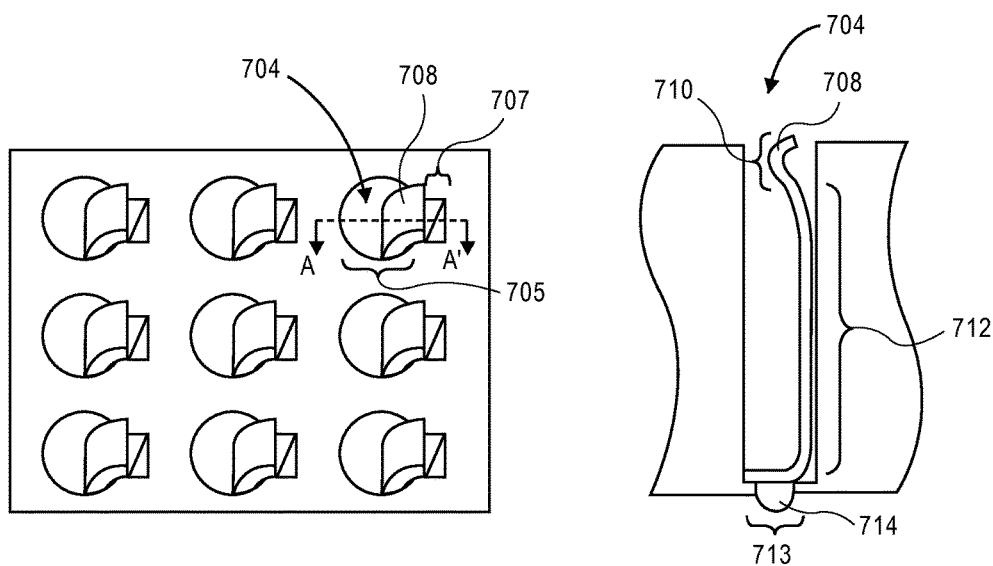
FIG. 7B  FIG. 7C

FIG. 10B  FIG. 10C

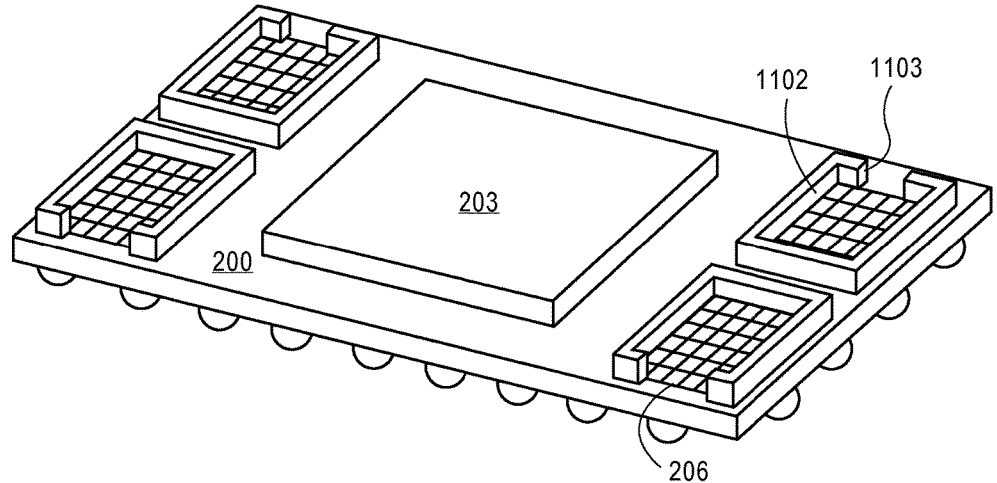
FIG. 11A
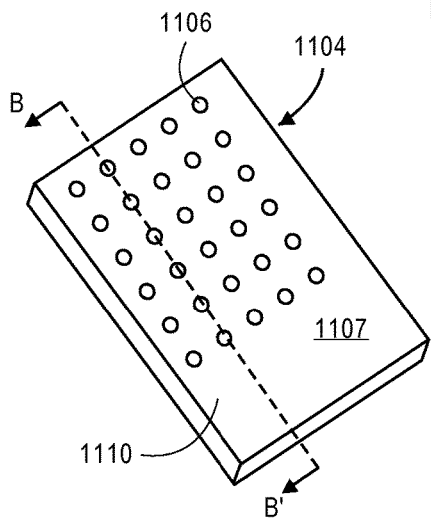
FIG. 11B
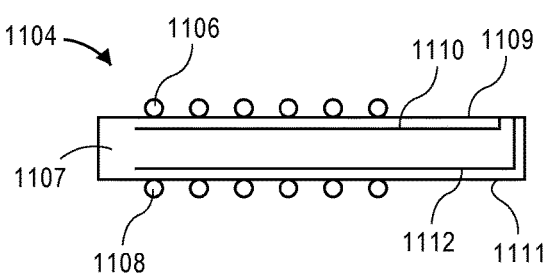
FIG. 11C
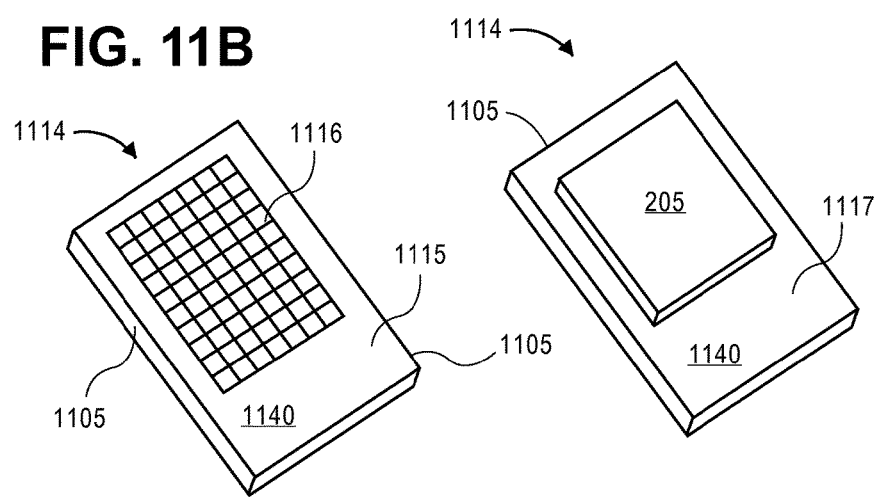
FIG. 11D            FIG. 11E

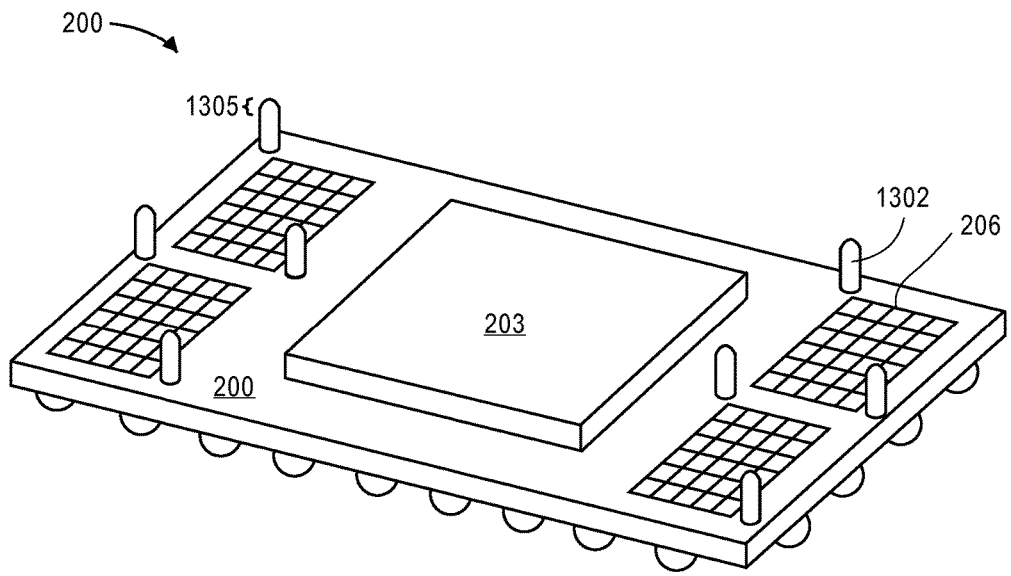
FIG. 13A
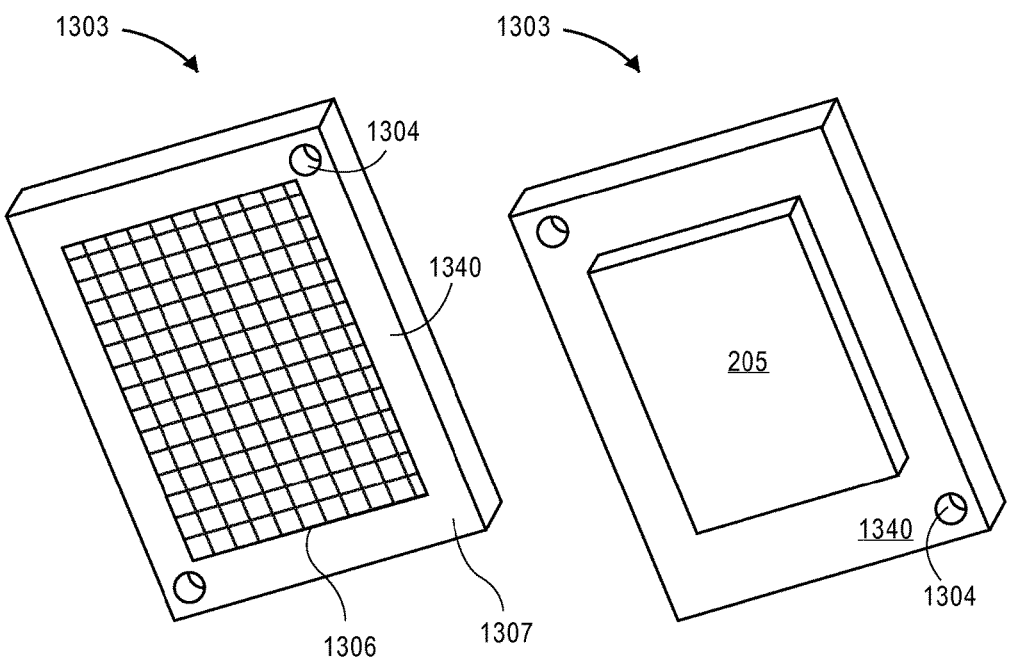
FIG. 13B  FIG. 13C

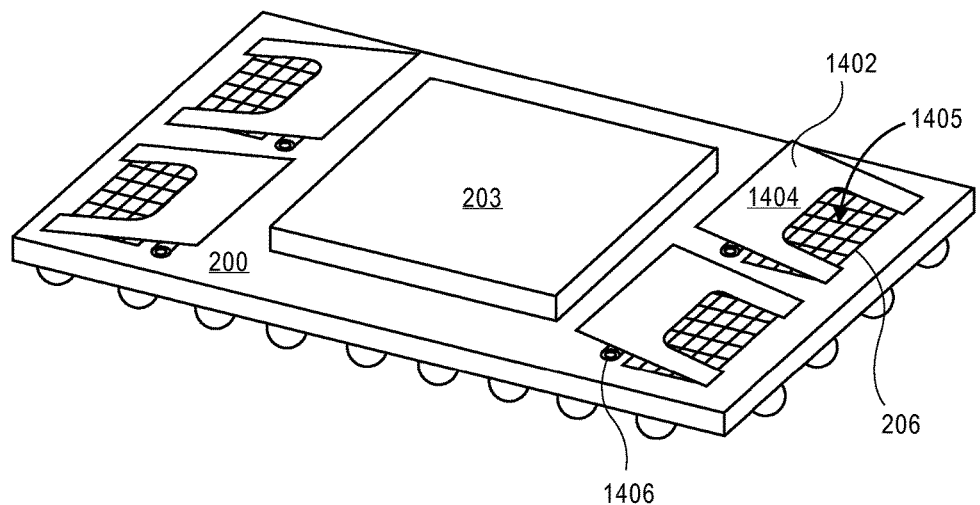
FIG. 14A
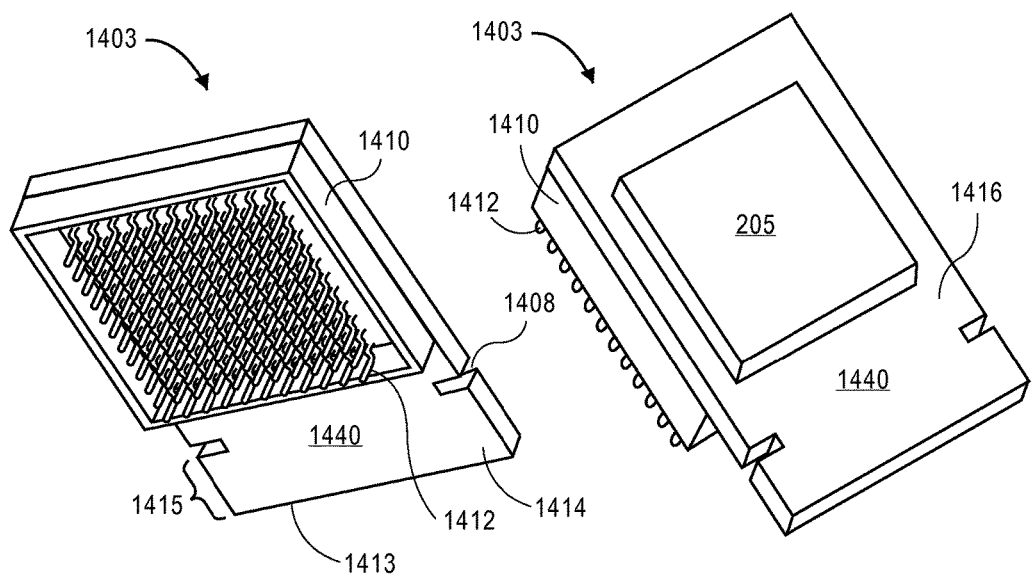
FIG. 14B  FIG. 14C

CPU PACKAGE SUBSTRATES WITH REMOVABLE MEMORY MECHANICAL INTERFACES

TECHNICAL FIELD

Embodiments generally relate to package substrates and, more specifically, central processing unit (CPU) package substrates with removable memory mechanical interfaces.

BACKGROUND

An increasing demand for higher performance computers has driven a greater effort to increase the performance of internal device components. The performance of a computer's CPU is highly dependent upon the bandwidth and capacity of memory devices that are accessible to the CPU. The bandwidth and capacity limitations of such memory consequently limit the performance of the CPU. Thus, industry leaders are motivated to increase the accessibility of memory devices to a CPU.

According to one approach, memory devices may be attached directly to the CPU package substrate rather than on the motherboard. Although a variety of memory devices can be integrated on the CPU package substrate, the memory devices cannot be reconfigured after package assembly.

The package assembly process includes attaching a CPU and memory devices onto a CPU package substrate. Conventional methods integrate memory devices on the CPU package substrate by soldering them directly on the CPU package substrate during the package assembly process. A conventional CPU package substrate 100 is illustrated in FIG. 1A. As shown in FIG. 1A, a processing device interface 102, such as a land grid array (LGA), is disposed on a CPU package substrate 104. Additionally, memory device electrical interfaces 106 may be disposed on the CPU package substrate 104 beside the processing device interface 102. Memory device electrical interfaces 106 may also be LGAs.

FIG. 1B illustrates a conventional CPU package 101 after completion of the CPU package assembly process. The conventional CPU package 101 includes a processing device 108 and memory devices 110 mounted on the CPU package substrate 104. In embodiments, the processing device 108 and memory devices 110 mount directly on the package substrate 104. For instance, the processing device 108 and memory devices 110 may be flip-chip bonded on the CPU package substrate 104 via an array of solder joints (not shown). Soldered connections are permanent connections that, once reflowed and cooled, cannot be removed without subjecting the entire CPU package 101 to a reflow process. Thus, the memory devices 110 are permanently attached to the CPU package substrate 104 and cannot be easily removed. Once the memory devices 110 are attached and a customer purchases the assembled package, the customer cannot reconfigure the particular arrangement of memory devices 110. The assembled package is thus a highly specific device that is useful in only a few applications.

As technology continues to develop, the marketplace becomes more segmented with varying requirements of memory capacity and bandwidth needs. Additionally, customers increasingly look for custom memory arrangements for their specific applications. Due to the inability to reconfigure the memory device arrangement after CPU package assembly, current producers of these CPU package assemblies are having to generate numerous model variations to keep up with customer preferences. Having numerous model variations can be cumbersome, time consuming, and expensive to maintain.

BRIEF DESCRIPTION OF THE DRAWINGS

FIG. 4A illustrates a top perspective view of a package with a sliding rail socket on a configurable CPU package substrate, in accordance with an embodiment of the invention.

FIGS. 4B-4C illustrate bottom and top perspective views of a sliding rail socket counterpart, in accordance with an embodiment of the invention.

FIGS. 6C-6E illustrate portions of a full edge pin grid array counterpart system that assemble to form the full edge pin grid array counterpart, in accordance with an embodiment of the invention.

FIG. 7A illustrates a package with a low insertion force socket on a configurable CPU package substrate, in accordance with an embodiment of the invention.

FIGS. 7B-7C illustrate a top perspective view of a portion of a low insertion force socket, in accordance with an embodiment of the invention.

FIG. 7C illustrates a cross-sectional view of a contact pin of a low insertion force socket, in accordance with an embodiment of the invention.

FIGS. 10B-10C illustrate bottom and top perspective views of a zero insertion force socket, in accordance with an embodiment of the invention.

FIG. 11A illustrates a top perspective view of a package with a frame socket on a configurable CPU package substrate, in accordance with an embodiment of the invention.

FIGS. 11B-11C illustrate a top perspective view and a cross-sectional view of a reflowable grid array, in accordance with an embodiment of the invention.

FIGS. 11D-11E illustrate top and bottom perspective views of a frame socket counterpart, in accordance with an embodiment of the invention.

FIG. 13A illustrates a package with a set of alignment pins on a configurable CPU package substrate, in accordance with an embodiment of the invention.

FIGS. 13B-13C illustrate bottom and top perspective views of an alignment pin counterpart, in accordance with an embodiment of the invention.

FIG. 14A illustrates a package with a spring-loaded clip on a configurable CPU package substrate, in accordance with an embodiment of the invention.

FIGS. 14B-14C illustrate bottom and top perspective views of a spring-loaded clip counterpart, in accordance with an embodiment of the invention.

DETAILED DESCRIPTION

Figure 1A:
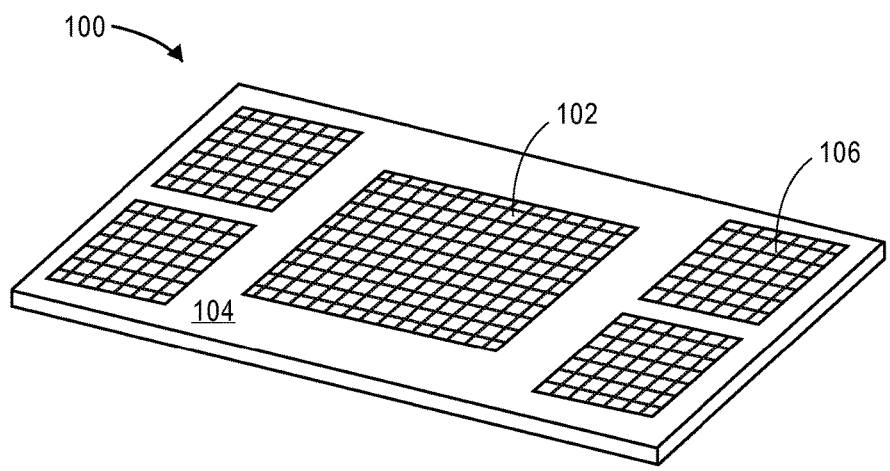
FIG. 1A illustrates a top perspective view of a conventional CPU package substrate.
Figure 1B:
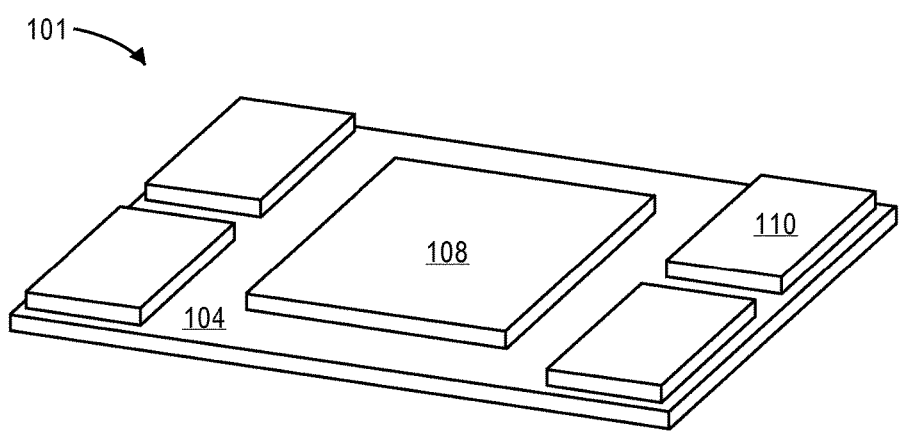
FIG. 1B illustrates a top perspective view of a conventional CPU package.

CPU Package substrates with configurable/removable memory are disclosed. In the following description, numerous specific details are set forth, such as specific integration regimes, in order to provide a thorough understanding of embodiments of the present invention. It will be apparent to one skilled in the art that embodiments of the present invention may be practiced without these specific details. In other instances, well-known features are not described in detail in order to not necessarily obscure embodiments of the present invention. Furthermore, it is to be understood that the various embodiments shown in the Figures are illustrative representations and are not necessarily drawn to scale.

1.0 CPU Package Substrate with Removable Memory Mechanical Interfaces

Embodiments of the present invention disclose configurable CPU package substrates with removable memory mechanical interfaces that enable memory devices to be easily removed and re-attached. In one embodiment of the invention, a configurable CPU package substrate includes a processing device interface and a memory device electrical interface. The processing device interface and memory device electrical interface couple to a processing device (e.g., a CPU) and a memory device (e.g., a DRAM chip), respectfully. In an embodiment, the configurable CPU package substrate further includes a removable memory mechanical interface. The removable memory mechanical interface allows attachment and detachment of a memory device after CPU package assembly. When attached by the removable memory mechanical interface, the memory device is physically and electrically coupled to the CPU package substrate.

In embodiments, the removable memory mechanical interface is a socket within which a memory device is inserted to couple to the CPU package substrate. Although the removable memory mechanical interface is a socket in many embodiments, the removable memory mechanical interface may be implemented as other structures as well. For instance, the removable memory mechanical interface may be a set of press-fit holes within which a corresponding set of alignment pins are inserted. The removable memory mechanical interface may also be a set of alignment pins designed to fit within press-fit holes on a memory device substrate. Additionally, the removable memory mechanical interface may be a spring-loaded clip that clips a memory device onto the CPU package substrate.

Despite their numerous variations, the removable memory mechanical interfaces in embodiments disclosed herein commonly enable CPU package substrates to be easily reconfigured with different memory devices after package assembly. During CPU package assembly, electrical devices such as a CPU are mounted on the CPU package substrate. Instead of permanently mounting memory devices directly onto the CPU package substrate as conventionally done, removable memory mechanical interfaces are formed or mounted on the CPU package substrate during package assembly, thus forming a configurable CPU package substrate. A processing device may then be attached to the configurable CPU package substrate, thereby forming a memory-configurable CPU package. Memory devices may then be attached to the removable memory mechanical interfaces before or after sending the memory-configurable CPU package to customers. After receiving the memory-configurable CPU package, the customer may reconfigure the memory arrangement as desired.

For instance, the customer may remove existing memory devices and reattach new memory devices as an upgrade. Configurable CPU package substrates therefore enable reconfiguration of memory devices after the package assembly process. Enabling reconfiguration after the package assembly process has several possible advantages. For example, enabling reconfiguration after package assembly increases the versatility of the CPU package substrate. A single CPU package substrate may thus be used for several different applications, as opposed to having several assembled CPU package substrates where each one is tailored for a different application. Additionally, customers can reconfigure the memory devices on their own, without having to send the memory-configurable CPU package back to the manufacturer or without having to use expensive tools.

Embodiments of the invention also enable manufacturers to tailor products to customer needs in a cost effective way. For instance, instead of having to solder memory devices onto a packaged substrate, memory devices may be merely pressed into sockets on the CPU package substrate. Not having to perform a soldering process increases throughput and decreases cost. Additionally, ease of reconfiguration may eliminate the possibility of having CPU package assemblies with undesirable memory configurations.

Additionally, embodiments of the invention help the quality assurance testing process. For instance, memory devices may be removed during testing. Accordingly, when a memory failure occurs, the failure is easily attributed to the internal memory within the CPU device. There is little uncertainty as to which memory (internal or external) is failing. By subsequently adding one memory device at a time and performing testing procedures, each memory device can be tested separately. For instance, if it is known that the internal memory is functioning correctly, failures during testing when only one external memory device is attached may clearly indicate that the failure is occurring in the single external memory device. By enabling this testing strategy, removable memory mechanical interfaces increase throughput and decrease production cost.

Figure 2A:
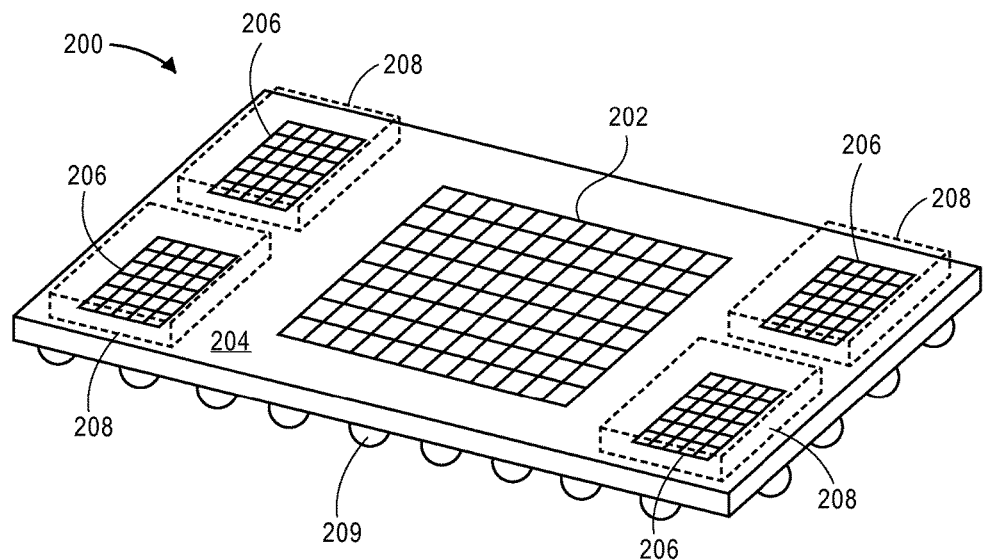
FIG. 2A illustrates a top perspective view of a configurable CPU package substrate, in accordance with an embodiment of the invention.

FIG. 2A illustrates a configurable CPU package substrate 200 according to embodiments of the invention. Configurable CPU package substrate 200 may include a CPU package substrate 204. The CPU package substrate 204 may be any suitable circuit board that interconnects integrated circuits with a system board. In an embodiment, the CPU package substrate 204 includes an array of solder balls 209 beneath the CPU package substrate 204 for interconnecting with, e.g., a system/motherboard of a computing system. The configurable CPU package substrate 200 may further include a processing device interface 202 and a memory device electrical interface 206 (or simply, "electrical device interface" 206). Memory device electrical interface 206 may be any suitable configuration of electrical input/output structures formed on the CPU package substrate 204. For instance, memory device electrical interface 206 may be an LGA or an array of pins. Although FIG. 2A illustrates a configurable CPU package substrate 200 with one processing device interface 202 and four memory device electrical interfaces 206, other embodiments may have other numbers of processing device interfaces and memory device electrical interfaces. For instance, configurable CPU package substrate 200 may include more than one processing device interface 202 and at least one memory device electrical interface 206.

The processing device interface 202 may be any suitable interconnection structure for coupling to a processing device (e.g., a multicore processor chip). For instance, processing device interface 202 may be an LGA having a plurality of rows N and columns M organized in an N×M array. In such arrangements, the processing device interface 202 may couple to a processing device (not shown) by an array of solder joints via, e.g., flip-chip bonding. Alternatively, the processing device interface 202 may be an array of pads arranged in a frame-like pattern. For example, the frame-like pattern of pads may surround a region with no pads. In such instances, the processing device interface 202 may couple to a processing device by a plurality of wires via wire bonding.

The memory device electrical interface 206 may be an electrical interconnection arrangement for communicatively coupling to a memory device. For instance, memory device electrical interface 206 may be an LGA organized on the CPU package substrate 204 in an N×M arrangement or any other array formation. The memory device electrical interface 206 may couple directly to a memory device substrate or to electrical connections integrated into a removable memory mechanical interface as will be disclosed further herein. The removable memory mechanical interface may be disposed in regions 208 around the memory device electrical interface 206. Accordingly, regions 208 are regions where a removable memory mechanical interface may be located. In an embodiment, regions 208 extend proximately to the memory device electrical interface. Regions 208 may extend to areas on the configurable CPU package substrate 204 directly beside the memory device electrical interface 206 as well as areas directly above the memory device electrical interface 206.

Figure 2B:
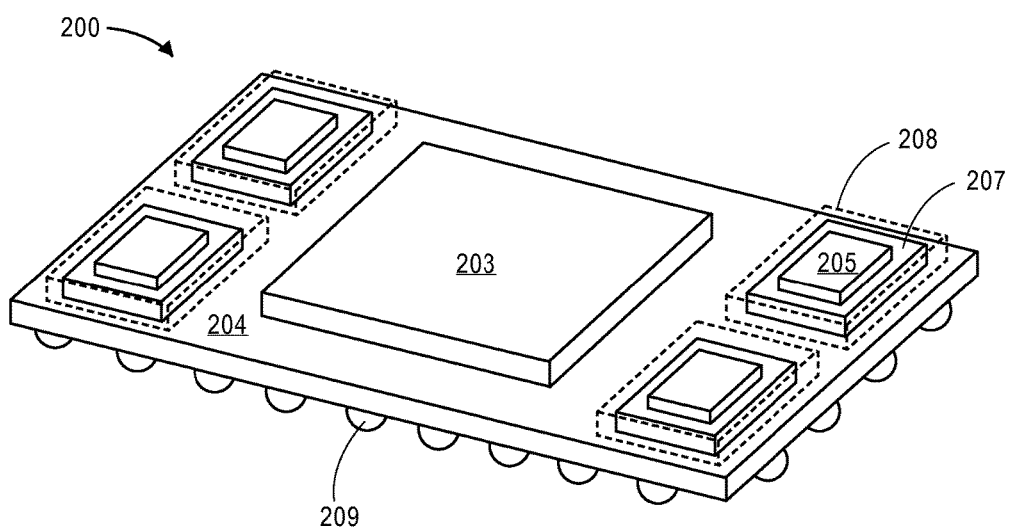
FIG. 2B illustrates a top perspective view of a memory-configurable package, in accordance with an embodiment of the invention.

FIG. 2B illustrates a memory-configurable CPU package 200 according to an embodiment of the invention. The memory-configurable CPU package 200 includes a processing device 203 coupled to the CPU package substrate 204. The processing device 203 may be flip-chip bonded to the processing device interface 202 (not shown) formed on the CPU package substrate 204. The memory-configurable CPU package 200 may also include memory devices 205 that are electrically coupled to respective memory device electrical interfaces 206 (not shown). According to various embodiments, the memory devices 205 are coupled to the memory device electrical interfaces 206 through a respective removable memory mechanical interface (not shown), such as a removable memory mechanical interface located within region 208. In an embodiment, a memory device 205 is coupled to a memory device substrate 207. Although the memory device 205 is illustrated on top of the memory device substrate 207, in an embodiment, the memory device 205 is mounted on the bottom of the memory device substrate 207. In an embodiment, a memory device 205 is mounted on top of the memory device substrate 207 and an additional device, such as another memory device 205 or another processing device 203, is mounted on the bottom of the memory device substrate 207. In embodiments, the memory device substrate 207 may be any suitable circuit board well known in the art and may even be part of the package for the memory device 205. The memory device substrate 207 may interconnect the memory device 205 to the memory device electrical interface 206 through a removable memory mechanical interface.

According to embodiments of the invention, the memory device 205 is attachable to and detachable from the removable memory mechanical interface. In embodiments, a separate tool is not needed to attach or detach the memory device to/from the mechanical interface. For instance, the memory device can be detached from the memory device mechanical interface in region 208 by pulling the memory device out of the removable memory mechanical interface. Further, a separate memory device may be attached to the removable memory mechanical interface by pushing the memory device into the removable memory mechanical interface. The pulling and pushing may be performed by hand such that no separate tool is needed. Enabling installation of memory devices by hand allows the configurable CPU package substrate 204 to be substantially versatile. Memory devices may be installed after fabrication of the memory-configurable CPU package, thereby allowing customers to easily customize the performance of the memory-configurable CPU package according to their specific applications.

The removable memory mechanical interface may be any suitable structure for mechanically attaching and detaching a memory device to/from the CPU package substrate such that insertions and removals are easily repeated. Examples include sockets, press fit holes, alignment pins and a clip. Some basic examples of these are reviewed immediately below.

Figure 3A:
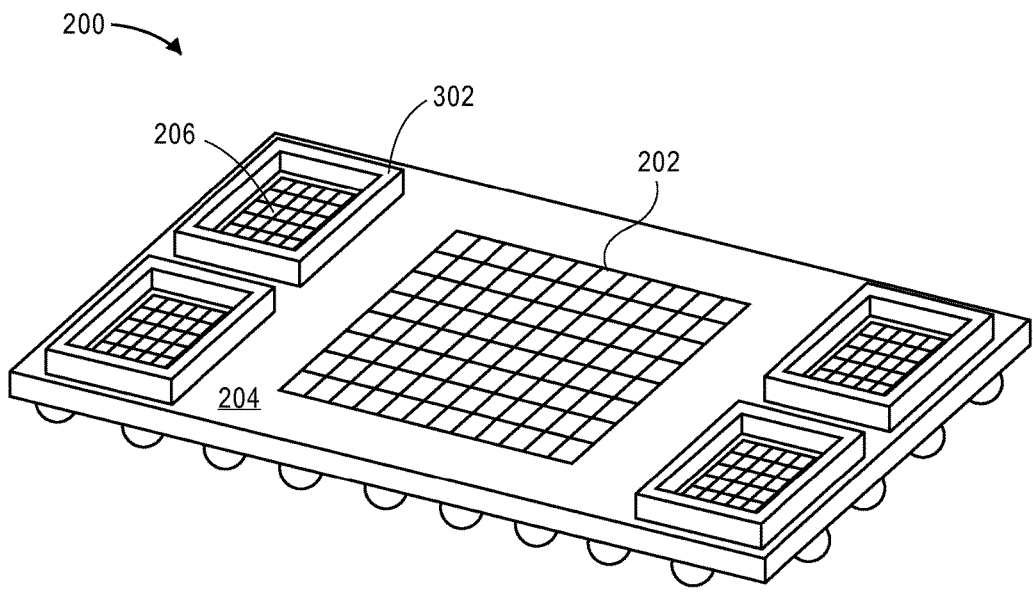
FIG. 3A illustrates a top perspective view of a configurable CPU package substrate with sockets as removable memory mechanical interfaces, in accordance with an embodiment of the invention.

FIG. 3A indicates that the removable memory mechanical interface may be implemented as a socket 302. The socket 302 may be mounted on the configurable CPU package substrate 204 around the memory device electrical interface 206. The socket 302 may also be mounted within the region 208 referenced in FIG. 2. In an embodiment, the memory device electrical interface 206 is an N×M array of pads. The socket 302 is a structure to which a memory device substrate and a memory device may fit. When fit in the socket, the memory device may be electrically coupled to the electrical interface 206. According to embodiments of the invention, the socket 302 may have various embodiments, as will be discussed in detail further herein.

Figure 3B:
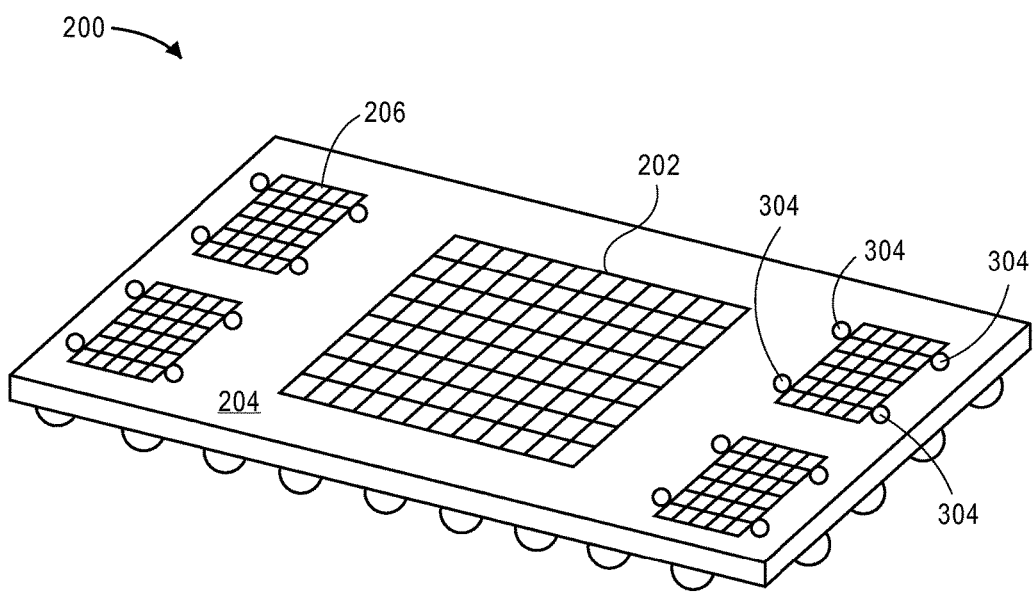
FIG. 3B illustrates a top perspective view of a configurable CPU package substrate with sets of press fit holes as removable memory mechanical interfaces, in accordance with an embodiment of the invention.

Alternatively from a socket 302, as observed in FIG. 3B, the removable memory mechanical interface may be implemented as a set of press fit holes 304 formed in the CPU package substrate. As shown in FIG. 3B, the set of press fit holes 304 may surround the memory device electrical interface. In an embodiment, the set of press fit holes 304 are disposed within the region 208 referenced in FIG. 2. Press fit holes 304 may allow a memory device whose package has "pegs" or "pins" that fit into holes 304 to attach to and detach from the CPU package substrate and memory device electrical interface. In embodiments, the memory device is mounted on a memory device substrate, which has alignment pins that directly attach to the press fit holes 304. The alignment pins may insert into the press fit holes 304 as will be discussed further herein.

Figure 3C:
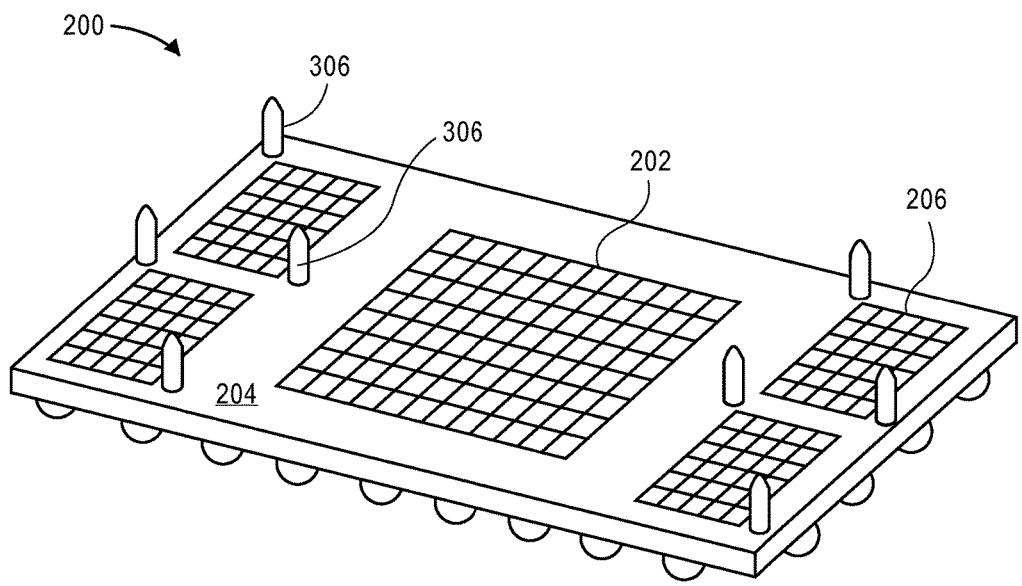
FIG. 3C illustrates a top perspective view of a configurable CPU package substrate with sets of alignment pins as removable memory mechanical interfaces, in accordance with an embodiment of the invention.

Further alternatively, the removable memory mechanical interface may be a set of alignment pins 306 as illustrated in FIG. 3C. Alignment pins 306 may be disposed around the memory device electrical interface 206 within the region 208 referenced in FIG. 2. The alignment pins 306 may allow attachment and detachment of a memory device to the CPU package substrate 204. In embodiments, the memory device is mounted on a memory device substrate, which has press fit holes that directly attach to the alignment pins 306. The alignment pins 306 may insert into the press fit holes as will be discussed further herein.

Figure 3D:
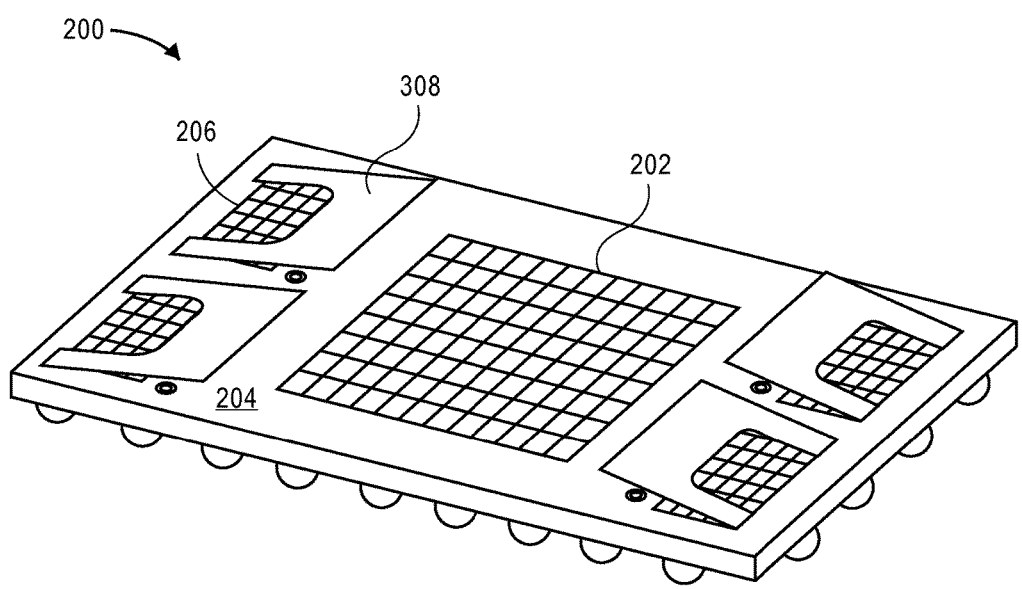
FIG. 3D illustrates a top perspective view of a configurable CPU package substrate with spring-loaded clips as removable memory mechanical interfaces, in accordance with an embodiment of the invention.

Further still alternatively, the removable memory mechanical interface may be a spring-loaded clip 308 as illustrated in FIG. 3D. The spring-loaded clip 308 may be disposed above and around the memory device electrical interface 206 within the region 208 referenced in FIG. 2. In embodiments, the spring-loaded clip 308 may clip a memory device to the memory device electrical interface 206 by utilizing a spring-generated force to press down upon a memory device substrate as will be discussed further herein.

Conceivably a removable memory mechanical interface may be implemented by combining two or more types of mechanical interfaces such as two or more of the types of mechanical interfaces discussed above with respect to FIGS. 3A through 3D.

1.1 Socket Embodiments

The removable memory mechanical interface may be formed of various structures, several of which may be different variations of sockets. To better disclose these variations, the following embodiments illustrate a configurable CPU package substrate with the various sockets as the removable memory mechanical interfaces. The various removable memory mechanical interfaces may be located within the region 208 as disclosed herein with respect to FIG. 2A. As shown in the following illustrations, a processing device 203 is attached to the configurable CPU package substrate to specifically show how memory devices may be attached to the removable memory mechanical interfaces after package assembly. As defined herein, a socket is a structure within which a counterpart structure may insert. Once inserted, the counterpart structure may then be coupled to an underlying substrate.

1.1.1 Sliding Rail Socket

In an embodiment, the removable memory mechanical interface is a sliding rail socket. FIG. 4A illustrates a package with a sliding rail socket 402 on a configurable CPU package substrate 200. The sliding rail socket 402 includes a pair of sliding grooves 410A and 410B that help guide a counterpart structure into the sliding rail socket 402. An array of input/output (I/O) connections 403 may be disposed within the sliding rail socket 402. In an embodiment, the array of I/O connections 403 is formed of an N×M array of pins as illustrated in FIG. 4A. Although illustrated as an array of pins, in alternative embodiments, the array of I/O connections 403 is an N×M array of pads. The memory device electrical interface (not shown) may be disposed beneath the sliding rail socket 402. The array of I/O connections 403 may be electrically coupled to the memory device electrical interface. In an embodiment, the sliding rail socket 402 may face the outer edges of the configurable CPU package substrate 200. Facing the outer edges prevents the processing device 203 from blocking insertion of structures into the sliding rail socket 402.

An exemplary sliding rail socket counterpart 401 for the sliding rail socket 402 is illustrated in FIGS. 4B-4C. Specifically, FIG. 4B illustrates a bottom perspective view of the sliding rail socket counterpart 401, and FIG. 4C illustrates a top perspective view of the counterpart 401.

With reference to FIG. 4B, the sliding rail socket counterpart 401 is formed of a memory device substrate 440. The memory device substrate 440 may be any suitable circuit board well known in the art. An array of interconnection structures 406 may be disposed on a bottom side 404 of the memory device substrate 440. In an embodiment, the array of interconnection structures 406 is an array of pads. In an alternative embodiment, the array of interconnection structures 406 is an array of pins. In any case, whether the array of interconnection structures 406 are an array of pads or pins, the array of I/O connections 403 complements the interconnection structures 406 so that an electrical connection may be formed. For instance, if the array of interconnection structures 406 is an array of pads, the array of I/O connections 403 is an array of pins, and vice versa.

Referring now to FIG. 4C, a memory device 205 is shown mounted on the memory device substrate 440. In an embodiment, the memory device 205 is flip-chip bonded to the top surface 408 of the memory device substrate 440, although any other suitable bonding method, such as wire bonding, is envisioned in embodiments of the invention. The memory device 205 may be interconnected to the array of interconnection structures 406 through the memory device substrate 440.

Figure 4D:
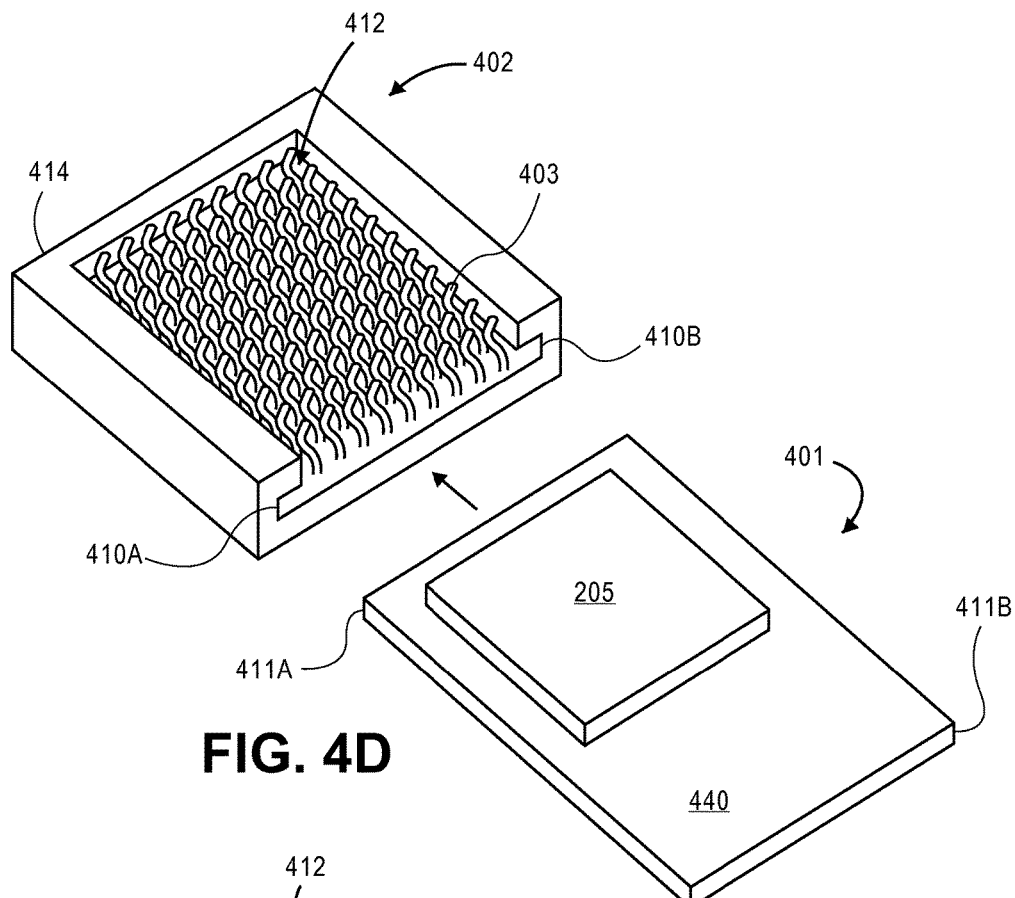
FIGS. 4D-4E illustrate a method of attaching a sliding rail socket counterpart to a sliding rail socket, in accordance with an embodiment of the invention.
Figure 4E:
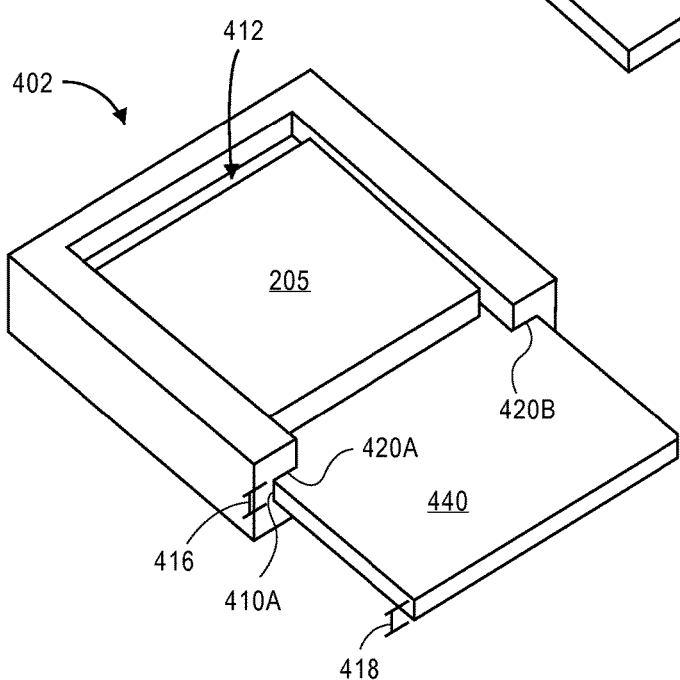

FIGS. 4D-4E illustrate a method of attaching a memory device 205 to a removable memory mechanical interface. Specifically, FIGS. 4D-4E illustrate a method of attaching the sliding rail socket counterpart 401 to the sliding rail socket 402.

As shown in FIG. 4D, the sliding rail socket counterpart 401 is moved towards the sliding grooves 410A and 410B. The sliding rail socket counterpart 401 may be aligned by mechanical interaction between the sliding grooves 410A and 410B and the respective rails 411A and 411B of the sliding rail socket counterpart 401. For instance, the rails 411A and 411B may slide within the sliding grooves 410A and 410B as the sliding rail socket counterpart 401 inserts into the sliding rail socket 402. In an embodiment, the sliding grooves 410A and 410B are U-shaped to provide alignment of the memory device substrate 440 in the X and Y directions. The rails 411A and 411B may be edges of the memory device substrate 440 that fit within the sliding grooves 410A and 410B, respectively.

In the embodiment depicted in FIG. 4D, the array of I/O connections 403 is an array of pins. In an embodiment, the array of pins is an array of cantilever pins that bend when pressed against a surface. Accordingly, the array of pins may conform to uneven pad height across the array of interconnection structures 406. The ability to conform to uneven pad height allows the array of pins 403 may make contact with the entire array of interconnection structures 406 despite any height difference amongst the structures 406. In an embodiment, the array of pins 403 are slanted toward a stopping wall 414 of the sliding rail socket 402. The stopping wall 414 may be located at the back end of the sliding rail socket 402. Slanting toward the stopping wall 414 of the socket 402 minimizes frictional damage between the pins 403 and pads 406 when the sliding rail socket counterpart 401 is inserted into the socket 402. The stopping wall 414 prevents the memory device substrate 440 from inserting too far into the sliding rail socket 402. Accordingly, the stopping wall 414 may align the memory device substrate 440 in the Z direction.

The sliding rail socket 402 may include a window 412. In an embodiment, the window 412 is an opening 412 of the sliding rail socket 402 that allows the memory device 205 to slide within it, as shown in FIG. 4E. Without the opening 412, the memory device substrate 440 cannot fully insert into socket 402 because the memory device 205 may be blocked by the top of the socket 402.

FIG. 4E illustrates attachment of the sliding rail socket counterpart 401 to the sliding rail socket 402. The sliding grooves 410A and 410B secure the sliding rail socket counterpart 401 in place by holding the memory device substrate 440 with gripping portions 420A and 420B of the sliding grooves 410A and 410B. In an embodiment, the height 416 of the grooves 410 may be equal to, if not slightly larger than, the thickness 418 of the memory device substrate 440. Accordingly, the height 416 may allow the memory device substrate 440 to slide within the grooves 410, while maintaining contact to prevent the sliding rail socket counterpart 401 from substantially moving. Once attached, the memory device 205 may be electrically coupled to the configurable CPU package substrate 200 by the array of I/O connections 403 in the sliding rail socket 402.

In embodiments, the static friction between the sliding grooves 410 and the sliding rail socket counterpart 401 hold the memory device 205 in place. Accordingly, a force with a magnitude greater than the static frictional force may thereby remove the memory device 205 from the sliding rail socket 402 of the configurable CPU package substrate 200. A new sliding rail socket counterpart 401 with a new memory device 205 may then replace the old counterpart 401 and attach to the sliding rail socket 402. In embodiments, a separate tool is not required to remove the memory device 205 from the sliding rail socket 402.

1.1.2 Multi-Edge Socket

Other than a sliding rail socket, the removable memory mechanical interface may be a multi-edge socket. For instance, the removable memory mechanical interface may be a double edge socket or a full edge pin grid array socket, as further discussed herein.

1.1.2.1 Double Edge Socket

Figure 5A:
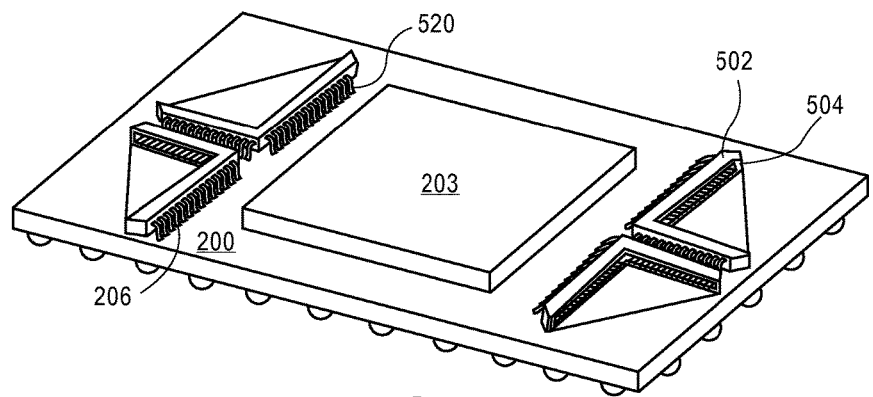
FIG. 5A illustrates a package with a double edge socket on a configurable CPU package substrate, in accordance with an embodiment of the invention.

FIG. 5A illustrates a package with a double edge socket 502 on a configurable CPU package substrate 200 according to an embodiment of the invention. The double edge socket 502 may be an L-shaped socket with an opening 504 that faces laterally toward the outer edges of the configurable CPU package substrate 200. Facing laterally toward the outer edges prevents the processing device 203 from blocking insertion of structures into the double edge socket 502. In embodiments, the double edge socket 502 is coupled to a corresponding memory device electrical interface 206 on the configurable CPU package substrate 200. For instance, the memory device electrical interface 206 may be an array of pads coupled to an array of wire connections 520 of the double edge connector 502.

Figures 5B, 5C:
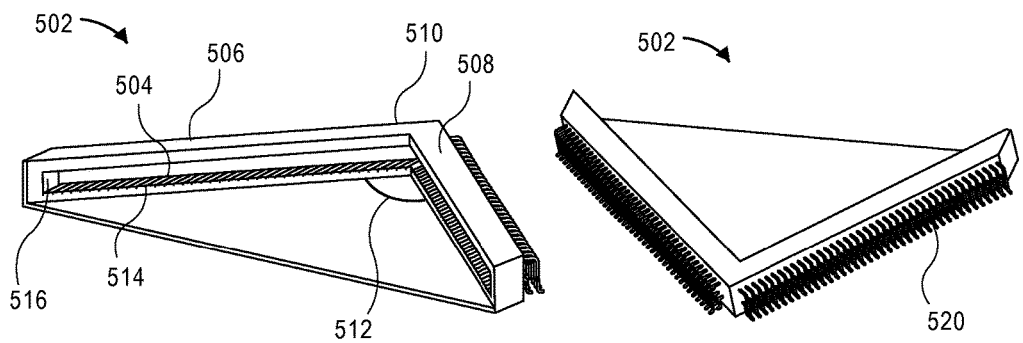
FIGS. 5B-5C illustrate front and back perspective views of a double edge socket, in accordance with an embodiment of the invention.

A detailed front and back perspective view of the double edge socket 502 is illustrated in FIGS. 5B and 5C, respectively. As shown in FIG. 5B, the double edge socket 502 has a first portion 506 and a second portion 508 connected at a joint 510. The first and second portions 506/508 may form an offset angle 512. Accordingly, the first portion 506 may extend in a direction at an offset angle from the second portion 508. In embodiments, opening 504 extends along both portions 506/508 and through the joint 510. Accordingly, a counterpart structure may insert within the opening 504 to make connection with the double edge socket 502. Specifically, two adjacent edges of the counterpart structure may couple to the double edge socket 502. In embodiments, the opening 504 contains beveled corners 516 at the ends of the opening 504 for insertion alignment, as will be discussed further herein.

In embodiments, the opening 504 contains an array of I/O connections 514 for coupling to external structures. In an embodiment, the array of I/O connections 514 is an array of contacts, such as an array of pads or cantilever pins. The array of I/O connections 514 may be disposed on a bottom-inner surface of the opening 504. Additionally, in an embodiment, the opening 504 contains a second array of I/O connections (not shown). The second array of I/O connections may be disposed on the top-inner surface of the opening 504. The array of I/O connections 514 may be oriented along an insertion direction to prevent electrical shorting between adjacent contacts during installation. In an embodiment, the insertion direction is at an angle half of the offset angle from the first or second portion 506/508. Further illustration of the insertion direction is shown in FIG. 5D, as will be discussed herein.

The array of I/O connections 514 may have a contact pitch designed to maximize the number of contacts while assuring each contact has sufficient surface area for forming electrical connections. In an embodiment, the contact pitch may range between 0.3 to 0.5 mm. In a particular embodiment, the array of I/O connections 514 has a contact pitch of about 0.4 mm. Accordingly, for a socket 520 containing bottom- and top-inner array of I/O connections 514, double edge socket 502 may have a total of approximately 160 pads. Additionally, a contact density of approximately 5 contacts per mm is achievable.

Both arrays of I/O connections 514 may be electrically coupled to corresponding arrays of wire connections 520 located behind the double edge socket 502, as illustrated in FIG. 5C. The arrays of wire connections 520 may couple the double edge socket 502 to a corresponding memory device electrical interface 206 on the configurable CPU package substrate 200. In an embodiment, the arrays of wire connections 520 are gullwing connections.

Figure 5D:
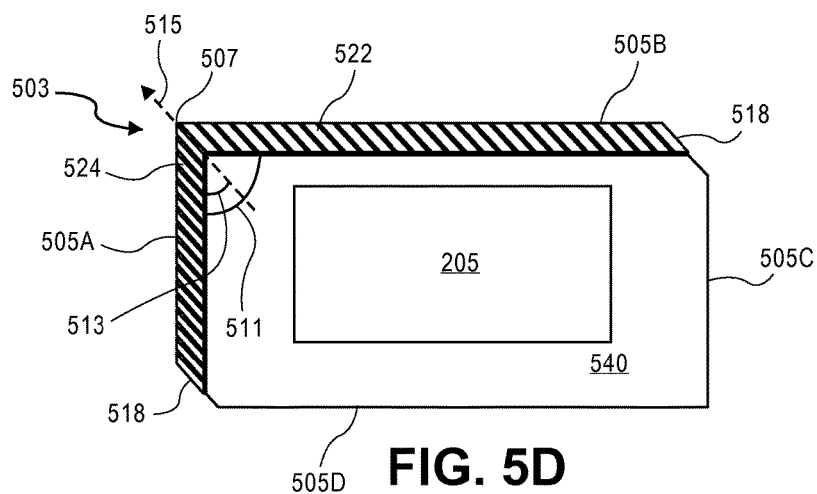
FIG. 5D illustrates a top-view perspective of a double edge socket counterpart, in accordance with an embodiment of the invention.

FIG. 5D illustrates a top-view perspective of a double edge socket counterpart 503. In an embodiment, the double edge socket counterpart 503 includes an integrated circuit device, such as the memory device 205. The memory device 205 may be flip-chip bonded to a memory device substrate 540. Memory device substrate 540 may have several edges 505A-505D. Two edges 505A and 505B may be joined at one end to form a corner 507. In an embodiment, the two edges 505A and 505B form a separation angle 511 with respect to one another. The separation angle may be equal in degree to the offset angle 512 of the double edge connector 502. In an embodiment, the separation angle 511 and offset angle 512 are approximately 90 degrees.

The memory device substrate 540 also includes a single connection interface 522. Single connection interface 522 may continuously extend across two adjacent edges, such as edges 505A and 505B. Accordingly, the single connection interface 522 may form an L-shaped profile along edges 505A and 505B. In an embodiment, the single connection interface 522 includes an array of pads 524 that extend to the very edge of the memory device substrate 540. The array of pads 524 may have a contact pitch that corresponds to the double edge connector 502. For instance, the array of pads 524 may have a contact pitch of approximately 0.4 mm, thus forming an array of pads 524 containing approximately 160 pads.

In embodiments, each pad of the array of pads 524 is aligned with an insertion direction 515. The insertion direction 515 may be the direction at which the double edge socket counterpart 503 inserts into the double edge socket 502 to prevent shorting between each pad of the array of pads 524. In an embodiment, the insertion direction 515 is at an angle 513 that is half of the separation angle 511. Accordingly, each pad of the array of pads 524 is aligned in a direction at an angle 513 that is half of the separation angle 511. In an embodiment where the separation angle is 90 degrees, each pad of the array of pads 524 is aligned in a direction at an angle of 45 degrees from edge 505A. In embodiments, each pad of the array of pads 524 is aligned in the same direction as the array of I/O connections 514.

Although FIG. 5D illustrates the single connection interface 522 as having an array of pads 524 on only one side of the memory device substrate 540, embodiments are not so limited. For instance, the single connection interface 522 may also have a mirrored set of pads (not shown) on the underside of the memory device substrate 540. The mirrored set of pads may be identical in size and aligned in the same direction to the array of pads 524.

The memory device substrate 540 may also include beveled edges 518. The beveled edges 518 may be located on corners of the memory device substrate 540 where ends of the single connection interface 522 are located. For instance, the beveled edges 518 may be located at the corners between edges 505B and 505C, as well as edges 505A and 505D. The beveled edges 518 may be oriented along the insertion direction 515. Accordingly, in an embodiment, the beveled edges 518 are parallel to the pads 524. As will be discussed further herein with respect to FIGS. 5E-5F, the beveled edges 518 may assist in aligning the double edge socket counterpart 503 to the double edge socket 502 during insertion.

Figure 5E:
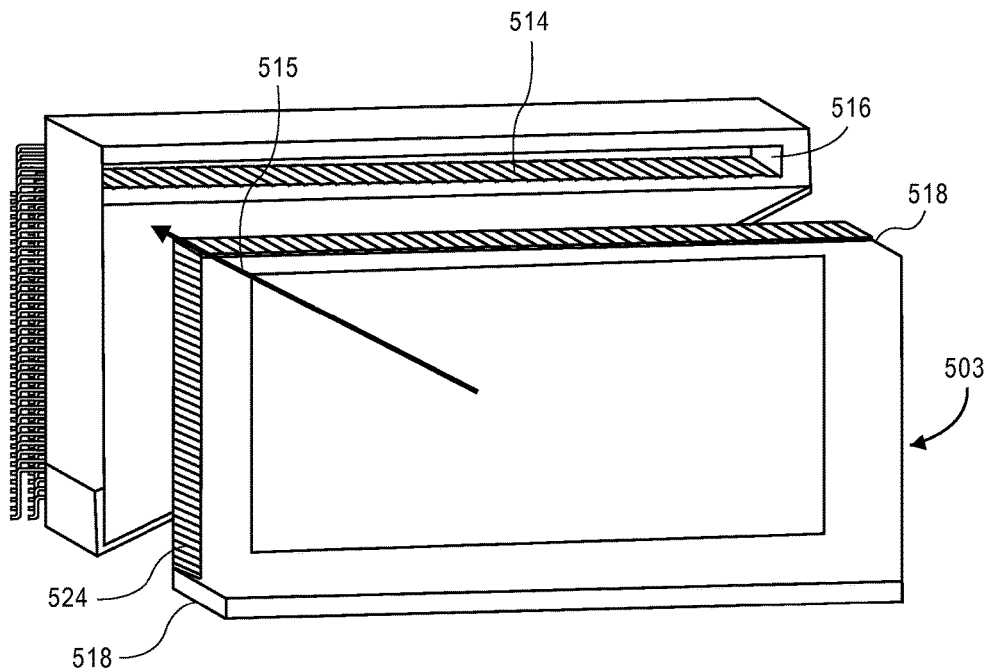
FIGS. 5E-5F illustrate a method of attaching a double edge socket counterpart to a double edge socket, in accordance with an embodiment of the invention.
Figure 5F:
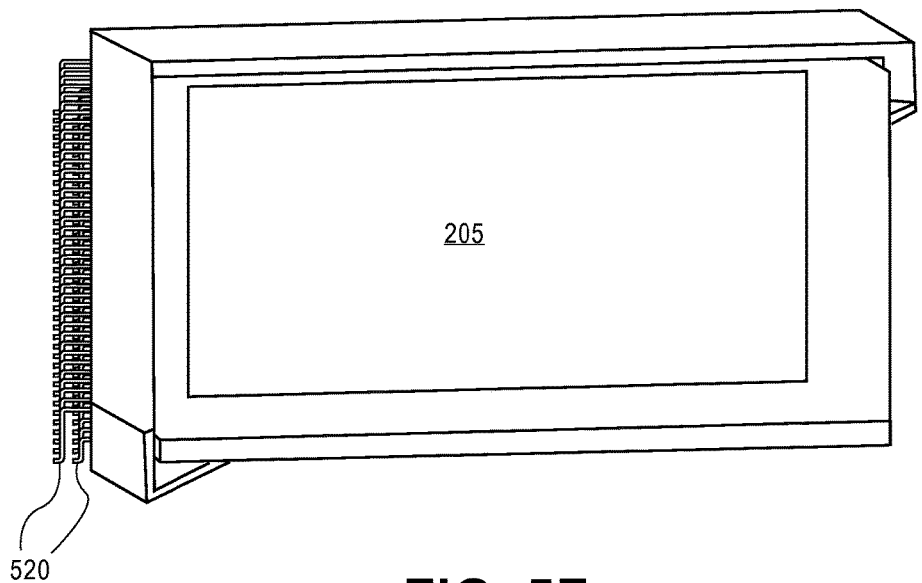

FIGS. 5E-5F illustrate a method of attaching a memory device to a removable memory mechanical interface. Specifically, FIGS. 5E-5F illustrate a method of attaching the double edge socket counterpart 503 to the double edge socket 502.

As shown in FIG. 5E, the double edge socket counterpart 503 is inserted toward the double edge socket 502. In embodiments, the double edge socket counterpart 503 is inserted along the insertion direction 515. Inserting the counterpart 503 along the insertion direction 515 substantially prevents shorting between adjacent pads within each array of pads 524 and 514 when attached because the pads are already oriented along the insertion direction 515. The beveled edges 518 of the memory device substrate 540 may mechanically align the counterpart 503 with the socket 502 by sliding against corresponding beveled corners 516 of the socket 502. In an embodiment, the beveled corners 516 of the double edge socket 502 extends along the insertion direction 515. Accordingly, the beveled corners 516 guide the memory device substrate 540 along the insertion direction 515 during insertion.

FIG. 5F illustrates the doubled edge socket counterpart 503 attached to the double edge socket 502. In an embodiment, the array of I/O connections 514 are electrically coupled to the array of pads 524. Accordingly, the array of pads 524 may be electrically coupled to the array of wire connections 520. The memory device 205 may therefore be electrically coupled to the configurable CPU package substrate 200.

In embodiments, the static friction between the array of pads 524 and the array of I/O connections 514 may hold the memory device 205 in place. Accordingly, a force with a magnitude greater than the static frictional force may thereby remove the memory device 205 from the double edge socket 502 of the configurable CPU package substrate 200. A new double edge socket counterpart 503 with a new memory device 205 may then replace the old counterpart 503 and attach to the double edge socket 502. In embodiments, a separate tool is not required to remove the memory device 205 from the double edge socket 502.

1.1.2.2 Full Edge Pin Grid Array Socket

Figure 6A:
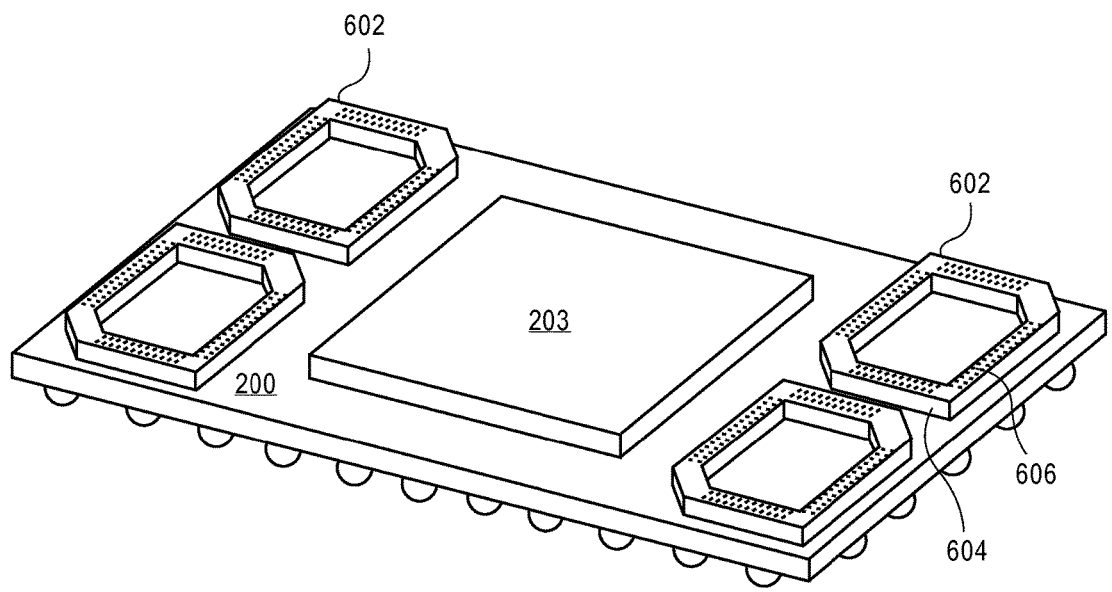
FIG. 6A illustrates a package with a full edge pin grid array socket on a configurable CPU package substrate, in accordance with an embodiment of the invention.

FIG. 6A illustrates a package with a full edge pin grid array socket 602 on a configurable CPU package substrate 200 according to an embodiment of the invention. The full edge pin grid array socket 602 enables a memory device to be removable from the configurable CPU package substrate 200. In an embodiment, the socket structure body 604 has a frame-like profile that is disposed on the configurable CPU package substrate 200. A memory device electrical interface (not shown) may be disposed on the configurable CPU package substrate 200 below the frame-like structure body 604. The memory device electrical interface may be electrically coupled to the socket 602.

Figure 6B:
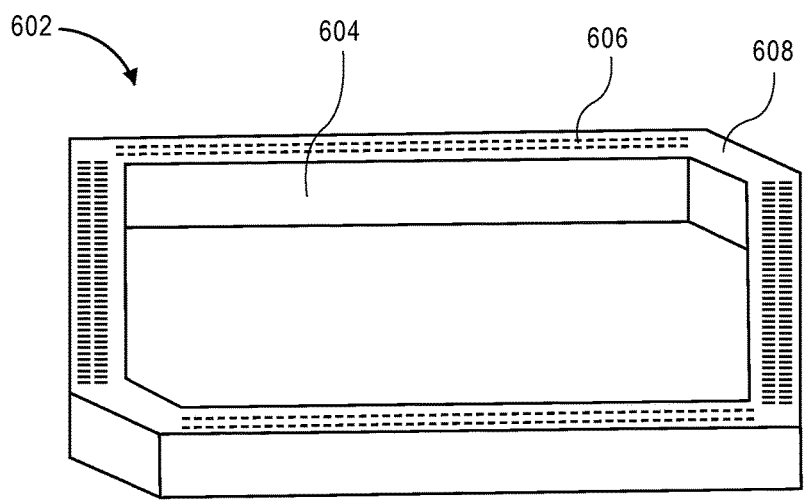
FIG. 6B illustrates a full edge pin grid array socket, according to an embodiment of the invention.

A more detailed view of the full edge pin grid array socket 602 is illustrated in FIG. 6B. As shown, the full edge pin grid array socket 602 includes a socket structure body 604 with a plurality of openings 606. The plurality of openings 606 may be arranged along the frame-like profile. The openings 606 may correspond with connecting pins from a counterpart system as will be discussed further herein. In an embodiment, the openings 606 are disposed on a top surface 608 of the frame-like structure body 604. That is, the plurality of openings 606 may extend into the socket structure body 604 from the top surface 608 of the socket 602. Accordingly, openings 606 may allow pins to insert into the full edge pin grid array socket 602 to make electrical connection with the configurable CPU package substrate 200.

FIGS. 6C-6E illustrate exemplary portions of a counterpart system that assemble to form a full edge pin grid array socket counterpart. Specifically, FIG. 6C illustrates a top perspective view of a device portion 603, and FIGS. 6D-6E illustrate top and bottom perspective views of an interconnection portion 607, respectively. In embodiments, one device portion 603 and two interconnection portions 607 assemble to form a full edge pin grid array socket counterpart, as will be discussed further herein with respect to FIGS. 6F-6G.

With reference to FIG. 6C, the device portion 603 includes a memory device 205 mounted on a memory device substrate 640. Similar to the double edge socket counterpart 503 configuration already disclosed herein, the memory device substrate 640 of the device portion 603 may have edges 605A-605D arranged at a separation angle 613 from one another. However, instead of having only one connection interface (522 in FIG. 5D), the memory device substrate 640 may have two connection interfaces 622A and 622B. Each connection interface 622 may span across two adjacent edges, thus forming an L-shaped connection profile. For instance, first connection interface 622A may span across edges 605A and 605B, and second connection interface 622B may span across edges 605C and 605D.

The connection interfaces 622A and 622B may each include an array of pads 624 that extend to the edge of the memory device substrate 640. A mirrored array of pads (not shown) may also be disposed on the underside of the memory device substrate 640. The array of pads 624 may have a contact pitch that maximizes the number of pads while maintaining sufficient surface area to form robust electrical connections. For instance, the array of pads 624 may have a contact pitch of approximately 0.4 mm, thus forming a connection interface 622 containing approximately 160 pads. Given that there are two connection interfaces 622A and 622B, the memory package 640 may thus have a total of approximately 320 pads.

Again, similar to the double edge socket counterpart 503, each pad of the array of pads 624 on the memory device substrate 640 of the device portion 603 is aligned with an insertion direction 615. The insertion direction 615 may be the direction at which the interconnection portions 607 assemble with the device portion 603 to prevent shorting between each pad of the array of pads 624. The insertion direction 615 may be at an angle 613 that is half of the separation angle 611. Thus, each pad of the array of pads 624 may be aligned at an angle 613 that his half of the separation angle 611.

Beveled edges 618 may be located on corners of the memory device substrate 640 where ends of the connection interfaces 622A and 622B are located. Additionally, the beveled edges 618 may be oriented along the insertion direction 615. Accordingly, in an embodiment, the beveled edges 618 are parallel to the pads 624. The beveled edges 618 assist in assembling the interconnection portions 607 with the device portion 603, as will be discussed herein with respect to FIGS. 6F-6G.

With reference now to FIG. 6D, the interconnection portion 607 is shown having a first portion 606 and a second portion 608. Similar to the double edge socket 502, the first and second portions 606/608 of the interconnection portion 607 are arranged in an L-shaped profile, where the portions are at an offset angle 612 from one another. The interconnection portion 607 includes an opening 604 that extends across both portions 606 and 608. An array of I/O connections 614 may be disposed within the opening 604 and be arranged along the insertion direction 615. Accordingly, the array of I/O connections 614 may be aligned in the same direction as the array of pads 624. In embodiments, the array of I/O connections 614 is an array of pads or cantilever pins. The I/O connections 614 may be coupled to an array of connecting pins 620 disposed below the interconnection portion 607 as illustrated in FIG. 6E. The connecting pins 620 may be vertical in shape for inserting into the openings 606 of the socket structure body 604. The interconnection portion 607 may assemble with the device portion 603 to form a full edge pin grid array socket counterpart 621 discussed further herein with respect to FIGS. 6F-6G.

Figures 6F, 6G:
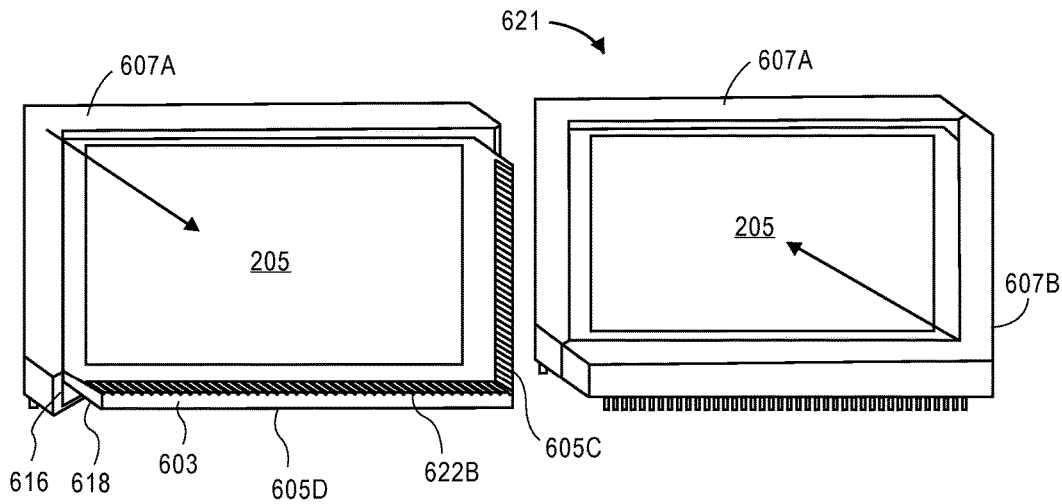
FIGS. 6F-6G illustrate a method of forming a full edge pin grid array socket counterpart, in accordance with an embodiment of the invention.

FIGS. 6F-6G illustrate forming a full edge pin grid array socket counterpart 621. In an embodiment, two interconnection portions 607A and 607B assemble with a device portion 603 to form the full edge pin grid array socket counterpart 621. As illustrated in FIG. 6F, first interconnection portion 607A is assembled to the device portion 603. In an embodiment, the first interconnection portion 607A is inserted toward the device portion 603 along an insertion direction 615 to avoid shorting between pads of the array of pads 624. Beveled edges 618 of the memory device substrate 640 may slide along beveled corners 616 of the interconnection portion 607A to help with alignment during assembly. The details of the beveled edges 618 and beveled corners 616 may be referenced in the disclosure with respect to FIG. 5E. Once the first interconnection portion 607A is attached, the first connection interface 622A along edges 605A and 605B may be electrically coupled to the first interconnection portion 607A, while the second connection interface 622B along edges 605C and 605D may be exposed.

In FIG. 6G, second interconnection portion 607B may be attached to the second connection interface 622B, thereby completing assembly of the full edge pin grid array socket counterpart 621. Once attached, the second connection interface 622B may be electrically coupled to the second interconnection portion 607B. Accordingly, first and second connection interfaces 622A and 622B may be electrically coupled to the first and second interconnection portions 607A and 607B. Although embodiments disclose attaching the first interconnection portion 607A before attaching the second interconnection portion 607B, embodiments are not limited to such attachment order. For instance, the first interconnection portion 607A may be attached after the second interconnection portion 607B, or at the same time.

Figure 6H:
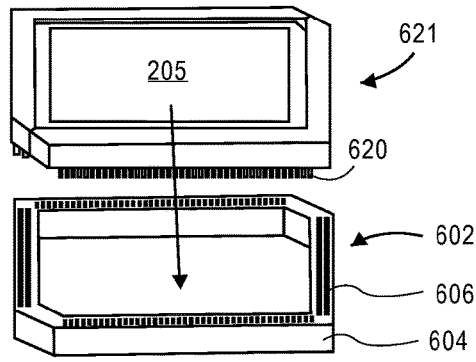
FIGS. 6H-6I illustrate a method of attaching a full edge pin grid array socket counterpart to a full edge pin grid array socket, in accordance with an embodiment of the invention.
Figure 6I:
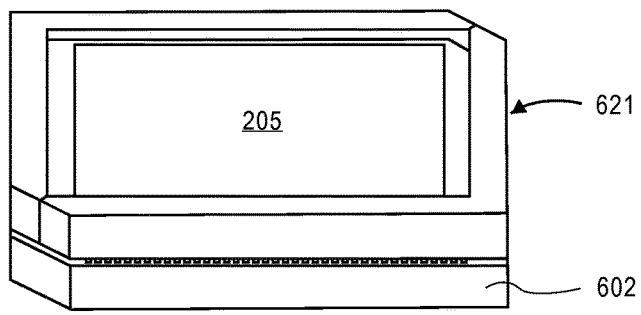

Once the full edge pin grid array socket counterpart 621 is assembled, it may then be attached to the full edge pin grid array socket 602. FIGS. 6H-6I illustrate a method of attaching the full edge pin grid array socket counterpart 621 to the full edge pin grid array socket 602. In FIG. 6H, the counterpart 621 is pressed down onto the socket 602. In embodiments, the connecting pins 620 are pressed toward corresponding openings 606 within the socket structure body 604. When fully pressed down as shown in FIG. 6I, the connecting pins 620 are fully inserted into respective openings 606 to form an electrical connection between the counterpart 621 and the socket 602. Accordingly, the memory device 205 may be electrically coupled to the configurable CPU package substrate 200.

In embodiments, the static friction between the connecting pins 620 and the openings 606 may hold the memory device 205 in place. Accordingly, a force with a magnitude greater than the static frictional force may thereby remove the memory device 205 from the full edge pin grid array socket 602 of the configurable CPU package substrate 200. A new device portion 603 with a new memory device 205 may then replace the old device portion 603 and attach to the full edge pin grid array socket 602. In embodiments, a separate tool is not required to detach and reattach the memory device 205 from the full edge pin grid array socket 602.

1.1.3 Low Insertion Force Socket

According to embodiments of the invention, the removable memory mechanical interface may also be a low insertion force socket. FIG. 7A illustrates a package with a low insertion force socket 702 on a configurable CPU package substrate 200 according to an embodiment of the invention. The low insertion force socket 702 enables a memory device to be removable from the configurable CPU package substrate 200. The low insertion force socket 702 may be electrically coupled to a memory device electrical interface (not shown) disposed on the substrate 200 below the socket 702. In an embodiment, the low insertion force socket 702 includes a housing structure 706 and an array of openings 704 disposed within the housing structure 706. An enlarged view of the array of openings 704 is illustrated in FIG. 7B.

FIG. 7B illustrates an enlarged top perspective view of a portion of the low insertion force socket 702. As shown, each opening of the array of openings 704 includes an interconnection region 705 and a pin deflection region 707. The interconnection region 705 is a region of the opening 704 within which a solder ball may insert to form an electrical connection, as will be discussed further herein. Extending from the interconnection region 705 is the pin deflection region 707. In an embodiment, the pin deflection region 707 extends radially away from the center of the interconnection region 705. The pin deflection region 707 allows a contact pin 708 to traverse within it.

In embodiments, each opening of the array of openings 704 may contain a contact pin 708. The contact pin 708 may couple to an interconnection structure of a low insertion force socket counterpart, as will be discussed herein. The structural profile of the contact pin 708 is illustrated in FIG. 7C.

FIG. 7C illustrates a cross-sectional view of the contact pin 708 along line A-A' in FIG. 7B. In embodiments, the contact pin 708 has a curved contacting end 710 and an extending portion 712. The curved contacting end 710 may make contact with a corresponding interconnection structure to form an electrical connection. The extending portion 712 may apply force to maintain contact between the curved contacting end 710 and the corresponding interconnection structure. A solder connection 714 may be disposed on a base end 713 of the contact pin. The base end 713 may be part of the contacting pin 708 disposed on the end opposite of the curved contacting end 710. The solder connection 714 may make electrical connection with the memory device electrical interface on the configurable CPU package substrate 200.

Figure 7D:
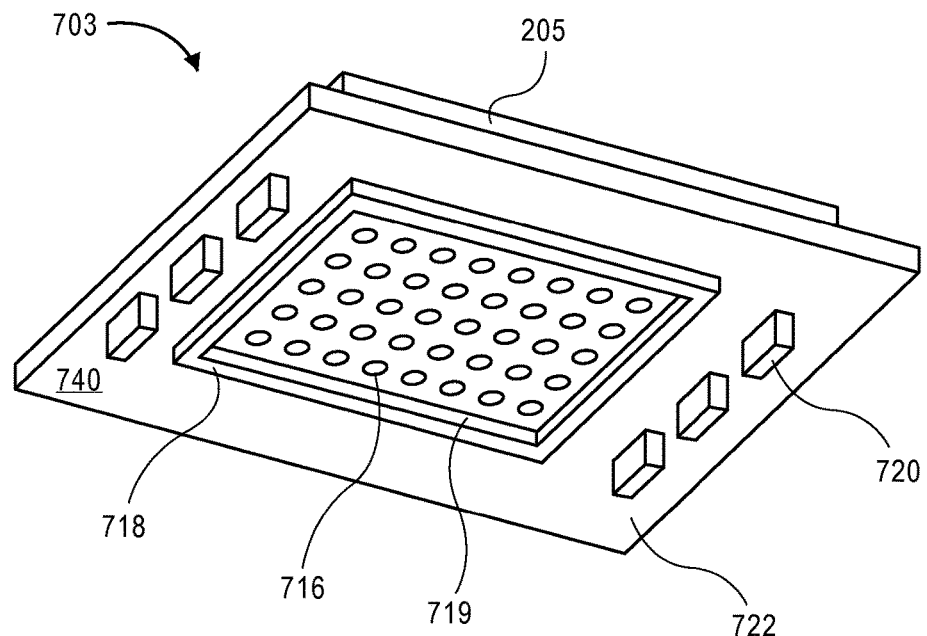
FIG. 7D illustrates a bottom perspective view of a low insertion force socket counterpart, in accordance with an embodiment of the invention.

With reference now to FIG. 7D, a bottom perspective view of a low insertion force socket counterpart 703 is illustrated according to an embodiment of the invention. The low insertion force socket counterpart 703 includes a memory device 205 mounted on the top side (not shown) of a memory device substrate 740. An array of electrical components 720, such as land side capacitors, may be disposed on the bottom surface 722 of the memory device substrate 740. The electrical components 720 may be electrically coupled to the memory device 205 through interconnections in the memory device substrate 740. Additionally, an array of interconnection structures 716 may be disposed on the bottom surface 722 of the memory device substrate 740. The array of interconnection structures 716 may couple to the connection pins 708 of the low insertion force socket 702 as will be discussed further herein. In an embodiment, an alignment frame 718 may be disposed around the array of interconnection structures 716. The alignment frame 718 may assist in aligning the interconnection structure 716 to their respective openings 704 within the socket 702.

Figure 7E:
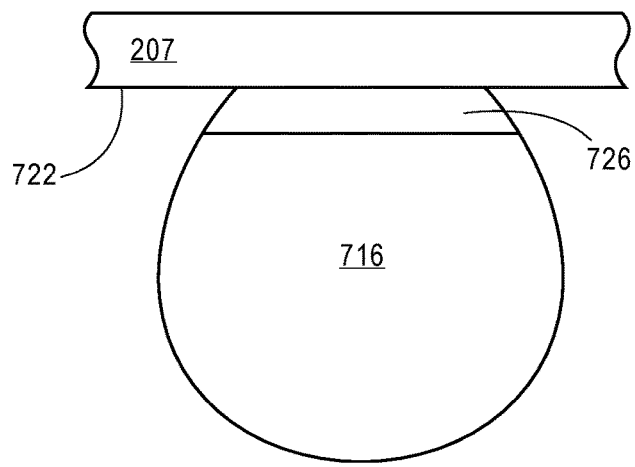
FIG. 7E illustrates a cross-sectional view of an interconnection structure of a low insertion force socket counterpart, in accordance with an embodiment of the invention.

FIG. 7E illustrates a close-up view of an interconnection structure 716. The interconnection structure 716 may be disposed on a pad 726. The pad 726 may be disposed on the bottom surface 722 of the memory device substrate 740. In an embodiment, the interconnection structure 716 is a conductive structure, such as a solid copper ball or a solder ball. The conductive structure may be coated with a conductive material. The conductive material may prevent corrosion of the underlying conductive structure, while maintaining sufficient conductivity to form an electrical connection. In embodiments, the conductive material contains nickel (Ni), palladium (Pd), and/or gold (Au). In an embodiment, the conductive material is NiPdAu. Accordingly, the interconnection structure 716 may be formed of a solder ball coated with a thin layer of NiPdAu.

Figure 7F:
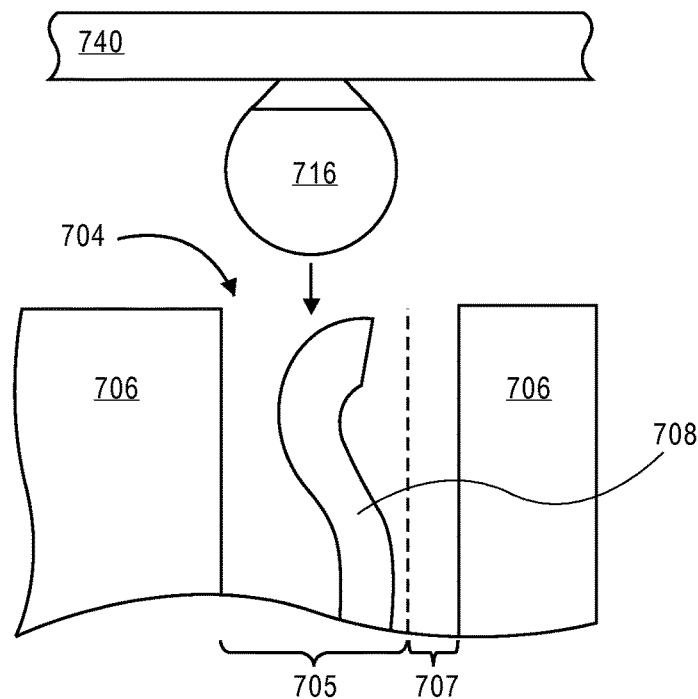
FIGS. 7F-7H illustrate a method of attaching a low insertion force socket counterpart to a low insertion force socket, in accordance with an embodiment of the invention.
Figure 7G:
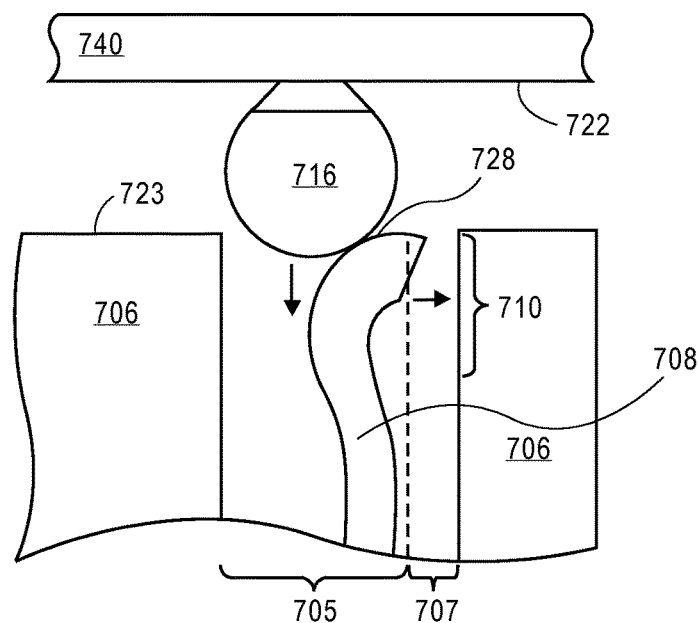
Figure 7H:
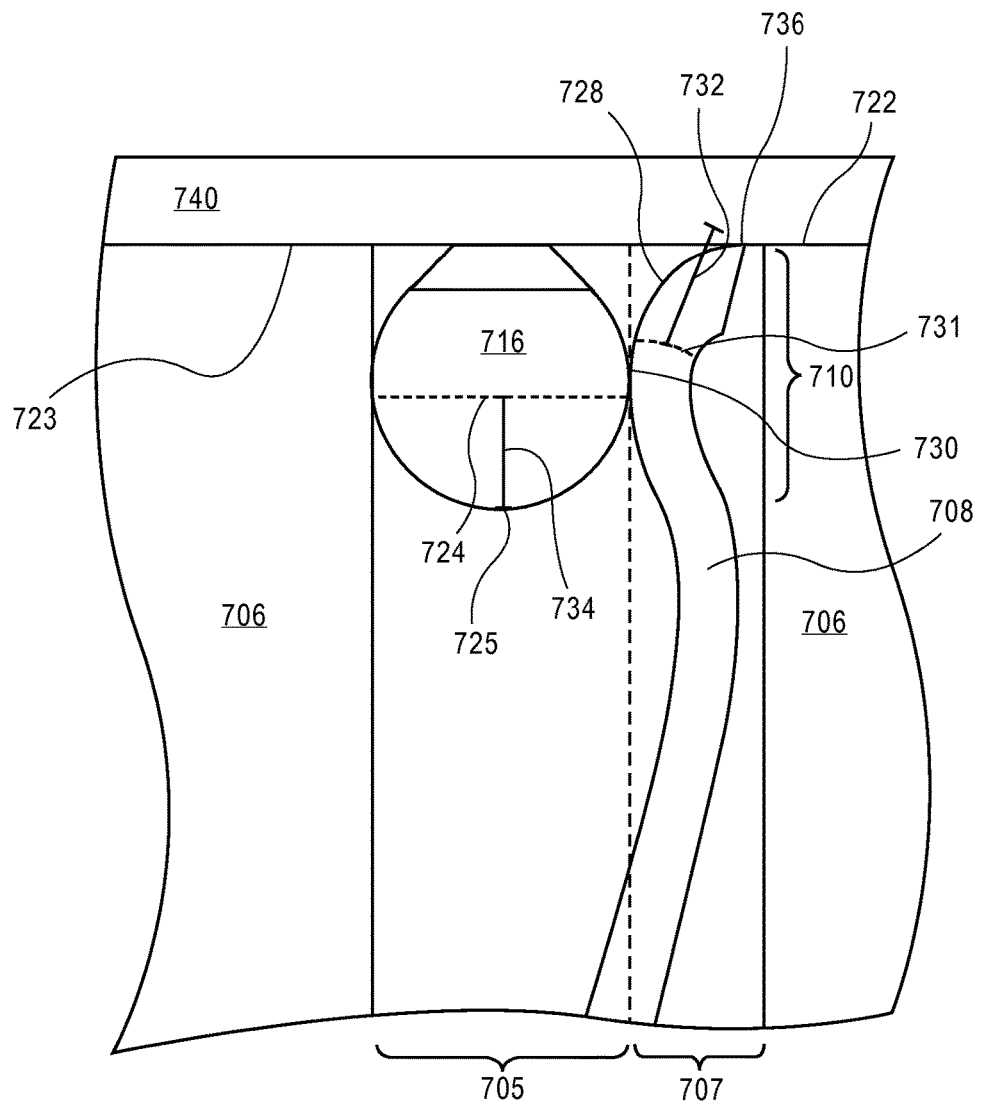

An exemplary method of attaching the memory device 205 to the removable memory mechanical interface is illustrated in FIGS. 7F-7H. Specifically, FIGS. 7F-7H illustrate a method of attaching an interconnection structure 716 of the low insertion force socket counterpart 703 to a connecting pin 708 of the low insertion force socket 702. The cross-sectional illustration of FIGS. 7F-7H are taken along line A-A' as shown in FIG. 7B, but during attachment of the counterpart 703 to the socket 702.

In FIG. 7F, the interconnection structure 716, along with the counterpart 703, is pushed toward the opening 704 of the socket 702. In an embodiment, the interconnection structure 716 is inserted toward the interconnection region 705 of the opening 704. To align the interconnection structure 716 with the interconnection region 705, the inner edges 719 of the alignment frame 718 (see FIG. 7D) may slide against the outer edges 721 of the housing structure 706 (see FIG. 7A). Once the interconnection structure 716 makes contact with the connection pin 708 as illustrated in FIG. 7G, the interconnection structure 716 slides against the curved surface 728 of the curved contacting end 710 of the connection pin 708. As the interconnection structure 716 is pressed further into the opening 704, the connection pin 708 may be deflected into the pin deflection region 707 of the opening 704. In embodiments, the curved surface 728 causes the pin to deflect laterally into the pin deflection region 707. The interconnection structure 716 may continue inserting into the opening 704 until the bottom surface 722 of the memory device substrate 740 contacts a top surface 723 of the housing structure 706, as shown in FIG. 7H.

FIG. 7H illustrates the low insertion force socket counterpart 703 attached to the low insertion force socket 702, according to an embodiment of the invention. When attached, the connection pin 708 contacts with the interconnection structure 716. In an embodiment, the curved surface 728 of the curved contacting end 710 contacts the interconnection structure 716 at a contact point 730. The contact point 730 may be above the equator 724 of the interconnection structure 716. In an embodiment, the contact point 730 is greater than 1 um above the equator 724. Contacting the pin 708 to the interconnection structure 716 at the contact point 730 depends on the location of the respective equators. For instance, a distance 732 from the tip 736 to the equator 731 of the curved contacting end 710 may be less than a distance 734 from the tip 725 to the equator 724 of the interconnection structure 716. When the contact point 730 is above the equator 724, the connecting pin 708 generates a lateral force as well as a slight downward force. The downward force draws the interconnection structure 716 downward. Accordingly, the low insertion force socket counterpart 703 is drawn toward the socket 702 and may stay attached thereon.

In embodiments, the downward force generated by the connecting pin 708 may hold the memory device 205 in place. Accordingly, a force with a magnitude greater than the downward force may thereby remove the memory device 205 from the low insertion force socket 702 of the configurable CPU package substrate 200. A new low insertion force socket counterpart 703 with a new memory device 205 may then replace the old low insertion force socket counterpart 703 and attach to the low insertion force socket 702. In embodiments, a separate tool is not required to remove the memory device 205 from the low insertion force socket 702.

1.1.3.1 Flexible Cable Variant of the Low Insertion Force Socket Counterpart

According to embodiments of the invention, the low insertion force socket 702 and counterpart 703 may have variant designs. For instance, the low insertion force socket counterpart 703 may include a flex cable to form a flex cable counterpart 803, as depicted in the embodiment illustrated in FIG. 8B of FIGS. 8A-8D. Incorporating the flex cable with the socket counterpart 703 allows the memory device 205 or memory device substrate 840 to be directly attached to a heat sink, as will be disclosed herein. Although embodiments illustrate the variant designs utilizing low insertion force sockets 702, one skilled in the art understands that any other type of removable memory mechanical interface mentioned herein may be used instead. Embodiments merely illustrate these variant designs with the low insertion force socket 702 for ease of explanation.

Figure 8A:
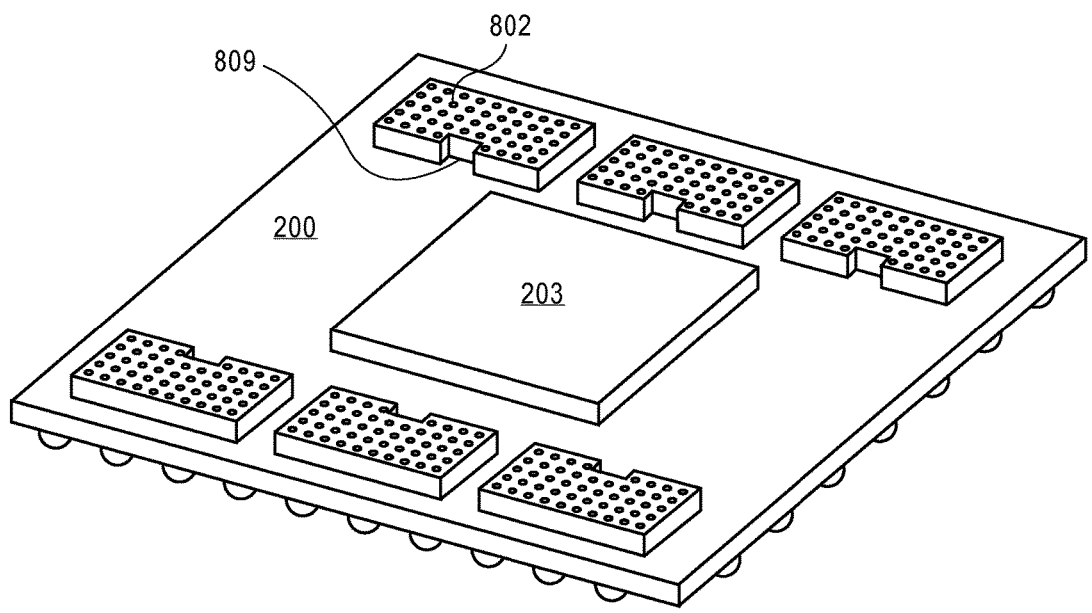
FIG. 8A illustrates a top perspective view of a package with a low insertion force socket on a configurable CPU package substrate for a flex cable counterpart, in accordance with an embodiment of the invention.

With reference now to FIG. 8A, a low insertion force socket 802 disposed on a configurable CPU package substrate 200 is illustrated according to an embodiment of the invention. The low insertion force socket 802 enables a memory device to be removable from the configurable CPU package substrate 200. The low insertion force socket 802 may be electrically coupled to a memory device electrical interface (not shown) disposed on the substrate 200 below the socket 802. In an embodiment, the low insertion force socket 802 includes an orientation notch 809 to help achieve correct orientation when a memory device is attached. The details pertaining to the structure of the low insertion force socket 802 may be referenced in the disclosures herein regarding the low insertion force socket 702 in FIGS. 7A-7C.

Figure 8B:
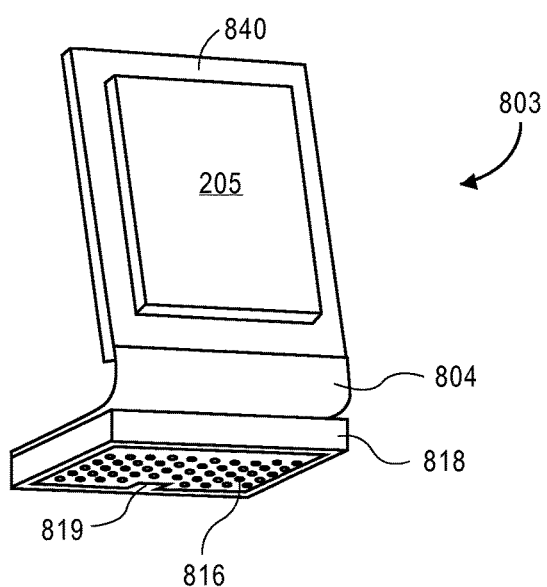
FIG. 8B illustrates a perspective view of a flex cable counterpart, in accordance with an embodiment of the invention.
Figure 8C:
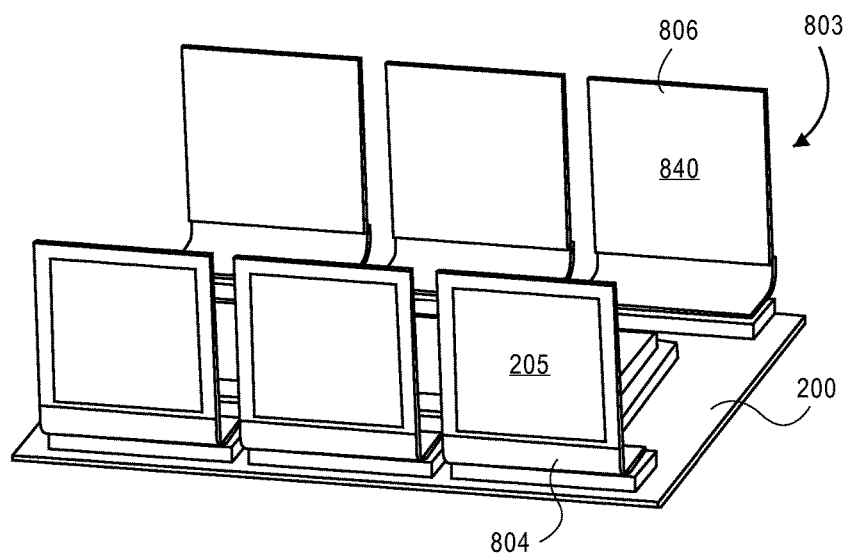
FIG. 8C illustrates a top perspective view of a package with a flex cable counterpart attached to a low insertion force socket, according to an embodiment of the invention.

FIG. 8B illustrates a flex cable counterpart 803 according to an embodiment of the invention. The flex cable counterpart 803 includes a memory device 205 mounted on a memory device substrate 840. Additionally, the flex cable counterpart 803 includes an alignment frame 818 surrounding an array of interconnection structures 816 (e.g., solid copper balls or solder balls with NiPdAu coatings) for aligning the counterpart 803 with the socket 802. In an embodiment, the alignment frame 818 has an orientation tab 819 that assures correct orientation of the flex cable counterpart 803 during attachment. The orientation tab 819 may fit within the orientation notch 809 on the low insertion force socket 802 to ensure that the pins within the socket 802 are correctly coupled to the respective interconnection structures 816. According to an embodiment of the invention, the memory device substrate 840 may be coupled to the interconnection structures 816 via a strip of flex cable 804. The flex cable 804 may be attached to the memory device substrate 840 via well known methods. For instance, the flex cable 804 may be soldered to pads (not shown) disposed on the memory device substrate 840. As is well known, flex cables are capable of physical and electrically coupling two structures together while allowing for a generous range of motion. In the present case, the flex cable 804 allows the memory device 205 to be placed in locations away from the configurable CPU package substrate 200 as illustrated in FIG. 8C. Additionally, the memory device 205 may be electrically coupled to the interconnection structures 816.

FIG. 8C illustrates the flex cable counterparts 803 mated with low insertion force sockets 802. Due to the bendability of flex cables 804, the memory devices 205 may be oriented in a wide range of positions. For example, the memory device 205 may be oriented perpendicular to the configurable substrate 200 as shown in FIG. 8C. Allowing the memory devices 205 and memory device substrate 840 to be oriented perpendicular to the configurable substrate 200 enables the memory devices 205 to attach to a heat sink 820 as illustrated in FIG. 8D.

Figure 8D:
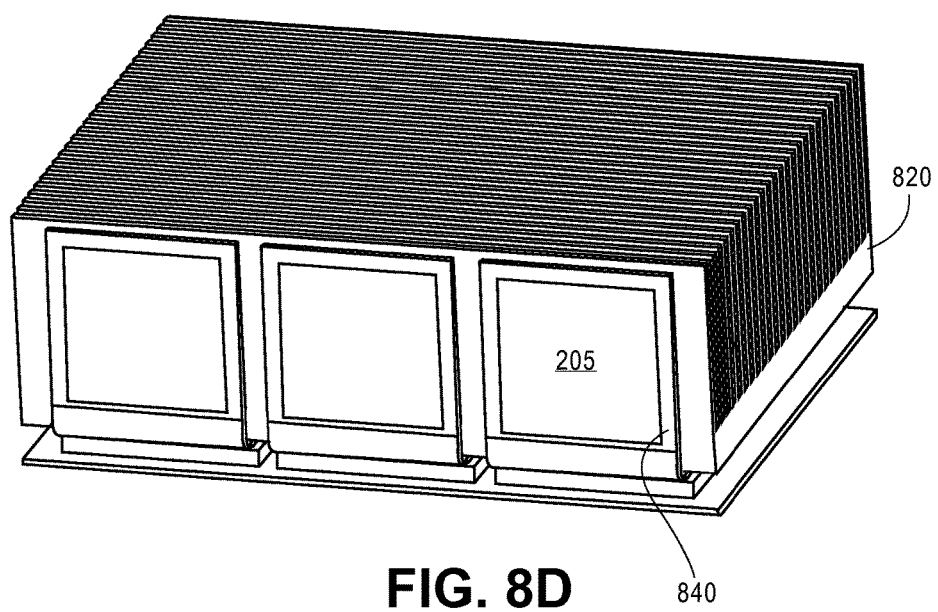
FIG. 8D illustrates a top perspective view of a flex cable counterpart attached to a heat sink, in accordance with an embodiment of the invention.

In FIG. 8D, the memory device substrates 840 are attached to the heat sink 820. Memory device substrates 840 may be attached to the heat sink 820 with any mechanical fastener for easy removal. For instance, the memory device substrates 840 may be clipped to the heat sink 820. Attaching memory device substrates 840 directly to the heat sink 820 allows better heat dissipation, thereby increasing performance of the memory devices 205. Although the embodiment depicted in FIG. 8D illustrates the memory device substrate 840 attached to the heat sink 820, arrangements where the memory device 205 is attached to the heat sink 820 are envisioned in embodiments of the present invention. For instance, the memory device 205 and substrate 840 may be flipped during manufacturing of the flex cable counterparts 803 so that the memory devices 205 face inward and contact the heat sink 820.

In embodiments, the memory device 205 is held in place by the low insertion force socket 802 as well as the mechanical fastener that attaches the memory device 205 to the heat sink 820. Accordingly, unclipping the mechanical fastener, removing the heat sink 820, and pulling the flex cable counterpart 803 away from the socket 802 with a force greater than the downward force generated by the pins within the socket 802 may thereby remove the memory device 205 from the configurable CPU package substrate 200. A new flex cable counterpart 803 with a new memory device 205 may then replace the old flex cable counterpart 803 and attach to the low insertion force sockets 802 of the configurable CPU package substrate 200.

1.1.3.2 Flexible Cable Variant of the Low Insertion Force Socket

Figure 9A:
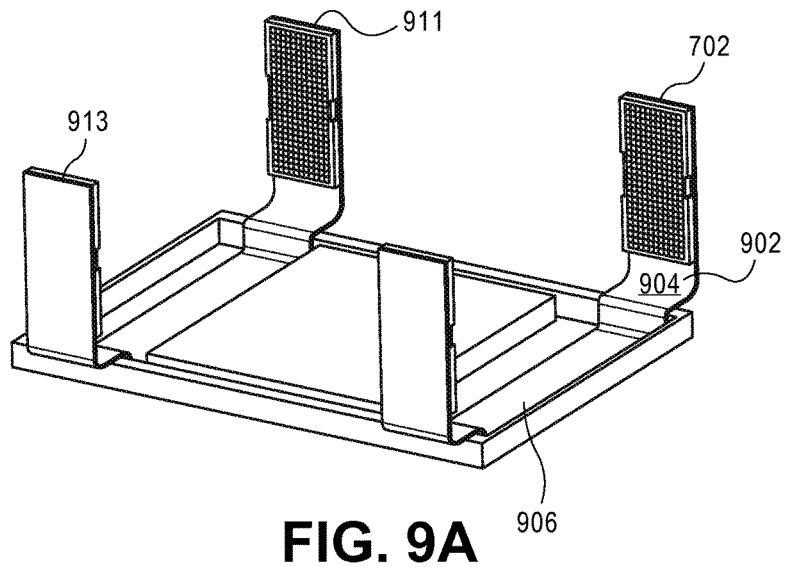
FIG. 9A illustrates a top perspective view of a package with a flex cable socket, in accordance with an embodiment of the invention.

In another example, the low insertion force socket 702 may include a flex cable to form a flex cable socket 902, as depicted in the embodiment illustrated in FIG. 9A of FIGS. 9A-9G. Similar to the socket counterpart 703, incorporating a flex cable with the socket 702 allows the memory device 205 or memory device substrate 940 to be attached to a heat sink. Although embodiments illustrated herein utilize low insertion force sockets 702, one skilled in the art understands that any other type of removable memory mechanical interface mentioned herein may be used instead. Embodiments merely illustrate these embodiments with the low insertion force socket 702 for ease of explanation.

Figure 9B:
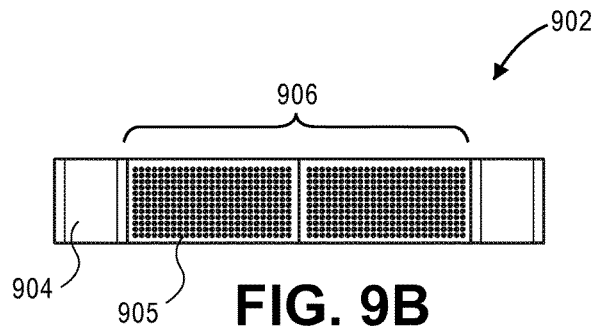
FIG. 9B illustrates a bottom view of a flex cable socket, in accordance with an embodiment of the invention.

In FIG. 9A, a flex cable socket 902 is disposed on a configurable CPU package substrate 200 according to an embodiment of the invention. The flex cable socket 902 may include a strip of flex cable 904 having two opposing ends 911 and 913. A low insertion force socket 702 may be disposed at each opposing end 911/913. The flex cable 904 may have a connection portion 906 disposed between the opposing ends 911 and 913. The connecting portion 906 may be directly coupled to a memory device electrical interface (not shown) disposed on the substrate 200 below the connecting portion 906 of the flex cable 904. In an embodiment, the connecting portion 906 has an array of interconnects 905 disposed on the bottom of the connecting portion 906, as illustrated in FIG. 9B. The interconnects 905 may electrically couple the flex cable socket 902 to the configurable CPU package substrate 200. In an embodiment, the interconnects 905 are solder balls. To make an electrical connection, the solder balls may be reflowed onto the memory device electrical interface of the substrate 200. In such an embodiment, the memory device electrical interface may be an array of pads that connect to the interconnects 905.

Given the flexible nature of the flex cable 904, the flex cable socket 902 may be arranged in a wide range of positions. For instance, the low insertion force socket 702 of the flex cable socket 902 may be arranged vertically above the configurable CPU package substrate 200. Accordingly, the flex cable socket 902 may allow a memory device 205 to be attached to a heat sink, as will be discussed further herein.

Figures 9C, 9D:
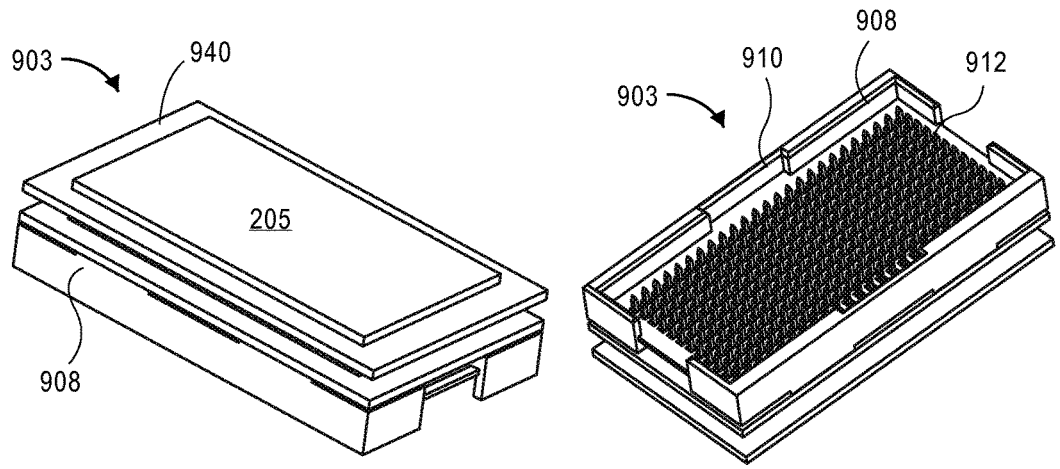
FIGS. 9C-9D illustrate top and bottom perspective views of a low insertion force counterpart for a flex cable socket, in accordance with an embodiment of the invention.

A low insertion force socket counterpart 903 is illustrated in FIGS. 9C-9D. Specifically, FIG. 9C illustrates a top perspective view of the low insertion force socket counterpart 903, while FIG. 9D illustrates a bottom perspective view of the low insertion force socket counterpart 903. As illustrated in FIG. 9C, the low insertion force socket counterpart 903 may be substantially similar to the low insertion force socket counterpart discussed herein with respect to FIG. 7D. In an embodiment, the counterpart 903 may include more than one memory device 205 and memory device substrate 940 as illustrated in FIG. 9C. The memory devices 205 may be stacked onto one another by any suitable stacking method. An alignment frame 908 may be disposed on the bottom of the bottommost memory device substrate 940, which is better illustrated in FIG. 9D. Although FIG. 9C illustrates one embodiment of a counterpart having stacked memory devices 205, it is to be appreciated that any counterpart disclosed herein may have stacked memory devices as well.

With reference to FIG. 9D, the low insertion force socket counterpart 903 may include an array of interconnecting structures 912. The array of interconnecting structures 912 may be any suitable conductive structure for forming electrical connections. For instance, the array of interconnect structures 912 is an array of solid copper balls. In the particular embodiment in FIG. 9D, the array of interconnecting structures 912 is an array of pins. The low insertion force socket counterpart 903 may attach to the flex cable socket 902 as already discussed herein with respect to FIGS. 7F-7H. Accordingly, the array of pins may have rounded tips with dimensions similar to that of the interconnection structure 716.

Given the flexible nature of the flex cable 904, the flex cable socket 902 may be arranged in a wide range of positions. For instance, the flex cable socket 902 may be arranged such that the low insertion force socket 702 is vertically positioned and disposed above the configurable CPU package substrate 200 as illustrated in FIG. 9E.

Figure 9E:
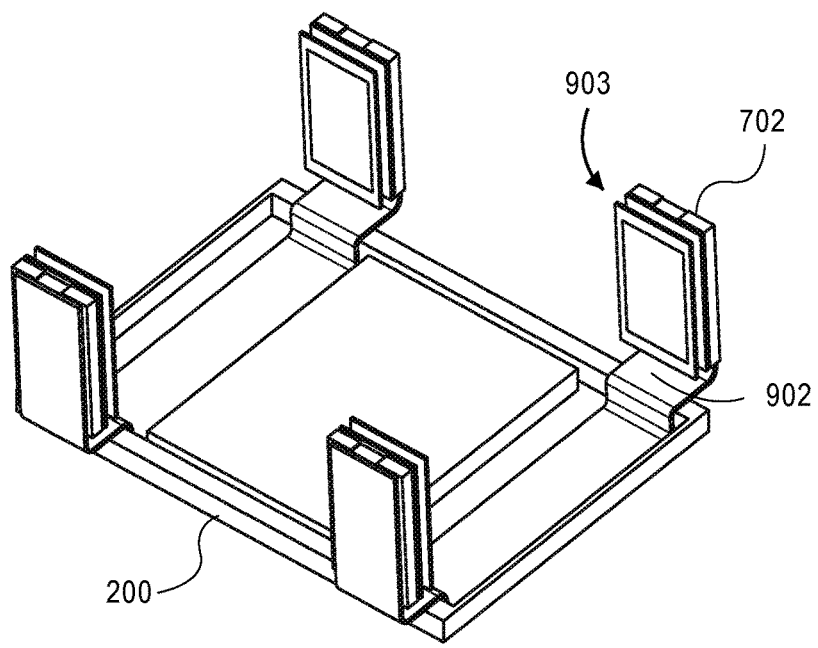
FIG. 9E illustrates a top perspective view of a package with a low insertion force socket counterpart attached to a flex cable socket, according to an embodiment of the invention.

FIG. 9E illustrates low insertion force socket counterparts 903 mated to the flex cable sockets 902. In a particular embodiment, the counterparts 903 may be mated to the low insertion force sockets 702 of the flex cable sockets 902. Once mated, the counterparts 903 may be vertically positioned and disposed above the configurable CPU package substrate 200. Accordingly, the counterparts 903 may be attached to a heat sink 920 as illustrated in FIG. 9F.

Figure 9F:
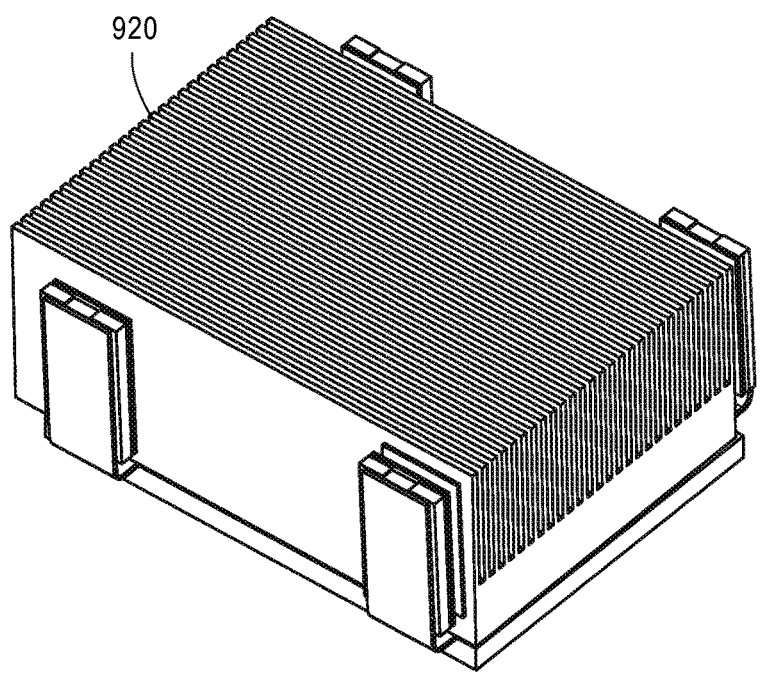
FIG. 9F illustrates a top perspective view of a low insertion force socket counterpart attached to a flex cable socket and a heat sink, in accordance with an embodiment of the invention.

In FIG. 9F, the low insertion force counterpart 903 are attached to a heat sink 920. In an embodiment, the memory devices 205 of counterparts 903 are attached to the heat sink 820. Memory devices 205 may be attached to the heat sink 920 with any mechanical fastener (not shown) for easy removal. For instance, the memory devices 205 may be clipped to the heat sink 920. Attaching memory devices 205 directly to the heat sink 820 allows better heat dissipation, thereby increasing performance of the memory devices 205.

In embodiments, the memory device 205 is held in place by the flex cable sockets 902 as well as the mechanical fastener that attaches the memory device 205 to the heat sink 920. Accordingly, unclipping the mechanical fastener and pulling the low insertion force counterpart 903 away from the low insertion force socket 702 with a force greater than the downward force generated by the pins within the socket 702 may thereby remove the memory device 205 from the flex cable socket 902 of the configurable CPU package substrate 200. A new low insertion force counterpart 903 with a new memory device 205 may then replace the old low insertion force counterpart 903 and be attached to the flex cable socket 902.

1.1.4 "Zero" Insertion Force Socket

Figure 10A:
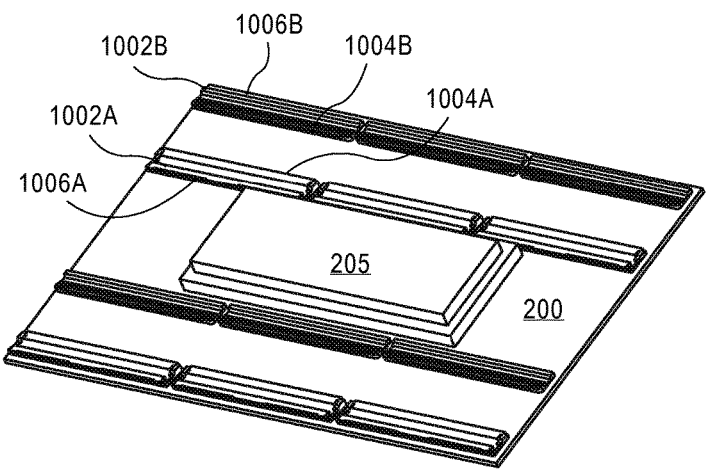
FIG. 10A illustrates a top perspective view of a package with a zero insertion force socket on a configurable CPU package substrate, in accordance with an embodiment of the invention.

According to embodiments of the invention, the removable memory mechanical interface may also be a "zero" insertion force socket. The zero insertion force socket has very slight if any resistance against insertion of a counterpart which slides horizontally into the removable memory mechanical interface as will be discussed further herein. FIG. 10A illustrates a package with a zero insertion force socket 1002 on a configurable CPU package substrate 200 according to an embodiment of the invention. Specifically, FIG. 10A illustrates a package with six zero insertion force sockets 1002, three on each side of a memory device 205 arranged side-by-side, although embodiments are not so limited to such configurations. Further, in an embodiment, each zero insertion force socket 1002 is formed of a pair of sockets 1002A and 1002B. Thus, to couple a zero insertion force socket counterpart to the socket 1002, the counterpart connects to both sockets 1002A and 1002B, as will be discussed further herein.

In an embodiment, each socket 1002A and 1002B of the zero insertion force socket 1002 includes a housing structure 1006A/1006B and an opening 1004A/1004B disposed within the respective housing structure 1006A/1006B. The zero insertion force socket 1002 enables a memory device (not shown) to be removable from the configurable CPU package substrate 200. The zero insertion force socket 1002 may be electrically coupled to a memory device electrical interface (not shown) disposed on the substrate 200 below the socket 1002. A detailed view of the zero insertion force socket 1002B is illustrated in FIG. 10B.

FIG. 10B illustrates an enlarged bottom perspective view of the zero insertion force socket 1002B. Although the following description regards socket 1002B, the description may also apply to the socket 1002A, as socket 1002A may be identical to, or an identical mirror image of, socket 1002B.

In embodiments, the housing structure 1006B includes an opening 1004B. The opening 1004B may be disposed on a side of the housing structure 1006B such that an interconnection structure may insert laterally into the housing structure 1006B. In an embodiment, the opening 1004B is a single, elongated opening that spans across a portion, if not a majority, of the length 1009 of the socket 1002B. Alternatively, the opening 1004B may be a plurality of openings disposed across at least a portion of the length 1009. A plurality of contacts 1012 may be disposed within the opening 1004B. Each contact 1012 may be disposed on the top- and bottom-inner wall of the opening 1004B so that each contact 1012 may couple to at least two sides of an interconnection structure. In an embodiment, an array of connectors 1010 are disposed on a side of the housing structure 1006B opposite of the opening 1004. The array of connectors 1010 may couple the socket 1002B to the configurable CPU package substrate 200. Specifically, the array of connectors 1010 may couple the plurality of contacts 1012 to the memory device electrical interface (not shown) of the configurable CPU package substrate 200.

With reference now to FIG. 10C, a top perspective view of the zero insertion force socket 1002B is illustrated. In an embodiment, the socket 1002B includes a locking lever 1008B. The locking lever 1008B may be in a locked position or an unlocked position by pressing the locking lever 1008 down or pulling the locking lever 1008B up, respectively, as will be discussed further herein. In an embodiment, the locking lever 1008B is a simple lever that flips between the locked position and the unlocked position.

Figure 10D:
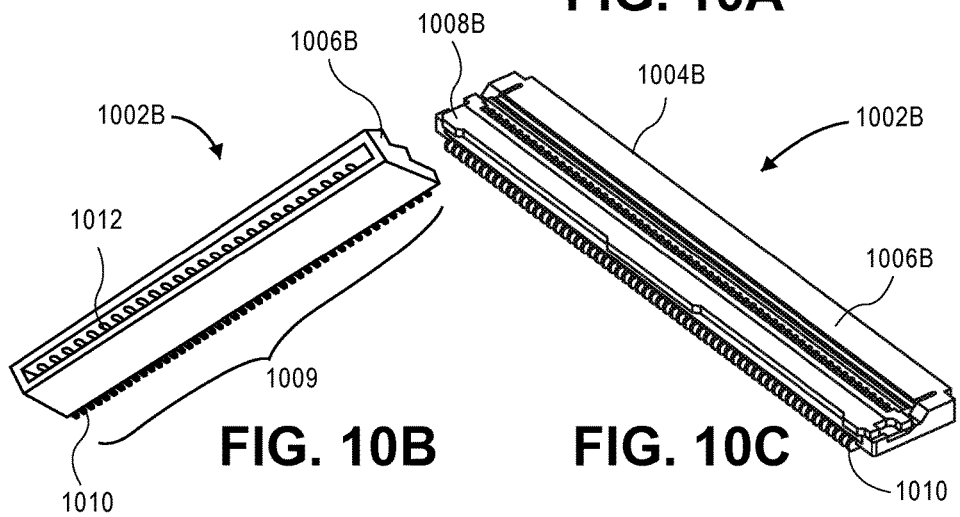
FIG. 10D illustrates a zero insertion force socket counterpart, in accordance with an embodiment of the invention.
Figure 10D:
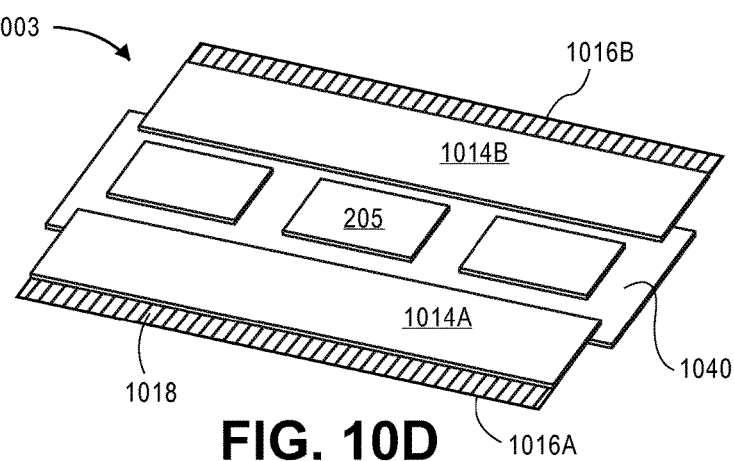

FIG. 10D illustrates a zero insertion force socket counterpart 1003 according to an embodiment of the invention. In embodiments, the zero insertion force socket counterpart 1003 includes a memory device 205 mounted on a memory device substrate 1040. In an embodiment, three memory devices 205 are mounted on the memory device substrate 1040, as illustrated in FIG. 10D. Although FIG. 10D illustrates three memory devices 205 mounted on the memory device substrate 1040, any number of memory devices 205 may be mounted on the memory device substrate 1040.

The zero insertion force socket counterpart 1003 also includes a pair of flex cables 1014A and 1014B. The pair of flex cables 1014A and 1014B may be attached to the memory device substrate 1040 at one end and have a connection structure 1016A and 1016B at the opposite end, respectively. The connection structures 1016A and 1016B may each have an array of interconnects 1018. In an embodiment, the array of interconnects 1018 is an array of pads or a plurality of pins. Flex cables 1014A and 1014B allow the connection structures 1016A and 1016B to insert into the opening 1004 of the zero insertion force sockets 1002 to form an electrical connection, as will be discussed further herein with respect to FIGS. 10E-10G.

Figure 10E:
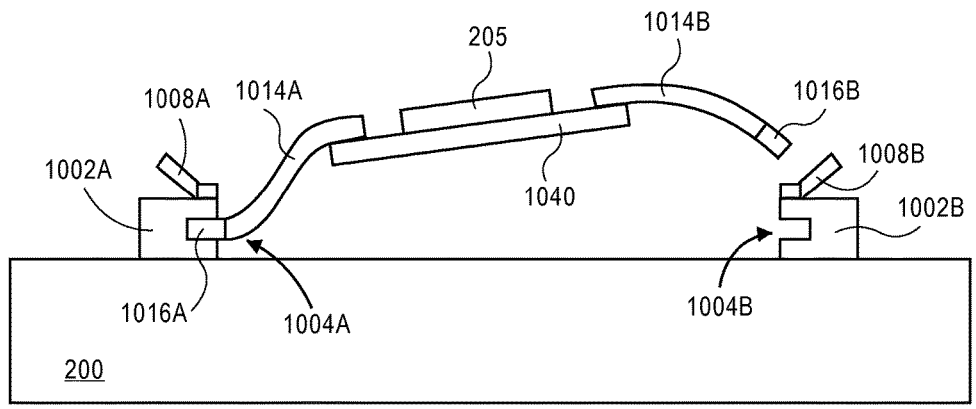
FIGS. 10E-10G illustrate a method of attaching a zero insertion force socket counterpart to a zero insertion force socket, in accordance with an embodiment of the invention.
Figure 10F:
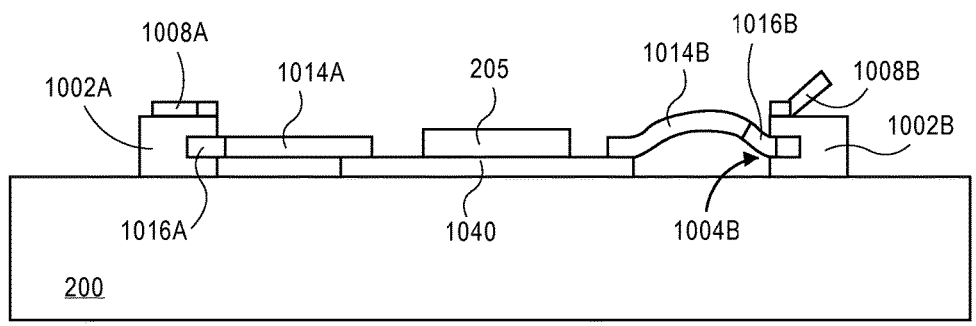
Figure 10G:
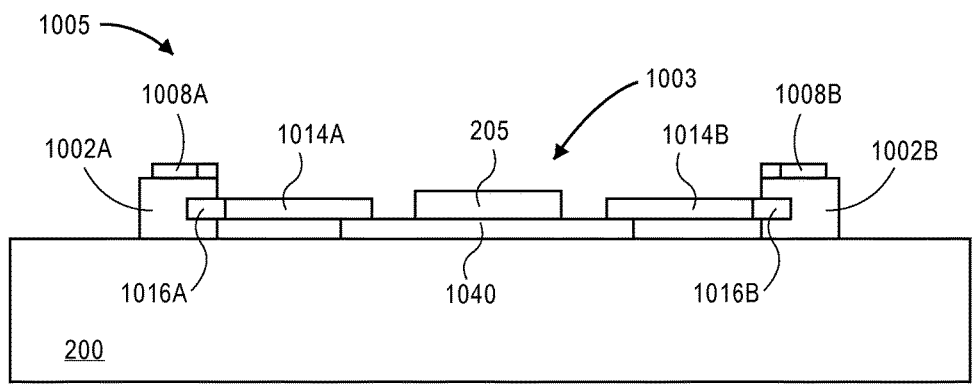

FIGS. 10E-10G illustrate a method of attaching a memory device 205 to a removable memory mechanical interface. Specifically, FIGS. 10E-10G illustrate a method of attaching the zero insertion force socket counterpart 1003 to the zero insertion force socket 1002. Attaching the zero insertion force socket counterpart 1003 to the zero insertion force socket 1002 forms a zero insertion force socket assembly 1005.

To attach the zero insertion force socket counterpart 1003, connection structure 1016A may insert into opening 1004A of the zero insertion force socket 1002A as shown in FIG. 10E. The locking lever 1008A may be in the unlocked position to allow the connection structure 1016A to insert into the opening 1004A. Accordingly, as illustrated in FIG.

10E, the locking lever 1008A may be in the upright position. When the locking lever 1008 is in the unlocked position, an interconnection structure may insert within the opening 1004A without having to overcome any more than slight frictional resistance. Once the connection structure 1016A is in the opening 1004A, the locking lever 1008A may be pressed down into the locked position, as illustrated in FIG. 10F. When the locking lever 1008A is pressed down, the array of contacts (e.g., 1012 in FIG. 10B) disposed within the opening 1004A may in turn press down upon the connection structure 1016A. Specifically, the array of contacts may be pressed down upon respective interconnects (e.g., 1018 in FIG. 10D) on the connection structure 1016A. Accordingly, in an embodiment, an electrical connection is formed between the substrate 200 and the memory device 205 through the socket 1002A and the flex cable 1014A. Pressure applied by the array of contacts may hold the connection structure 1016A in place to prevent disconnection.

As further illustrated in FIG. 10F, after attaching the connection structure 1016A to the socket 1002A, the connection structure 1016B may be attached to the socket 1002B to complete attachment of the counterpart 1003 to the socket 1002. In an embodiment, after attaching the connection structure 1016A to the socket 1002A, the memory device substrate 1040 does not have ample space for lateral movement toward the socket 1002A. Thus, the counterpart 1003 takes advantage of the bendability of the flex cable 1014B. For instance, to insert the connection structure 1016B into the opening 1004B, the flex cable 1014B may be bent as shown in FIG. 10F. Alternatively, instead of bending flex cable 1014B, flex cable 1014A may be bent, or both flex cables 1014A and 1014B may be bent, to insert the connection structure 1016B into the opening 1004B. Once the connection structure 1016B is inserted, the locking lever 1008B may be pressed down into the locked position to complete the attachment as shown in FIG. 10G.

In FIG. 10G, both connection structures 1016A and 1016B are coupled to sockets 1002A and 1002B, respectively. Accordingly, the zero insertion force socket counterpart 1003 is now attached to the zero insertion force socket 1002, which forms a zero insertion force socket assembly 1005. In an embodiment, attachment of the counterpart 1003 to the socket 1002 results in electrical coupling between the memory device 205 and the configurable CPU package substrate 200. Thus, the memory device 205 may be electrically coupled to a processing device, such as processing device 203 illustrated in FIG. 2B. As observed in FIG. 10G, the memory device 205 and memory device substrate 207 may fit horizontally between the sockets 1002A and 1002B.

Although FIGS. 10E-10F illustrate inserting connection structure 1016A into socket 1002A before inserting connection structure 1016B into socket 1002B, embodiments are not so limited to such attachment order. In fact, any order may be used to attach the counterpart 1003 to the socket 1002. For instance, the connection structure 1016B may be inserted into socket 1002B before inserting the connection structure 1016A into socket 1002A.

Figure 10H:
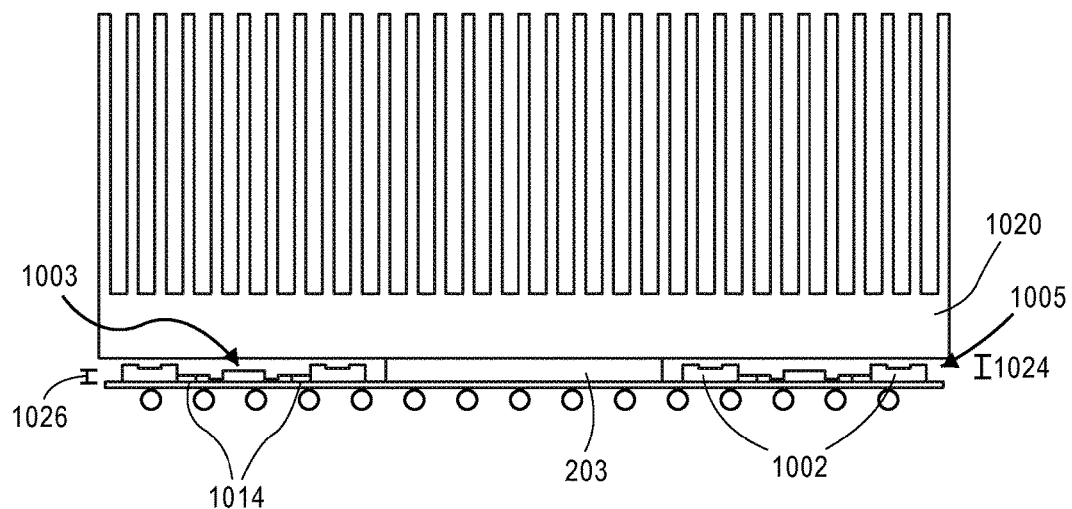
FIG. 10H illustrates a cross-sectional view of a heat sink on a package with a zero insertion force socket counterpart attached to a zero insertion force socket, in accordance to an embodiment of the invention.

In an embodiment, utilizing the zero insertion force socket 1002 minimizes the overall package height, as shown in FIG. 10H. FIG. 10H illustrates a cross-sectional view of a heat sink 1020 attached to a processing device 203. The zero insertion force socket counterpart 1003 is attached to the zero insertion force socket 1002. In embodiments, the counterpart 1003 and socket 1002 are completely disposed below the heat sink 1020. Although FIG. 10H illustrates the heat sink 1020 directly attached to the processing device 203, an intermediate structure, such as a heat spreader, may be disposed between the heat sink 1020 and the processing device 203. The heat spreader may distribute heat generated from the processing device 203 evenly across the heat sink 1020.

A thickness 1026 of the zero insertion force socket assembly 1005 depends on the thicknesses of the counterpart 1003 and the socket 1002. For instance, the thickness 1026 of the zero insertion force socket assembly 1005 is the greater of the counterpart thickness and the socket thickness. In an embodiment, the thickness of the counterpart 1003 ranges between 1 to 1.5 mm. The thickness of the socket 1002 ranges between 3 to 3.5 mm. Thus, in such an embodiment, the thickness of the zero insertion force socket assembly 1005 is approximately 3 to 3.5 mm. Given the small thickness 1026, the separation gap 1024 between the heat sink 1020 and the configurable substrate 200 may be minimized. In an embodiment, the separation gap 1024 is between approximately 5 to 8 mm. By minimizing the separation gap 1024, the overall package size may be minimized as well.

In embodiments, the memory device 205 is held in place by the zero insertion force socket 1002. Accordingly, pulling up the locking levers 1008A and 1008B unlocks the socket 1002, which enables the memory device 205 to be removed from the zero insertion force socket 1002 of the configurable CPU package substrate 200. A new zero insertion force counterpart 1003 with a new memory device 205 may then replace the old zero insertion force counterpart 1003 and be attached to the zero insertion force socket 1002.

1.1.5 Frame Socket

In addition to the sockets already discussed herein, the removable memory mechanical interface may be a frame socket 1102 as illustrated in FIG. 11A. The frame socket 1102 may have a frame-like profile that surrounds the memory device electrical interface 206. In an embodiment, the frame socket 1102 has a notch 1103 on one side of the socket 1102. The notch 1103 may expose structures within the frame socket 1102 such that the structures may be accessed for removal, as will be disclosed further herein. In an embodiment, the notch 1103 is disposed within a side of the frame socket 1002 near an edge of the configurable CPU package substrate 200. This arrangement helps assure that the processing device 203 does not block the notch 1103.

In embodiments, the frame socket 1102 allows a memory device 205 to be removable from the configurable CPU package substrate 200. Additionally, the frame socket 1102 may allow a memory device 205 to be coupled to the memory device electrical interface 206 by simply placing the memory device 205 into the frame socket 1102. In an embodiment, an intermediate structure is used to facilitate attachment of the memory device 205 to the memory device electrical interface 206. The intermediate structure may be any suitable interconnection structure capable of physically and electrically coupling two structures to one another. For instance, the intermediate structure may be a reflowable grid array (RGA), which is discussed in FIGS. 11B-11C herein below.

FIGS. 11B-11C illustrate an RGA 1104 for attaching the memory device 205 to the configurable CPU package substrate 200, according to an embodiment of the invention. The RGA 1104 includes an RGA substrate 1107 and a first array of solder balls 1106 disposed on a top surface 1110 of the RGA substrate 1107. The RGA substrate 1107 may be formed of any suitable substrate capable of withstanding high heat, especially heat high enough to reflow solder. In addition to the first array of solder balls 1106, a second array of solder balls 1108 may be disposed on a bottom surface 1111 of the RGA substrate 1107, as shown in FIG. 11C.

FIG. 11C illustrates a cross-sectional view of the RGA 1104 across line B-B' in FIG. 11B. The first array of solder balls 1106 may be electrically coupled to the second array of solder balls 1108 through the RGA substrate 1107. Accordingly, the RGA 1104 may be used as an interconnecting structure. The first and second array of solder balls 1106 and 1108 may be reflowed to attach a memory device 205 to the configurable substrate 200, as will be discussed further herein.

In an embodiment, the RGA substrate 1107 includes a pair of internal heater grids: top internal heater grid 1110 and bottom internal heater grid 1112. The internal heater grids 1110 and 1112 are each formed of an array of wires constructed from a conductive material, such as a metal. The array of wires may generate heat when a current is flowed through them. In an embodiment, the internal heater grids 1110 and 1112 are embedded within the RGA substrate 1107, but proximate to the top and bottom surfaces 1109 and 1111. For instance, the top internal heater grid 1110 may be placed proximate to the top surface 1109, and the bottom internal heater grid 1112 may be placed proximate to the bottom surface 1111. In an embodiment, the heater grids 1110 and 1112 are placed a distance of between 1 to 3 mm, e.g., approximately 2 mm, away from their respective arrays of solder balls. Accordingly, the close proximity to the surfaces allows the heater grids 1110 and 1112 to reflow the array of solder balls disposed on the corresponding surfaces when they generate heat. Although FIG. 11C illustrates the RGA substrate 1107 having two heater grids 1110 and 1112, embodiments are not so limited. For instance, the RGA substrate 1107 may have only a top internal heater grid 1110 or only a bottom internal heater grid 1112. In such embodiments, only one array of solder balls 1108/1110 may be reflowed.

FIGS. 11D-11E illustrate bottom and top perspective views, respectively, of a frame socket counterpart 1114. In the embodiment depicted in FIG. 11D, the frame socket counterpart 1114 includes a memory device substrate 1140 and an array of interconnection structures 1116 disposed on a bottom surface 1115 of the memory device substrate 1140. The memory device substrate 1140 has edges 1105. The array of interconnection structures 1116 may be any suitable conductive structure, such as an array of metal pads. The array of interconnection structures 1116 may be I/O connections for a memory device 205 disposed on the top surface 1117 of the memory device substrate 1140, as illustrated in FIG. 11E.

Figure 11F:
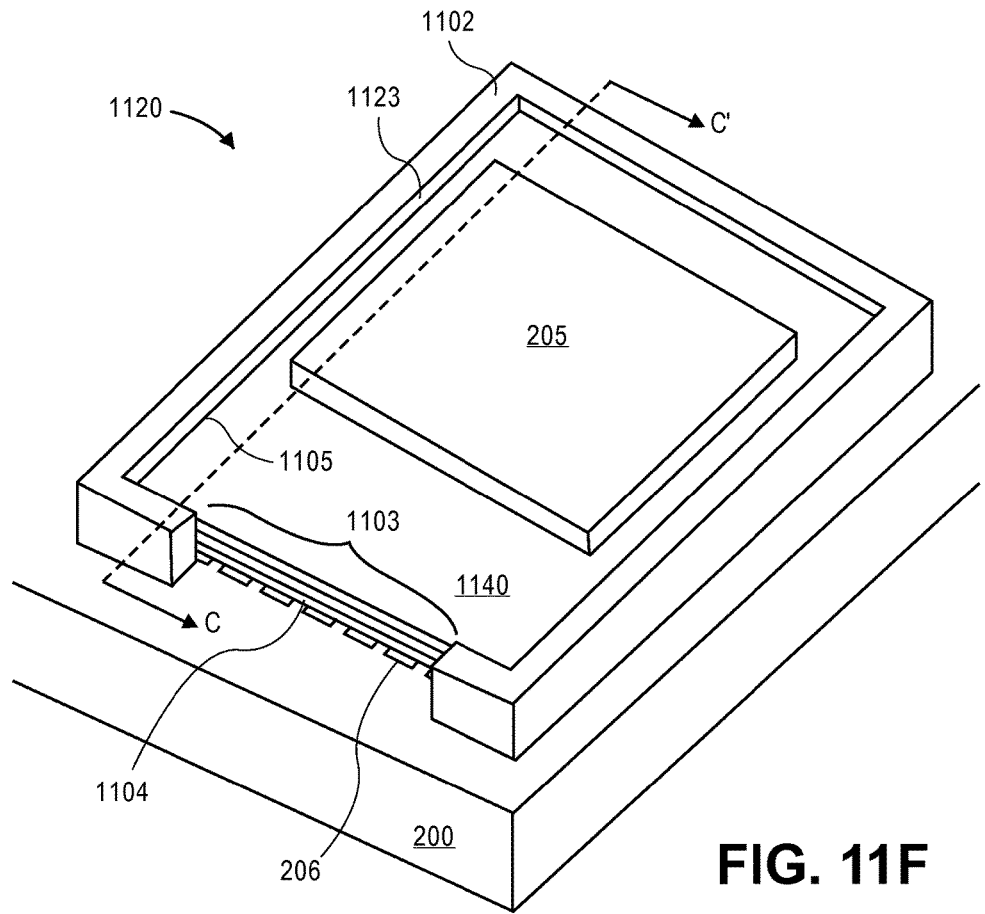
FIGS. 11F-11G illustrate a top perspective view and a cross-sectional view of a frame socket counterpart attached to a frame socket, according to an embodiment of the invention.

FIG. 11F illustrates a top perspective view of a frame socket package assembly 1120, according to an embodiment of the invention. The frame socket package assembly is formed of the frame socket counterpart 1103 attached to the frame socket 1102. The frame socket package assembly 1120 includes the frame socket 1102 disposed on a configurable CPU package substrate 200. In an embodiment, the RGA 1104 is disposed on top of the memory device electrical interface 206. The memory device electrical interface 206 may be an array of pads on the substrate 200 as illustrated in FIG. 11F. As further illustrated, a memory device 205 and a memory device substrate 1140 may be disposed on the RGA 1104. The memory device 205 may be physically and electrically coupled to the memory device substrate 1140, which may in turn be coupled to the RGA 1104. Accordingly, the memory device 205 may be electrically coupled to the configurable substrate 200.

In embodiments, the edges 1105 of the memory device substrate 1140 are contacted with the inner surface 1123 of the frame socket 1102. In such embodiments, the frame socket 1102 helps the memory device substrate 1140 align with the RGA 1104. In addition to the memory device substrate 1140, the RGA 1104 may also have edges that make contact with the inner surface 1123. Accordingly, the frame socket 1104 may help the RGA 1104 align with the memory device electrical interface 206 as well.

A notch 1103 may be disposed within an edge of the frame socket 1102. In embodiments, the notch 1103 is an opening formed within a side of the socket 1102 that allows access to the RGA 1104 after it is attached to the memory device electrical interface 206. Thus, the RGA 1104 and/or the memory device 205 may be removed after attachment. For instance, to remove the memory device 205 from the socket 1102, the top and/or bottom solder balls 1106/1108 may be reflowed and the memory device 205 may be pulled off of the configurable CPU package substrate 200 when the solder balls 1106/1108 are still in liquid form. In an embodiment, current is flowed through the top and/or bottom internal heater grids 1110/1112 to reflow the solder balls 1106/1108 while the memory device 205 is being pulled off. Accordingly, the RGA 1104 enables the memory device 205 to be removable after attachment. In an embodiment, a new RGA 1104 with a new set of solder balls 1106/1108 may be used to attach a new memory device 205 to the frame socket 1102.

Figure 11G:
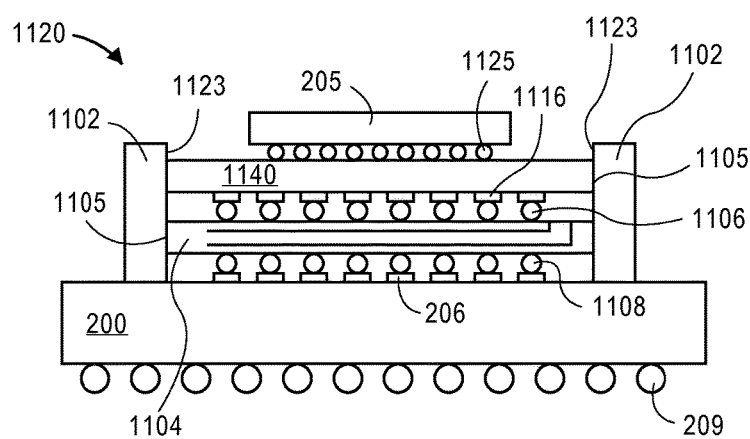

FIG. 11G illustrates a cross-sectional view of the frame socket package assembly 1120. The cross-sectional view in FIG. 11G may be from the perspective across line C-C' of the frame socket package assembly 1120 in FIG. 11F. In embodiments, the RGA 1104 attaches the memory device 205 to the configurable CPU package substrate 200. Specifically, the memory device 205 is coupled to the memory device substrate 1140 via an array of connections 1125. The memory device substrate 1140 is coupled to the configurable CPU package substrate 200 via the RGA 1104. The RGA 1104 may be coupled to the memory device substrate 1140 and the configurable substrate 200 by the top array of solder balls 1106 and the bottom array of solder balls 1108, respectively. Particularly, the array of interconnection structures 1116 may be coupled to the top array of solder balls 1106, and the memory device electrical interface 206 may be coupled to the bottom array of solder balls 1108. Because the memory device 205 is coupled to the configurable CPU package substrate 200, the memory device 205 may be electrically coupled to the processing device 203 (see FIG. 11A) through the substrate 200. As aforementioned herein, an array of solder balls 209 may be disposed beneath the configurable CPU package substrate 200 for coupling the CPU package substrate 200 to a system board.

The frame socket package assembly 1120 may be formed by at least three methods. Each of the at least three methods are illustrated in exemplary embodiments shown in FIGS. 11H-11J.

Figure 11H:
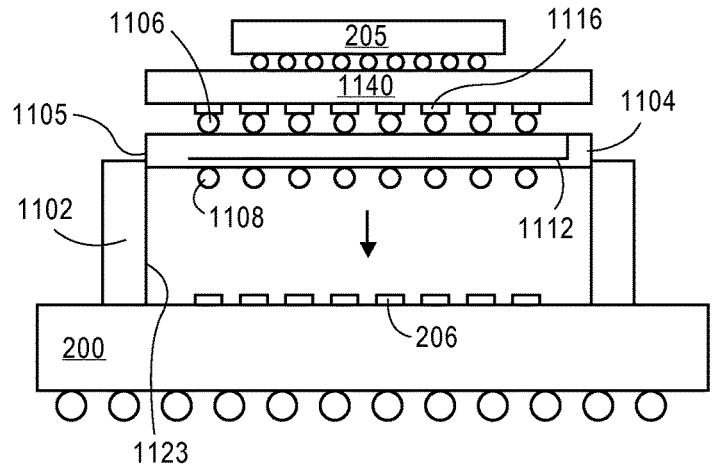
FIGS. 11H-11J illustrate cross-sectional views of different methods of attaching a frame socket counterpart to a frame socket, in accordance with embodiments of the invention.

FIG. 11H illustrates a method of forming the frame socket package assembly 1120 by initially attaching an RGA 1104 to the memory device substrate 1140. In an embodiment, the RGA 1104 is attached to the memory device substrate 1140 before it is attached to the configurable CPU package substrate 200. For instance, the RGA 1104 may be pre-attached to the memory device substrate 1140 during the manufacturing process. That is, customer may purchase the memory device 205 with the memory device substrate 1140 and RGA 1104 already attached. Pre-attaching the RGA 1104 may be performed by any conventional solder reflowing method, such as by processing in a solder reflow oven.

Alternatively, pre-attaching the RGA 1104 may be performed by flowing current through only a top internal heater grid (not shown).

In an embodiment, the RGA 1104, along with the memory device 205 and memory device substrate 1140, is then placed within the frame socket 1102. An edge 1105 of the RGA 1104 may slide against an inner surface 1123 of the frame socket 1102 to align the bottom array of solder balls 1108 with the memory device electrical interface 206 (e.g., an array of pads). Once the bottom solder balls 1108 are placed on corresponding pads of the memory device electrical interface 206, the bottom solder balls 1108 may be reflowed to attach the memory device 205 to the configurable CPU package substrate 200. In an embodiment, reflowing the bottom array of solder balls 1108 is performed by flowing current through only the bottom internal heater grid 1112. For instance, a switch (not shown) may be activated to allow current to flow through the bottom internal heating grid 1112. Accordingly, the RGA 1104 may only have one internal heater grid—the bottom internal heater grid 1112.

Figure 11I:
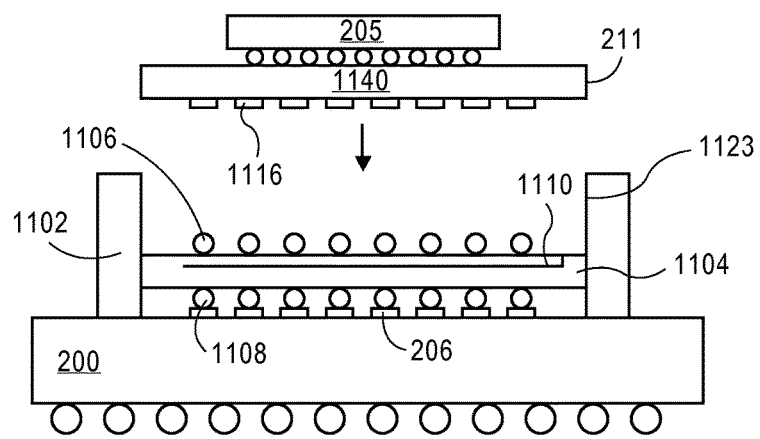

Rather than pre-attaching the RGA 1104 to the memory device substrate 1140, the RGA 1104 may be pre-attached to the configurable CPU package substrate 200 instead. FIG. 11I illustrates a method of forming the frame socket package assembly 1120 by initially attaching the RGA 1104 onto the configurable CPU package substrate 200. In an embodiment, the RGA 1104 is pre-attached to the configurable CPU package substrate 200 during the manufacturing process. For instance, the customer may purchase the configurable CPU package substrate 200 with the RGA 1004 already attached to the frame socket 1102. As shown in FIG. 11I, the RGA 1104 is pre-attached to the memory device electrical interface 206 by the bottom array of solder balls 1108. In an embodiment, the RGA 1104 is pre-attached by reflowing the bottom array of solder balls 1108. For instance, the bottom array of solder balls 1108 may be reflowed in a conventional solder reflow oven. Alternatively, pre-attaching the RGA 1104 may be performed by flowing current through only a bottom internal heater grid (not shown).

To attach the memory device 205 to the configurable CPU package substrate 200, the memory device substrate 1140 may be lowered onto the top array of solder balls 1106. In embodiments, edges 211 of the memory device substrate 1140 slide against the inner surface 1123 of the frame socket 1102. Sliding against the inner surface 1123 aligns the memory device substrate 1140 to the RGA 1104. Specifically, the array of interconnection structures 1116 may be aligned with the top array of solder balls 1106. Once the interconnection structures 1116 are placed on the top array of solder balls 1106, the top array of solder balls 1106 may be reflowed to attach the memory device substrate 1140 to the RGA 1104. Accordingly, the memory device 205 may therefore be coupled to the configurable CPU package substrate 200. In an embodiment, reflowing the top array of solder balls 1106 is performed by flowing current through only the top internal heater grid 1110. For instance, a switch (not shown) may be activated to allow current to flow through the top internal heating grid 1110. Accordingly, the RGA 1104 may only have one internal heater grid—the top internal heater grid 1110.

Figure 11J:
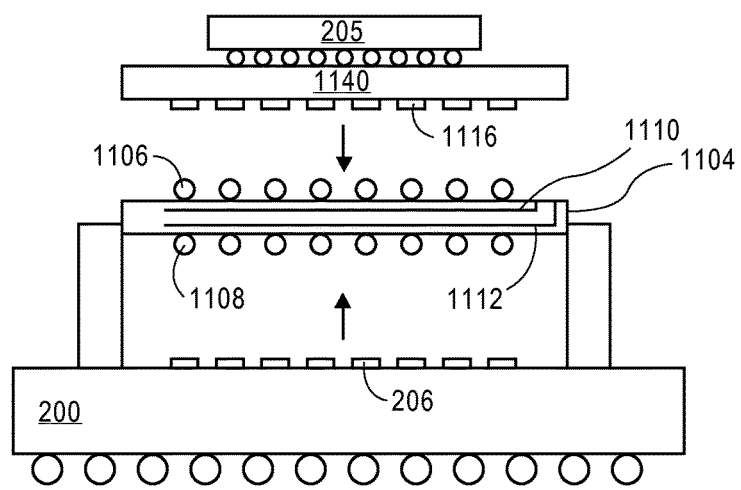

Rather than pre-attaching the RGA 1104 to either the memory device substrate 1140 or the configurable CPU package substrate 200, the RGA 1104 may be attached to both substrate 1140 and 200 simultaneously. FIG. 11J illustrates a method of forming the frame socket package assembly 1120 by simultaneously attaching the RGA 1104 to both the memory device substrate 1140 and the configurable CPU package substrate 200. In an embodiment, the RGA 1104 is placed into the frame socket 1102 and the memory device substrate 1140 is placed upon the RGA 1104. Both the RGA 1104 and the memory device substrate 1140 may be aligned to one another as they both are placed against the inner surface 1123 of the frame socket 1102. Once the RGA 1104 and the memory device substrate 1140 are placed within the frame socket 1102, current may flow into both the top and bottom internal heater grids 1110 and 1112. Accordingly, both the top and bottom array of solder balls 1106 and 1108 may be reflowed to couple the memory device 205 to the configurable CPU package substrate 200. In such embodiments, the RGA 1104 may have both internal heater grids 1110 and 1112 embedded within it.

In the aforementioned embodiments, the memory device 205 is attached to the configurable CPU package substrate 200 by the reflowed solder balls 1106/1108 of the RGA 1104. Accordingly, reflowing the solder balls 1106/1108 and pulling the memory device 205 away from the socket 1102 when the solder balls 1106/1108 are in liquid form may thereby remove the memory device 205 from the frame socket 1102 of the configurable CPU package substrate 200. A new memory device 205 and memory device substrate 1140 may then replace the old memory device 205 and memory device substrate 1140 and be attached to the frame socket 1102 by a new RGA 1104.

1.2 Set of Press Fit Holes Embodiment

Figure 12A:
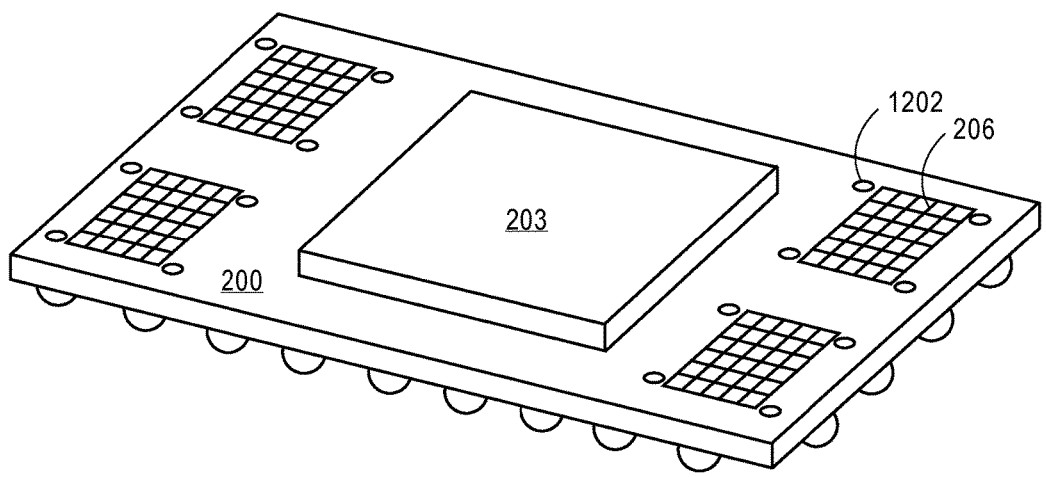
FIG. 12A illustrates a package with a set of press fit holes in a configurable CPU package substrate, in accordance with an embodiment of the invention.

Although the removable memory mechanical interface may be formed as sockets in several embodiments, in alternative embodiments, the removable memory mechanical interface may be formed as a set of press fit holes as shown in FIG. 12A. FIG. 12A illustrates a top perspective view of a set of press fit holes 1202 formed in a configurable substrate 200, according to an embodiment of the invention. The set of press fit holes 1202 enables a memory device to be removed from the configurable CPU package substrate 200. In the embodiment illustrated in FIG. 12A, the set of press fit holes 1202 is formed of a set of four press fit holes. The set of press fit holes 1202 may be disposed around a memory device electrical interface 206 within the region 208 discussed herein with respect to FIG. 2A. In an embodiment, the memory device electrical interface 206 is an array of pads. The press fit holes 1202 may allow corresponding pins to insert through the holes in order to attach a press fit hole counterpart to the configurable substrate 200, as will be discussed further herein.

Figure 12B:
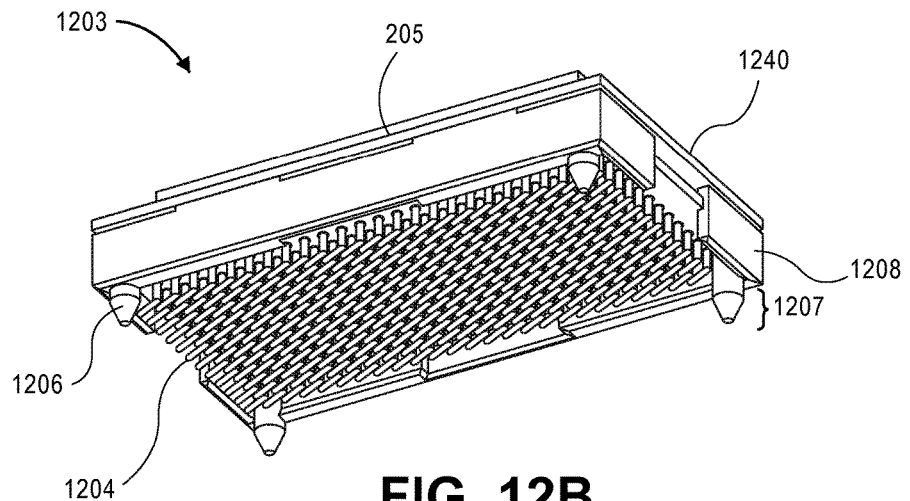
FIGS. 12B-12C illustrate a bottom perspective view and a side view of a press fit hole counterpart, in accordance with an embodiment of the invention.

FIG. 12B illustrates a bottom perspective view of a press fit hole counterpart 1203, according to an embodiment of the invention. In an embodiment, the press fit hole counterpart 1203 includes a memory device 205 mounted on top of a memory device substrate 1240. A separation frame 1208 may be disposed on the bottom of the memory device substrate 1240. The separation frame 1208 may ensure that the memory device substrate 1240 is separated a certain distance from the configurable CPU package substrate 200 when attached, as will be discussed further herein. In embodiments, the separation frame 1208 may be disposed near the edges of the memory device substrate 1240.

The press fit hole counterpart 1203 may also include a set of attachment pins 1206. The attachment pins 1206 may be disposed on the bottom surface of the memory device substrate 1240. In an embodiment, the set of attachment pins 1206 is arranged to correspond with the set of press fit holes 1202. Accordingly, each attachment pin 1206 may correspond to a respective press fit hole 1202. In a particular embodiment, the attachment pins 1206 are disposed near the corners of the memory device substrate 1240. The attachment pins 1206 may also include a tapered end 1207. The tapered end 1207 may help guide the attachment pins 1206 into the press fit holes 1202, as will be discussed further herein.

Additionally, the press fit hole counterpart 1203 may also include an array of interconnection structures 1204. The array of interconnection structures 1204 may be disposed on the bottom of the memory device substrate 1240 and within the separation frame 1208. In an embodiment, the interconnection structures 1204 are cantilever pins. Each interconnection structure of the array of interconnection structures 1204 may correspond to respective pads of the memory device electrical interface 206.

Figure 12C:
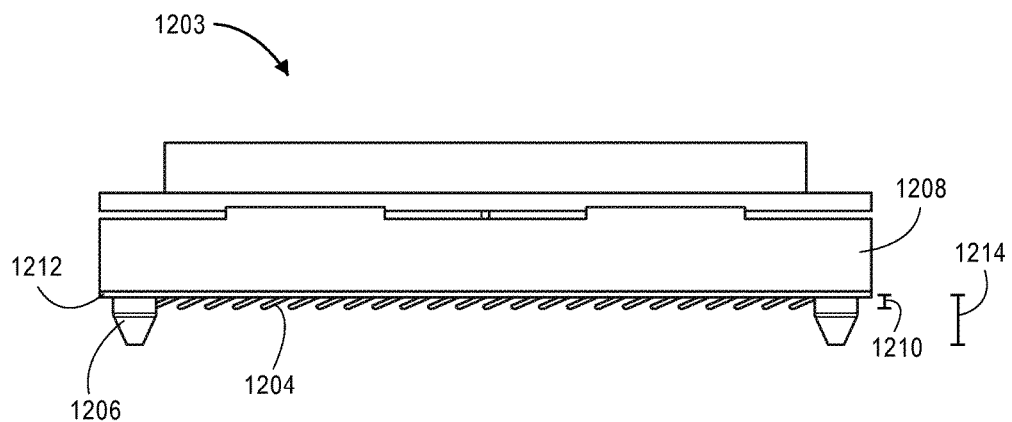

The interconnection structures 1204 may protrude below the separation frame 1208 as shown in FIG. 12C. FIG. 12C illustrates a side view of the press fit holes counterpart 1203. In an embodiment, the interconnection structures 1204 protrude a certain distance 1210 below the bottom 1212 of the separation frame 1208. The distance 1210 may be any distance suitable to compensate for pad height differences and/or interconnection structure height differences of the memory device electrical interface 206. In an embodiment, the distance 1210 is approximately 1 mm.

In addition to the interconnection structures 1204, the attachment pins 1206 may also protrude below the separation frame 1208. The attachment pins 1206 may protrude a distance 1214 below the bottom 1212 of the separation frame 1208. In embodiments, the attachment pins 1206 protrude farther than the interconnection structures 1204. Accordingly, the distance 1214 may be greater than the distance 1210. Having the attachment pins 1206 protrude farther than the interconnection structures 1204 allows the attachment pins 1206 to insert into the set of press fit holes 1202 while allowing the interconnection structures 1204 to make contact with the memory device electrical interface 206. In an embodiment, the distance 1214 is at least 2 mm. In a particular embodiment, the distance 1214 is between 2-4 mm.

Figure 12D:
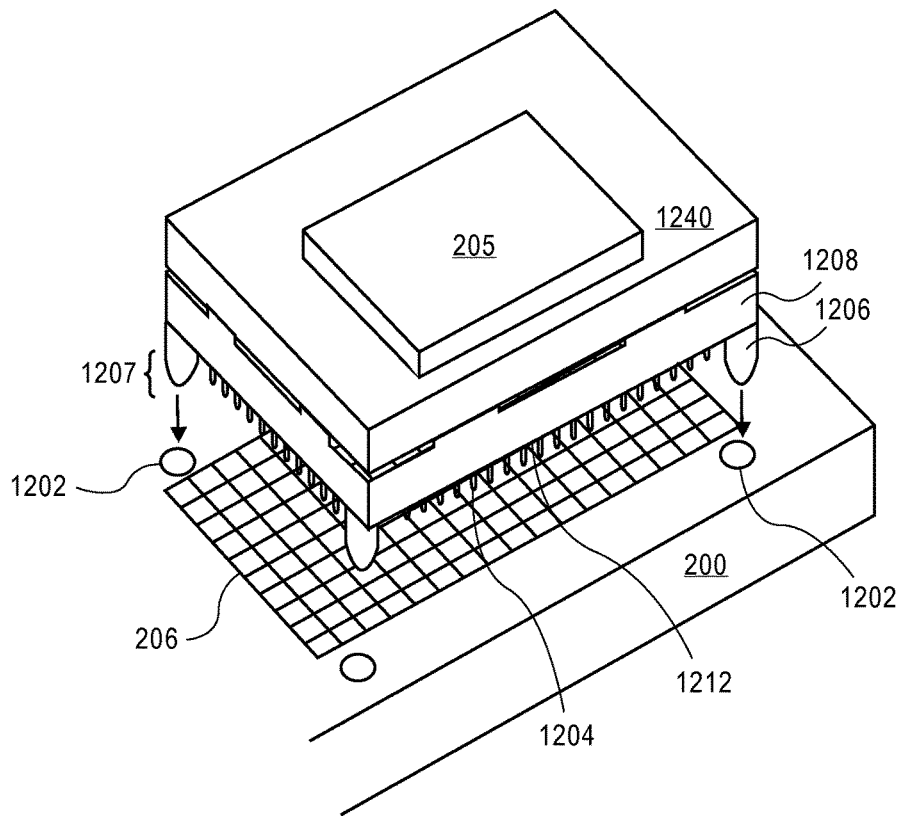
FIGS. 12D-12E illustrate a method of attaching a press fit hole counterpart to a set of press fit holes, in accordance with an embodiment of the invention.
Figure 12E:
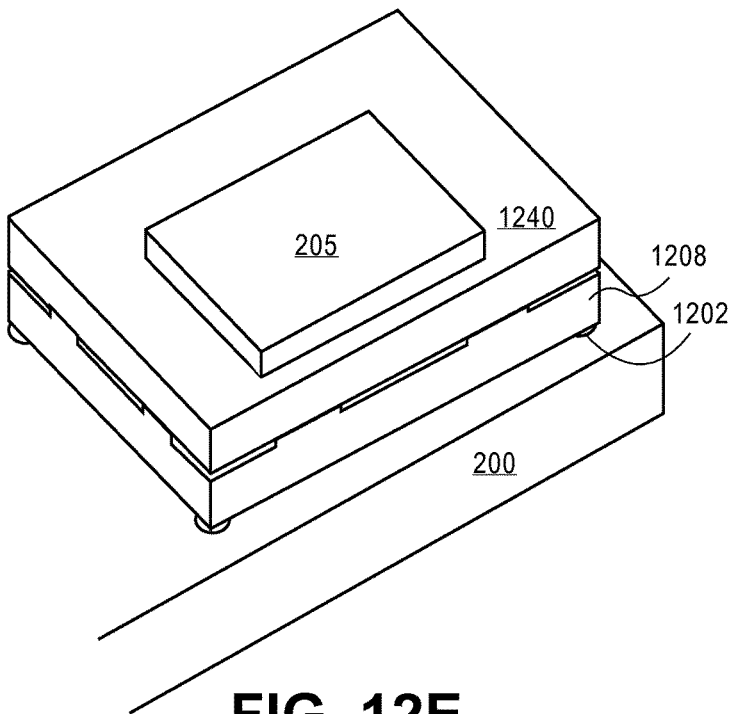

FIGS. 12D-12E illustrate a method of attaching a memory device 205 to a removable memory mechanical interface. Specifically, FIGS. 12D-12E illustrate a method of attaching the press fit hole counterpart 1203 to the set of press fit holes 1202, according to an embodiment of the invention.

To attach the press fit hole counterpart 1203, the set of attachment pins 1206 may be pushed toward the set of press fit holes 1202, as shown in FIG. 12D. In embodiments, the tapered ends 1207 of the attachment pins 1206 help guide the attachment pins 1206 into the press fit holes 1202 when the counterpart 1203 is being pushed toward the substrate 200. As the attachment pins 1206 insert through the press fit holes 1202, the attachment pins 1206 align the interconnecting structures 1204 to respective pads of the memory device electrical interface 206. In an embodiment, attachment pins 1206 are pushed toward the press fit holes 1202 until the bottom 1212 of the separation frame 1208 contacts the configurable CPU package substrate 200, which is illustrated in FIG. 12E. The separation frame 1208 maintains a separation distance between the memory device substrate 1240 and the configurable CPU package substrate 200 to prevent over-stressing the interconnecting structures 1204. Without the separation frame 1208, the interconnecting structures 1204 may be damaged by being pressed onto the substrate 200 too far.

As shown in FIG. 12E, the attachment pins 1206 may insert substantially into the set of press fit holes 1202. The interconnection structures 1204, which extended below the separation frame 1208 before attachment, does not now extend below the separation frame 1208. This may be due to the compliance of the interconnection structures 1204 when the counterpart 1203 is pressed down onto the substrate 200. As such, the interconnection structures 1204 are electrically coupled to respective pads of the memory device electrical interface 206. Accordingly, the memory device 205 is electrically coupled to the configurable CPU package substrate 200.

In an embodiment, the diameter of the attachment pins 1206 above the tapered ends 1207 is substantially equal to, if not slightly larger than, the diameter of the press fit holes 1202. Accordingly, when the attachment pins 1206 are inserted into the press fit holes 1202, the attachment pins 1206 fit snugly into the press fit holes 1202, thereby creating sufficient static friction to keep the counterpart 1203 in place. Additionally, a heat sink (not shown) may also apply enabling force (e.g., downward force) to keep the counterpart 1203 attached.

In embodiments, the memory device 205 is attached to the configurable CPU package substrate 200 by the static frictional force created between the set of press fit holes 1202 and the set of attachment pins 1206. Accordingly, pulling the press fit hole counterpart 1203 away from the configurable CPU package substrate 200 with a force greater than the static frictional force may thereby remove the memory device 205 from the set of press fit holes 1202 of the configurable CPU package substrate 200. A new press fit hole counterpart 1203 with a new memory device 205 may then replace the old press fit hole counterpart 1203 with the old memory device 205 and attach to the set of press fit holes 1202.

1.3 Set of Alignment Pins Embodiment

In an embodiment, a set of alignment pins are disposed on the configurable CPU package substrate instead of a set of press fit holes. Accordingly, the set of alignment pins may be the removable memory mechanical interface, according to an embodiment of the invention. FIG. 13A illustrates a top-view perspective of a set of alignment pins 1302 formed on a configurable substrate 200, according to an embodiment of the invention. The set of alignment pins 1302 enables a memory device to be removed from the configurable CPU package substrate 200. Additionally, the set of alignment pins 1302 enables implementation of a high number of optical ports for increasing I/O density.

In the embodiment illustrated in FIG. 13A, the set of alignment pins 1302 is formed of a set of two alignment pins. Although two pins are illustrated, embodiments having three or more alignment pins are envisioned herein. The set of alignment pins 1302 may be disposed around a memory device electrical interface 206 (e.g., an array of pads) within the region 208 discussed herein with respect to FIG. 2A. Alternatively, the set of alignment pins 1302 may be disposed around an I/O array for optical modules. The alignment pins 1302 may allow corresponding press fit holes to fit around the pins to attach an alignment pin counterpart to the configurable substrate 200, as will be discussed further herein. In an embodiment, the alignment pins 1302 each include a tapered portion 1305 to assist in guiding the alignment pins 1302 into press fit holes.

FIG. 13B illustrates a bottom perspective view of an alignment pin counterpart 1303 according to an embodiment of the invention. The alignment pin counterpart 1303 includes a memory device substrate 1340 and an array of interconnection structures 1306. The array of interconnection structures 1306 may be disposed on the bottom surface 1307 of the memory device substrate 1340. In an embodiment, the memory device substrate 1340 includes a set of press fit holes 1304. The set of press fit holes 1304 may correspond to the set of alignment pins 1302 on the configurable substrate 200 aforementioned herein. Accordingly, the set of alignment pins 1302 may insert through the set of press fit holes 1304 to attach the alignment pin counterpart 1303 to the configurable substrate 200.

FIG. 13C illustrates a top perspective view of the alignment pin counterpart 1303. As shown, a memory device 205 may be mounted on the memory device substrate 1340. In an embodiment, the interconnection structures 1306 are coupled to the memory device 205 through the memory device substrate 1340. In embodiments, the press fit holes 1305 extend through the memory device substrate 1340.

Figure 13D:
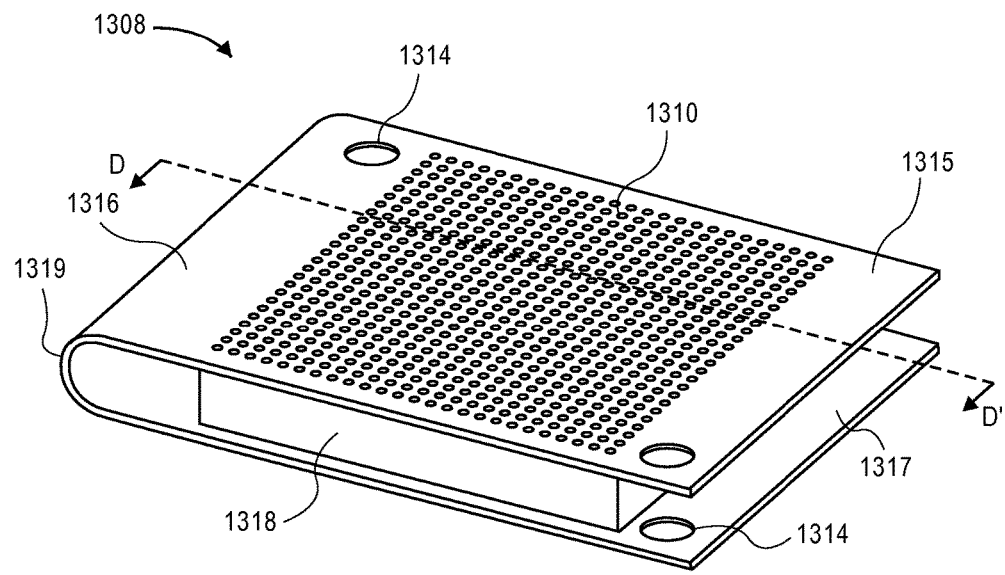
FIGS. 13D-13E illustrate a top perspective view and a cross-sectional view of an intermediate structure for a set of alignment pins, in accordance with an embodiment of the invention.

FIG. 13D illustrates an intermediate structure 1308 used to interconnect the memory device 205 to the configurable CPU package substrate 200. In an embodiment, the intermediate structure makes direct contact with both the interconnection structures 1306 and the memory device electrical interface 206. As illustrated in an exemplary embodiment in FIG. 13D, the intermediate structure 1308 includes a flexible substrate 1316 bent in a U-shaped profile. The flexible substrate 1316 may be any suitable flexible substrate capable of having various electrical traces routed within or on top of its surface. In an embodiment, the flexible substrate 1316 is a flexible printed circuit (FPC).

Because the flexible substrate 1316 has a U-shaped profile, the flexible substrate 1316 may thus have three different portions. For instance, the flexible substrate 1316 may have an upper portion 1315 and a lower portion 1317 connected together by a bent portion 1319. In an embodiment, the upper portion 1315 is disposed directly above the lower portion 1317. In embodiments, an elastic member 1318 may be disposed between the upper and lower portions 1315 and 1317. The elastic member 1318 may allow a degree of compliance across the upper and lower portions 1315 and 1317 to compensate for uneven contact heights, as will be discussed further herein.

A set of press fit holes 1314 may be disposed in both the upper portion 1315 and lower portion 1317. The press fit holes 1314 may allow the intermediate structure 1308 to align with both the memory device electrical interface 206 and the interconnection structures 1306 during attachment. In an embodiment, alignment is made when the set of alignment pins 1302 inserts through the press fit holes 1314.

An array of top interconnects 1310 may be disposed on the upper portion 1315 of the flexible substrate 1316. In an embodiment, the array of top interconnects 1310 are disposed on a top surface 1320 of the upper portion 1315 as illustrated in FIG. 13E.

Figure 13E:
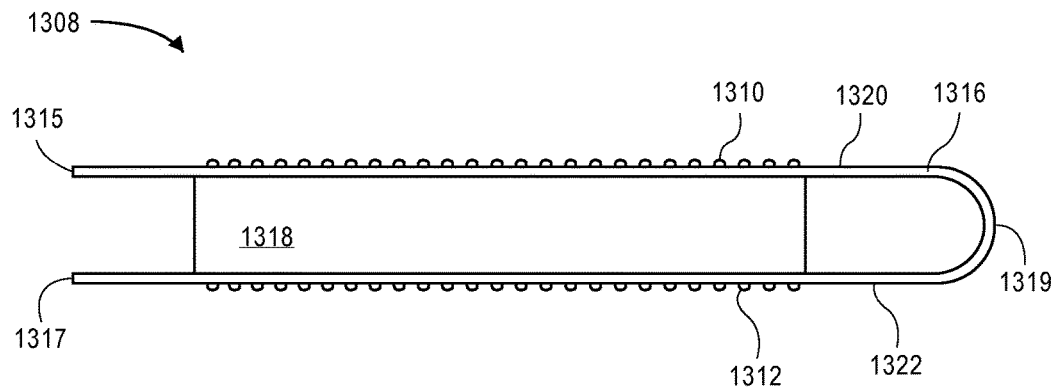

FIG. 13E illustrates a cross-sectional view of the intermediate structure 1308 across line D-D' of FIG. 13D. The intermediate structure 1308 may include the array of top interconnects 1310 as well as an array of bottom interconnects 1312. In embodiments, the array of bottom interconnects 1312 are disposed on a bottom surface 1322 of the lower portion 1317. The array of top and bottom interconnects 1310 and 1312 may be any suitable interconnection structure. For instance, the top and bottom interconnects 1310 and 1312 may be an array of solid copper balls. Utilizing an array of solid copper balls as the interconnects 1310 and 1312 help minimize the interconnect pitch. In an embodiment, the pitch of the top and bottom interconnects 1310 and 1312 may be less than 0.5 mm. In a particular embodiment, the pitch may be approximately 0.3 mm or less. Accordingly, the memory device electrical interface 206, or any other corresponding I/O array, may have a reduced footprint. Reducing the footprint may allow implementation of more memory devices 205 and/or implementation of land side capacitors on the memory device substrate 1340. In an embodiment, the array of top interconnects 1310 are electrically coupled to the array of bottom interconnects 1312 through the flexible substrate 1316. Electrical traces within or on top of the flexible substrate 1316 may interconnect the top and bottom interconnects 1310 and 1312 by routing across the upper and lower portions 1315 and 1317 and along the bent portion 1319.

In embodiments, utilizing the intermediate structure 1308 enables both the memory device electrical interface 206 and the interconnection structures 1306 to be formed of an array of pads. Thus, the memory device electrical interface 206 and the interconnection structure 1306 may not significantly protrude from the configurable CPU package substrate 200 and the memory device substrate 1340, respectively. Accordingly, the memory device electrical interface 206 and the interconnection structure 1306 may better resist damage.

Figure 13F:
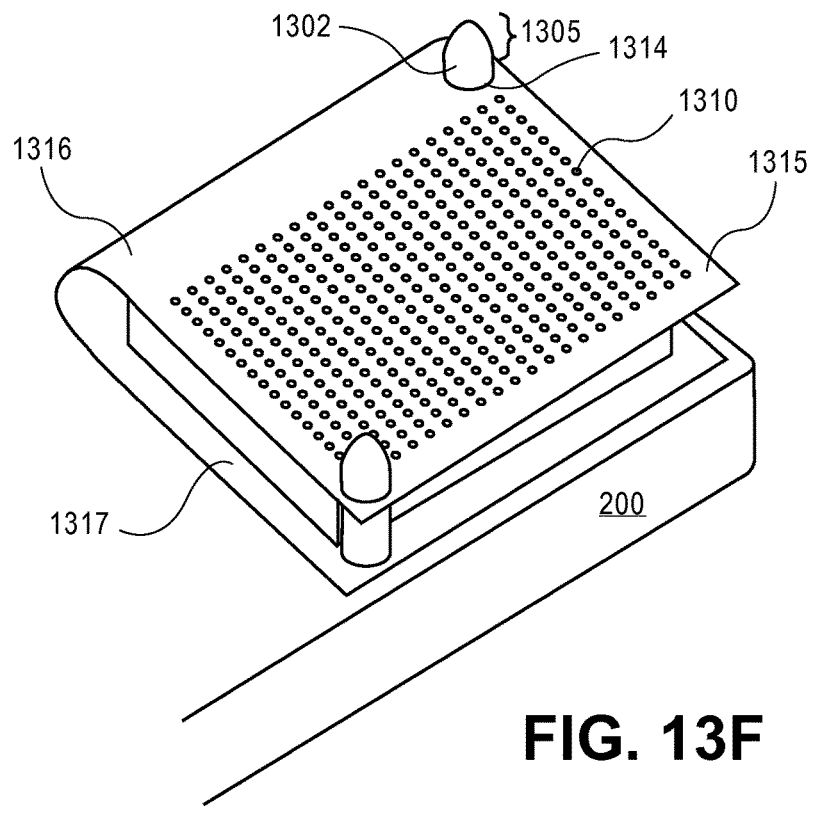
FIGS. 13F-13G illustrate a method of attaching an alignment pin counterpart to a memory device electrical interface with a set of alignment pins and an intermediate structure, in accordance with an embodiment of the invention.
Figure 13G:
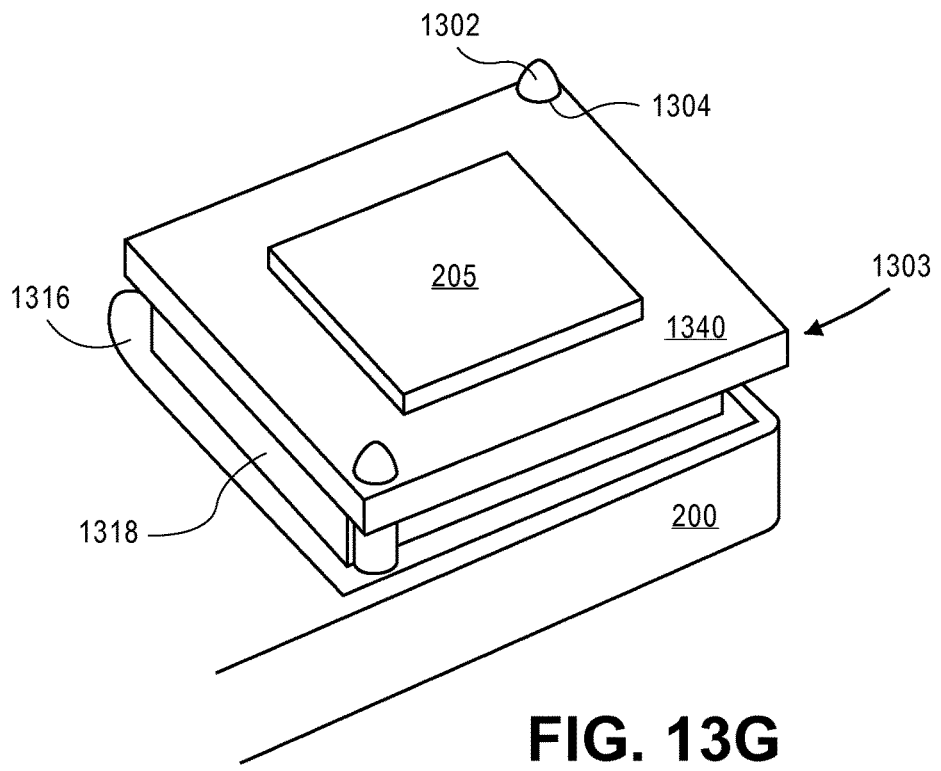

FIGS. 13F-13G illustrate a method of attaching a memory device to a configurable CPU package substrate by utilizing alignment pins 1302. Specifically, FIGS. 13F-13G illustrate a method of attaching the alignment pin counterpart 1303 to the memory device electrical interface 206 with alignment pins 1302 and the intermediate structure 1316.

To attach the alignment pin counterpart 1303, the intermediate structure 1316 may be first placed onto the memory device electrical interface 206, as illustrated in FIG. 13F. In an embodiment, the alignment pins 1302 insert into and through the press fit holes 1314 within the upper and lower portions 1315 and 1317 of the flexible substrate 1316. The diameter of the alignment pins 1302 may be substantially equal to, if not slightly larger than, the diameter of the press fit holes 1314. Accordingly, the static friction created by the interaction between the press fit holes 1314 and the alignment pin 1302 secures the intermediate structure 1316 in place. In an embodiment, the array of bottom interconnects 1312 (not shown) are coupled to respective pads of the memory device electrical interface 206.

Thereafter, in FIG. 13G, the alignment pin counterpart 1303 may be placed on top of the intermediate structure 1316. In an embodiment, the alignment pins 1302 insert into the press fit holes 1304 in the memory device substrate 1340. Similar to the intermediate structure 1316, the alignment pin counterpart 1303 may be held in place by the static friction between the alignment pins 1302 and the press fit holes 1304. In embodiments, the alignment pins 1302 help align the interconnection structures 1306 to the top interconnects 1310. When the alignment pin counterpart 1303 is placed onto the intermediate structure 1316, the array of interconnection structures 1306 may be coupled to respective top interconnects 1310 on the intermediate structure 1316. Accordingly, the memory device 205 may be electrically coupled to the configurable CPU package substrate 200.

In an embodiment, the elastic member 1318 disposed between the upper and lower portions 1315 and 1317 allows the top and bottom array of interconnects 1310 and 1312 a certain degree of vertical compliance. By allowing a certain degree of vertical compliance, the elastic member 1318 helps the top and bottom array of interconnects 1310 and 1312 compensate for any abnormalities in interconnect size. In an embodiment, the elastic member 1318 may be formed of any suitable elastic material. For instance, the elastic member 1318 may be formed of a silicone slab or an array of linear springs. To allow for sufficient vertical compliance, the elastic member 1318 may be formed of a suitable thickness. In an embodiment, the thickness of the elastic member 1318 ranges between 1 to 3 mm. In a particular embodiment, the elastic member 1318 is approximately 2 mm thick.

An optional heat sink (not shown) may be used to apply additional enabling force if desired. For instance, a heat sink may apply downward force upon the alignment pin counterpart 1303 to ensure proper electrical coupling.

In embodiments, the memory device 205 is coupled to the configurable CPU package substrate 200 by the static frictional force created between the set of attachment pins 1302 and the set of press fit holes 1304. Accordingly, pulling the alignment pin counterpart 1303 away from the configurable CPU package substrate 200 with a force greater than the static frictional force may thereby remove the memory device 205 from the set of attachment pins 1302 of the configurable CPU package substrate 200. Alternatively, if a heat sink is present, the heat sink may first be removed before pulling the alignment pin counterpart 1303 away from the set of attachment pins 1302. A new press fit hole counterpart 1303 with a new memory device 205 may then replace the old press fit hole counterpart 1303 with the old memory device 205 and attach to the set of alignment pins 1302.

Although embodiments illustrated utilize the intermediate structure 1316 for attaching a removable memory device 205, embodiments are not limited to such applications. For instance, the intermediate structure 1316 may be used to attach an optical module for I/O purposes. The optical module may benefit from the fine pitched array of top and bottom interconnects 1310 and 1312. For instance, the reduced footprint of the fine pitched array may allow additional optical modules to couple to the configurable CPU package substrate 200, thereby increasing device performance.

1.4 Spring-Loaded Clip Embodiment

In an embodiment, the removable memory mechanical interface may be formed of a spring-loaded clip as illustrated in FIG. 14A. FIG. 14A illustrates a top perspective view of a spring-loaded clip 1402 on a configurable substrate 200, according to an embodiment of the invention. The spring-loaded clip 1402 may be used to attach a memory device to the configurable CPU package substrate 200. Additionally, the spring-loaded clip 1402 enables the attached memory device to be removed from the configurable CPU package substrate 200. In the embodiment illustrated in FIG. 14A, the spring-loaded clip 1402 is formed of a top plate 1404 and a spring 1406. The top plate 1404 includes a top opening 1405 within which a structure, such as a memory device, may fit. The spring 1406 may be any suitable spring that generates a force to draw a portion of the top plate 1404 toward the configurable substrate 200. In an embodiment, the spring 1406 is a coil spring. The spring-loaded clip 1402 may be disposed around and above a memory device electrical interface 206 (e.g., an array of pads) within the region 208 discussed herein with respect to FIG. 2A. Accordingly, a structure, such as a memory device, may be attached to the memory device electrical interface 206 by the spring-loaded clip 1402. In embodiments, the spring-loaded clip 1402 also allows the memory device to be removed.

FIGS. 14B-14C illustrate bottom and top perspective views of a spring-loaded clip counterpart 1403, according to an embodiment of the invention. As shown in FIG. 14B, the spring-loaded clip counterpart 1403 is formed of a memory device substrate 1440 and a separation frame 1410. The separation frame 1410 may be disposed on the bottom surface 1414 of the memory device substrate 1440. Additionally, the spring-loaded clip counterpart 1403 may also include an array of interconnection structures 1412 disposed within the separation frame 1410. The array of interconnection structures 1412 may be any suitable compliant interconnect, such as an array of cantilever pins. The cantilever pins allow a slight degree of compliance to compensate for any uneven height across the memory device electrical interface 206. In embodiments, the separation frame 1410 prevents damage to the array of interconnection structures 1412 during attachment, as will be discussed further herein. A pair of notches 1408 may be formed within the memory device substrate 1440. In an embodiment, the pair of notches 1408 extend from edges of the substrate 1440 and are disposed a certain distance 1415 away from an edge 1413 of the memory device substrate 1440. The notches 1408 help align the counterpart 1403 to the configurable CPU package substrate 200, as well as help lock the counterpart 1403 in place when attached to the substrate 200.

With brief reference to FIG. 14C, a memory device 205 may be mounted on a top surface 1416 of the memory device substrate 1440. The memory device 205 may be electrically coupled to the interconnection structures 1412 through the memory device substrate 1440. In an embodiment, the interconnection structures 1412 protrude below the separation frame 1410 so that the interconnection structures 1412 may make contact with corresponding pads on a separate surface, as will be discussed herein.

Figure 14D:
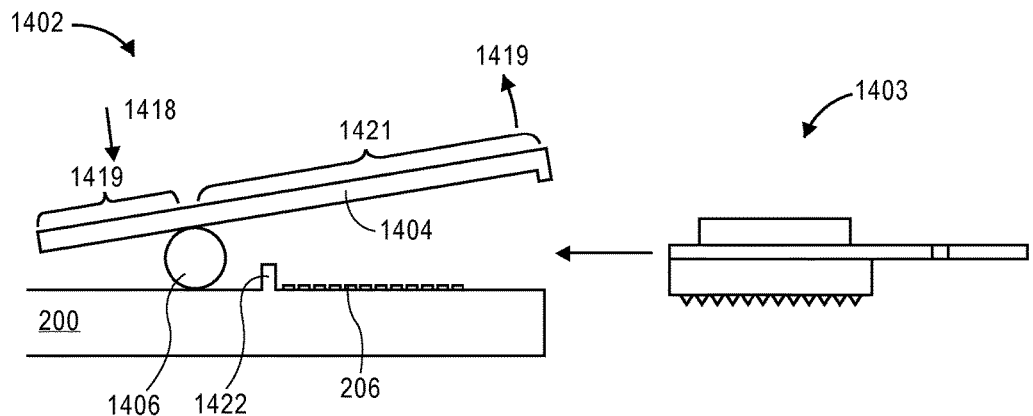
FIGS. 14D-14F illustrate a method of attaching a spring-loaded clip counterpart to a memory device electrical interface with a spring loaded clip, in accordance with an embodiment of the invention.
Figure 14E:
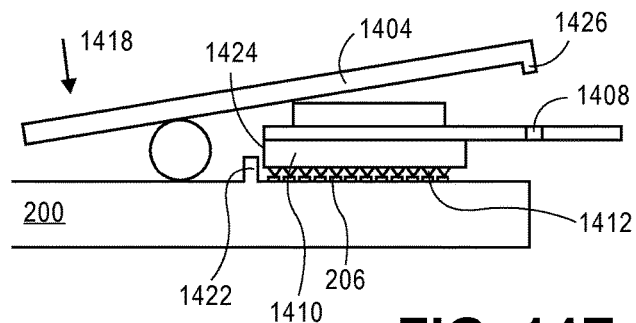
Figure 14F:
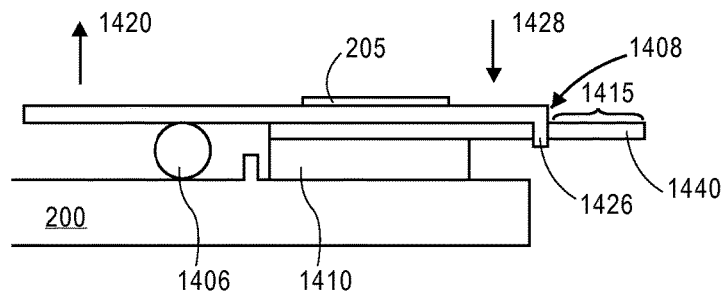

FIGS. 14D-14F illustrate a method of attaching a memory device to a configurable CPU package substrate by utilizing the spring-loaded clip 1402, according to an embodiment of the invention. Specifically, FIGS. 14D-14F illustrate a method of attaching the spring-loaded clip counterpart 1403 to the memory device electrical interface 206 with the spring-loaded clip 1402.

To attach the spring-loaded clip counterpart 1403, a downward force 1418 is initially applied to a non-engaging portion 1419 of the top plate 1404, as illustrated in FIG. 14D. In an embodiment, the downward force 1418 is generated by a finger, although any other object capable of applying force may be used. When the downward force 1418 is applied, a corresponding upward force is generated in an engaging portion 1421 of the top plate 1404. The upward force 1419 lifts up the engaging portion 1421 of the top plate 1404.

Once the engaging portion 1421 is lifted, the spring-loaded clip counterpart 1403 may be inserted between the engaging portion 1421 of the top plate 1404 and the configurable CPU package substrate 200, as shown in FIG. 14E. In an embodiment, the counterpart 1403 may be inserted until it makes contact with a stopping protrusion 1422. The stopping protrusion 1422 may be a portion of the configurable CPU package substrate 200 that extends vertically upward. The stopping protrusion 1422 prevents the counterpart 1403 from inserting too far into the clip 1402. Additionally, the protrusion 1422 helps the counterpart 1403 align with the memory device electrical interface 206.

After the counterpart 1403 makes contact with the stopping protrusion 1422, the downward force may be released 1420, thereby allowing the spring 1406 to generate a downward clipping force 1428. The clipping force 1428 may draw the engaging portion 1421 of the top plate 1404 toward the configurable CPU package substrate 200. In embodiments, the top plate 1404 may include a locking protrusion 1426 at the end of the engaging portion 1421. The locking protrusion 1426 may fit into the notch 1408 formed in the memory device substrate 1440. If the interconnecting structures 1412 are misaligned with the memory device electrical interface 206, the locking protrusion 1426 may not insert into the notches 1408. Accordingly, the position of the counterpart 1403 may be adjusted until the locking protrusion 1426 fits into the notch 1408. In an embodiment, the top plate 1404 has two locking protrusions 1426, each corresponding to a respective notch illustrated in FIG. 14B.

Once the counterpart 1403 is attached, as shown in FIG. 14F, the spring-loaded clip 1402 presses down on the counterpart 1403, which in turn engages the interconnecting structure 1412 with the memory device electrical interface 206. Accordingly, an electrical connection is formed between the configurable CPU package substrate 200 and the memory device 205. In an embodiment, the opening 1405 gives the memory device 205 clearance when the clip 1402 is closed.

Once closed, the memory device substrate 1440 may protrude the distance 1415 away from the clip 1402. This protrusion allows a user to grab the substrate 1440 during attachment and removal of the counterpart 1403.

In embodiments, the memory device 205 is coupled to the configurable CPU package substrate 200 by the downward force generated by the spring 1406. Accordingly, applying a downward force onto the non-engaging region 1419 of the top plate 1404 may thereby open the clip 1402 and allow the memory device 205 to be removed from the spring-loaded clip 1402 of the configurable CPU package substrate 200. A new spring-loaded clip counterpart 1403 with a new memory device 205 may then replace the old spring-loaded clip counterpart 1403 with the old memory device 205 and be attached to the spring-loaded clip 1402.

It is to be appreciated that the different embodiments for the removable memory mechanical interface disclosed herein commonly enable a memory device to be removed from a CPU package substrate even after attachment. Removing the memory device may not require a separate tool. Accordingly, any user, such as a customer, may remove and/or replace memory devices on a configurable CPU package substrate according to design requirements.

2.0 Computing System

Figure 15:
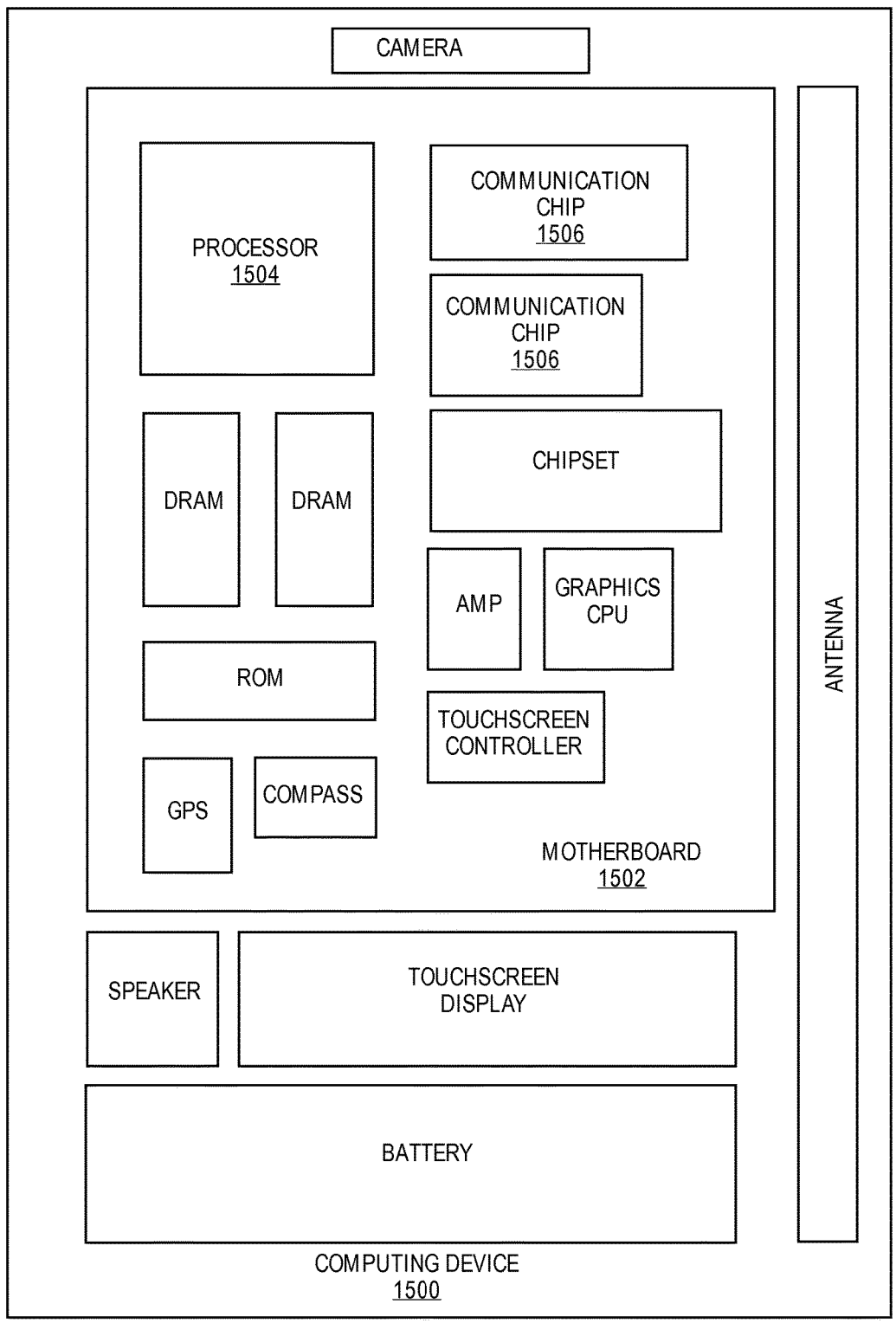
FIG. 15 illustrates a computing system implemented with one implementation of the invention.

FIG. 15 illustrates a computing system 1500 implemented with one implementation of the invention. The computing device 1500 houses a board 1502. The board 1502 may include a number of components, including but not limited to a processor 1504 and at least one communication chip 1506. The processor 1504 is physically and electrically coupled to the board 1502. In some implementations the at least one communication chip 1506 is also physically and electrically coupled to the board 1502. In further implementations, the communication chip 1506 is part of the processor 1504.

Depending on its applications, computing device 1500 may include other components that may or may not be physically and electrically coupled to the board 1502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1506 enables wireless communications for the transfer of data to and from the computing device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1500 may include a plurality of communication chips 1506. For instance, a first communication chip 1506 may be dedicated to shorter range wireless communications such as Wi-Fi and Bluetooth and a second communication chip 1506 may be dedicated to longer range wireless communications such as GPS, EDGE, GPRS, CDMA, WiMAX, LTE, Ev-DO, and others.

The processor 1504 of the computing device 1500 includes an integrated circuit die packaged with a CPU package substrate having removable memory mechanical interfaces, in accordance with implementations of the invention. In some implementations of the invention, the integrated circuit die of the processor includes one or more semiconductor devices. The term "processor" may refer to any device or portion of a device that processes electronic data from registers and/or memory to transform that electronic data into other electronic data that may be stored in registers and/or memory.

The communication chip 1506 also includes an integrated circuit die packaged with a CPU package substrate having removable memory mechanical interfaces, in accordance with implementations of the invention. In accordance with another implementation of the invention, the integrated circuit die of the processor includes one or more semiconductor devices.

In further implementations, another component housed within the computing device 1500 may contain CPU package substrates having removable memory mechanical interfaces in accordance with implementations of the invention.

In various implementations, the computing device 1500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1500 may be any other electronic device that processes data.

In an embodiment, a package substrate includes a processing device interface, a memory device electrical interface disposed on the package substrate, and a removable memory mechanical interface disposed proximately to the memory device electrical interface. The removable memory mechanical interface allows a memory device to be easily removed from the package substrate after attachment of the memory device to the package substrate.

The memory device electrical interface may include a land grid array. In an embodiment, the memory device electrical interface includes an array of pins. In an embodiment, the removable memory mechanical interface has electrical contacts that are in contact with the memory device electrical interface and has exposed electrical contacts for electrical contact to a mechanical counterpart that is to mate with the removable memory mechanical interface and that is integrated with the memory device.

In an embodiment, the removable memory mechanical interface is a sliding rail socket. The sliding rail socket may include an array of angled pins, sliding grooves on two opposing sides of the socket, and a stopping wall. The angled pins may be slanted toward the stopping wall.

In an embodiment, the removable memory mechanical interface is a multi-edge connector socket. The multi-edge connector socket may be a double edge socket including a first portion and a second portion connected at a joint, the first portion extending in a direction at an offset angle from the second portion, an opening extending through the joint and along both the first and second portions, and an array of contacts extending in a direction at an angle half of the offset angle from one of the first and second portion. The first and second portions may have a beveled corner that extends in a direction parallel to the array of contacts. The multi-edge connector socket may be a full edge pin grid array socket that includes a structure body in the shape of a frame, and a plurality of openings in a top surface of the structure body.

In an embodiment, the removable memory mechanical interface includes a housing structure, an array of openings in the housing structure, and an array of pins. Each pin of the array of pins may be disposed in each opening in the array of openings. Each pin may have a curved contacting end. In an embodiment, a first distance from the tip of the curved contacting end to the equator of the curved contacting end is less than a second distance from the tip of an interconnecting solder ball to the equator of the interconnecting solder ball. Each opening of the array of openings may include an interconnection region and a pin deflection region of the solder ball region, the pin deflection region extending from the solder ball region.

In an embodiment, the removable memory mechanical interface is coupled to a counterpart comprised of a strip of flex cable having two opposing ends and a memory device located at one of the opposing ends. The flex cable may have a connection portion at one of the opposing ends, the connection portion mated with the memory device electrical interface. The flex cable may have a second memory device at the other of the opposing ends and a connection portion between the memory devices, the connection portion mated with the memory device electrical interface. The memory device may be attached to a heat sink of a processing device that is connected to the processing device interface.

In an embodiment, the removable mechanical interface includes a pair of sockets with openings disposed horizontally within each socket of the pair of sockets, the memory device to fit horizontally between the pair of sockets. The pair of sockets may have a height that permits the pair of sockets and the memory device to reside beneath a heat sink of a processing device that is connected to the processing device interface.

In an embodiment, the removable memory mechanical interface is a frame socket that comprises an alignment frame and a land grid array, the alignment frame having a notch within one side. The frame socket may be to support reflowable removal of the memory device from the package substrate. In an embodiment, the removable memory mechanical interface includes a set of alignment holes. In an embodiment, the removable memory mechanical interface includes a set of alignment pins. The removable memory mechanical interface may be a spring-loaded clip.

In an embodiment, a package system includes a package substrate, a processing device coupled to the package substrate, a memory device electrical interface disposed on the package substrate, a removable memory mechanical interface disposed proximate to the memory device electrical interface, and a memory device attached to the memory device electrical interface by the removable memory mechanical interface, the removable memory device mechanical interface to permit the memory device to be easily detachable and re-attachable to the memory device electrical interface. The package system may further include a reflowable grid array disposed between the memory device electrical interface and the memory device. The memory device may be electrically coupled to the processing device on the package substrate.

In an embodiment, a method of fabricating a package system includes attaching a processing device to a package substrate, and attaching a memory device to the package substrate by attaching a memory device substrate to a removable memory mechanical interface disposed on the package substrate around a memory device electrical interface.

The memory device substrate may be attached by inserting the memory device substrate into a socket of the removable memory mechanical interface. In an embodiment, the memory device is attached by sliding the memory device substrate into sliding grooves of the removable memory mechanical interface. In an embodiment, the memory device is attached by pressing the memory device substrate onto a housing structure of the removable memory mechanical interface, the housing structure having an array of openings corresponding to an array of solder balls on the memory device substrate. Each opening of the array of openings may have a pin with a curved contacting end disposed inside it. The solder ball may contact the curved contacting end at a point lower than the equator of the curved contacting end.

In an embodiment, a low insertion force connector includes a housing structure, an array of openings within the housing structure, and a pin within each opening of the array of openings, the pin having a curved contacting end. Each opening of the array of openings may have an extended deflection portion that extends from the opening.

In an embodiment, a multi-edge connector includes a substrate having at least two edges that are joined at one end, the two edges forming a separation angle with respect to one another; a single connection interface continuously extending along at least the two edges; and a plurality of pads on the connection interface, each pad of the plurality of pads extending in a direction at an angle half of the separation angle from one of the at least two edges. The multi-edge connector may further include a beveled edge disposed on a corner of the substrate, the beveled edge extending in a direction parallel to the plurality of pads.

In utilizing the various aspects of this invention, it would become apparent to one skilled in the art that combinations or variations of the above embodiments are possible for forming CPU package substrates with removable memory mechanical interfaces. Although embodiments of the present invention have been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating embodiments of the present invention.

What is claimed is:

1. A package substrate, comprising:
   a processing device interface to couple to a processing device;
   a memory device electrical interface disposed on the package substrate;

a removable memory mechanical interface disposed proximately to the memory device electrical interface, the removable memory mechanical interface to allow a memory device to be easily removed from the package substrate after attachment of the memory device to the package substrate and without removing the processing device.

2. The package substrate of claim 1, wherein the memory device electrical interface comprises a land grid array.

3. The package substrate of claim 1, wherein the memory device electrical interface comprises an array of pins.

4. The package substrate of claim 1, wherein the removable memory mechanical interface has electrical contacts that are in contact with the memory device electrical interface and has exposed electrical contacts for electrical contact to a mechanical counterpart that is to mate with the removable memory mechanical interface and that is integrated with the memory device.

5. The package substrate of claim 1, wherein the removable memory mechanical interface is a sliding rail socket.

6. The package substrate of claim 5, wherein the sliding rail socket that comprises an array of angled pins, sliding grooves on two opposing sides of the socket, and a stopping wall.

7. The package substrate of claim 6, wherein the angled pins are slanted toward the stopping wall.

8. The package substrate of claim 1, wherein the removable memory mechanical interface is a multi-edge connector socket.

9. The package substrate of claim 8, wherein the multi-edge connector socket is a double edge socket comprising:
a first portion and a second portion connected at a joint, the first portion extending in a direction at an offset angle from the second portion;
an opening extending through the joint and along both the first and second portions; and
an array of contacts extending in a direction at an angle half of the offset angle from one of the first and second portion.

10. The package substrate of claim 9, wherein the first and second portions have a beveled corner that extends in a direction parallel to the array of contacts.

11. The package substrate of claim 8, wherein the multi-edge connector socket is a full edge pin grid array socket, comprising:
a structure body in the shape of a frame; and
a plurality of openings in a top surface of the structure body.

12. The package substrate of claim 1, wherein the removable memory mechanical interface comprises a housing structure, an array of openings in the housing structure, and an array of pins.

13. The package substrate of claim 12, wherein each pin of the array of pins is disposed in each opening in the array of openings.

14. The package substrate of claim 13, wherein each pin has a curved contacting end.

15. The package substrate of claim 14, wherein a first distance from the tip of the curved contacting end to the equator of the curved contacting end is less than a second distance from the tip of an interconnecting solder ball to the equator of the interconnecting solder ball.

16. The package substrate of claim 12, wherein each opening of the array of openings comprises an interconnection region and a pin deflection region of the solder ball region, the pin deflection region extending from the solder ball region.

17. The package substrate of claim 1, wherein the removable memory mechanical interface is coupled to a counterpart comprised of a strip of flex cable having two opposing ends and a memory device located at one of the opposing ends.

18. The package substrate of claim 17, wherein the flex cable has a connection portion at one of the opposing ends, the connection portion mated with the memory device electrical interface.

19. The package substrate of claim 17, wherein the flex cable has a second memory device at the other of the opposing ends and a connection portion between the memory devices, the connection portion mated with the memory device electrical interface.

20. The package substrate of claim 17, wherein the memory device is attached to a heat sink of a processing device that is connected to the processing device interface.

21. The package substrate of claim 1, wherein the removable mechanical interface comprises a pair of sockets with openings disposed horizontally within each socket of the pair of sockets, the memory device to fit horizontally between the pair of sockets.

22. The package substrate of claim 21, wherein the pair of sockets have a height that permits the pair of sockets and the memory device to reside beneath a heat sink of a processing device that is connected to the processing device interface.

23. The package substrate of claim 1, wherein the removable memory mechanical interface is a frame socket that comprises an alignment frame and a land grid array, the alignment frame having a notch within one side.

24. The package of claim 1, wherein the frame socket is to support reflowable removal of the memory device from the package substrate.

25. The package substrate of claim 1, wherein the removable memory mechanical interface includes a set of alignment holes.

26. The package substrate of claim 1, wherein the removable memory mechanical interface includes a set of alignment pins.

27. The package substrate of claim 1, wherein the removable memory mechanical interface is a spring-loaded clip.

28. A package system, comprising:
a package substrate;
a processing device coupled to the package substrate;
a memory device electrical interface disposed on the package substrate;
a removable memory mechanical interface disposed proximate to the memory device electrical interface; and
a memory device attached to the memory device electrical interface by the removable memory mechanical interface, the removable memory device mechanical interface to permit the memory device to be easily detachable and re-attachable to the memory device electrical interface without removing the processing device.

29. The package system of claim 28, further comprising a reflowable grid array disposed between the memory device electrical interface and the memory device.

30. The package system of claim 28, wherein the memory device is electrically coupled to the processing device on the package substrate.

31. A method of fabricating a package system, comprising:
attaching a processing device to a package substrate; and
attaching a memory device to the package substrate by attaching a memory device substrate to a removable memory mechanical interface disposed on the package substrate around a memory device electrical interface; and, removing the memory device from the package substrate without removing the processing device.

32. The method of claim 31, wherein the memory device substrate is attached by inserting the memory device substrate into a socket of the removable memory mechanical interface.

33. The method of claim 31, wherein the memory device is attached by sliding the memory device substrate into sliding grooves of the removable memory mechanical interface.

34. The method of claim 31, wherein the memory device is attached by pressing the memory device substrate onto a housing structure of the removable memory mechanical interface, the housing structure having an array of openings corresponding to an array of solder balls on the memory device substrate.

35. The method of claim 31, wherein each opening of the array of openings has a pin with a curved contacting end disposed inside it.

36. The method of claim 31, wherein the solder ball contacts the curved contacting end at a point lower than the equator of the curved contacting end.

* * * * *